US012712550B2

(12) United States Patent
Hirashima et al.

(10) Patent No.: US 12,712,550 B2
(45) Date of Patent: Aug. 18, 2026

(54) SEMICONDUCTOR DEVICE AND COUNTING METHOD

(71) Applicant: Kioxia Corporation, Tokyo (JP)

(72) Inventors: Yasuhiro Hirashima, Kawasaki (JP); Toshiyuki Kouchi, Kawasaki (JP); Junya Matsuno, Yokohama (JP); Masato Dome, Kamakura (JP)

(73) Assignee: KIOXIA CORPORATION, Tokyo (JP)

( * ) Notice: Subject to any disclaimer, the term of this patent is extended or adjusted under 35 U.S.C. 154(b) by 141 days.

(21) Appl. No.: 18/743,540

(22) Filed: Jun. 14, 2024

(65) Prior Publication Data

US 2024/0429921 A1 Dec. 26, 2024

(30) Foreign Application Priority Data

Jun. 26, 2023 (JP) ................................ 2023-104387

(51) Int. Cl.
*H03K 21/38* (2006.01)
*G06F 1/12* (2006.01)
*H03K 21/40* (2006.01)

(52) U.S. Cl.
CPC ............... *H03K 21/38* (2013.01); *G06F 1/12* (2013.01); *H03K 21/406* (2013.01)

(58) Field of Classification Search
CPC .... H03K 23/00; H03K 23/001; H03K 23/002; H03K 23/008; H03K 23/40; H03K 23/48; H03K 23/64; H03K 23/66; H03K 21/00; H03K 21/38; H03K 21/40; H03K 21/403; H03K 21/406
USPC ................................ 377/54, 77, 78, 79, 107
See application file for complete search history.

(56) References Cited

U.S. PATENT DOCUMENTS 6,725,067 B1 * 4/2004 Marx ................ H04W 52/0287 455/574
11,783,908 B2 * 10/2023 Park ..................... G11C 29/023 365/193
12,183,405 B2 * 12/2024 Abe ....................... G11C 16/32
2017/0287539 A1 10/2017 Mozak
2018/0197588 A1 7/2018 Chen et al.
2022/0076769 A1 3/2022 Park et al.

* cited by examiner

*Primary Examiner* — Hai L Nguyen
(74) *Attorney, Agent, or Firm* — XSENSUS LLP

(57) ABSTRACT

A semiconductor device including an oscillator configured to output a first signal, and circuitry configured to count a cycle number of the first signal OSC. Before the oscillator outputs an N-th (N is an integer equal to or larger than 2) cycle of the first signal, the circuitry changes a count value of the cycle number of the first signal to N.

20 Claims, 35 Drawing Sheets

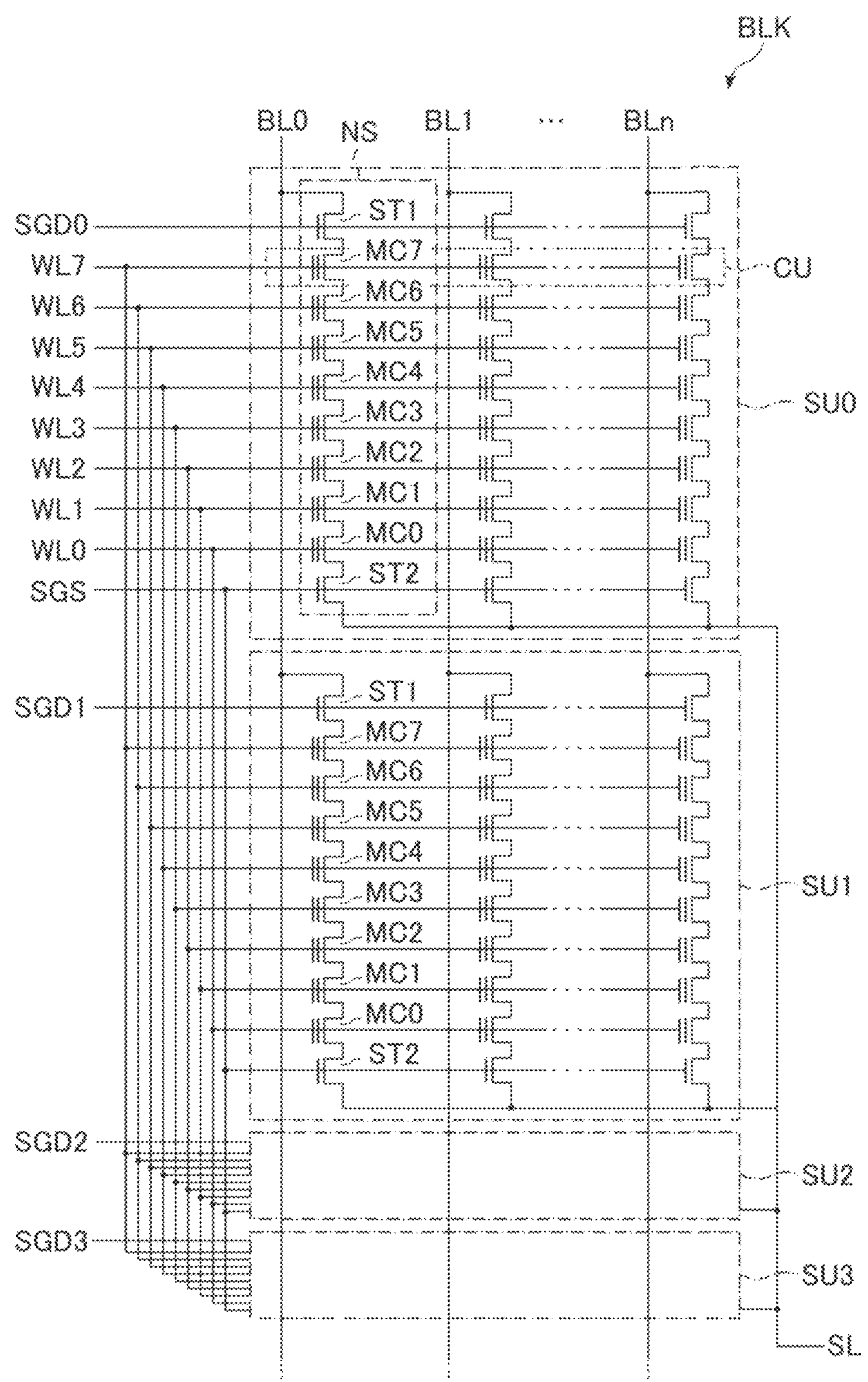
F I G. 3

| | DQ<7> | DQ<6> | DQ<5> | DQ<4> | DQ<3> | DQ<2> | DQ<1> | DQ<0> |
|---|---|---|---|---|---|---|---|---|
| Bx | CNT<7> | CNT<6> | CNT<5> | CNT<4> | CNT<3> | CNT<2> | CNT<1> | CNT<0> |
| By | CNT<15> | CNT<14> | CNT<13> | CNT<12> | CNT<11> | CNT<10> | CNT<9> | CNT<8> |

FIG. 9

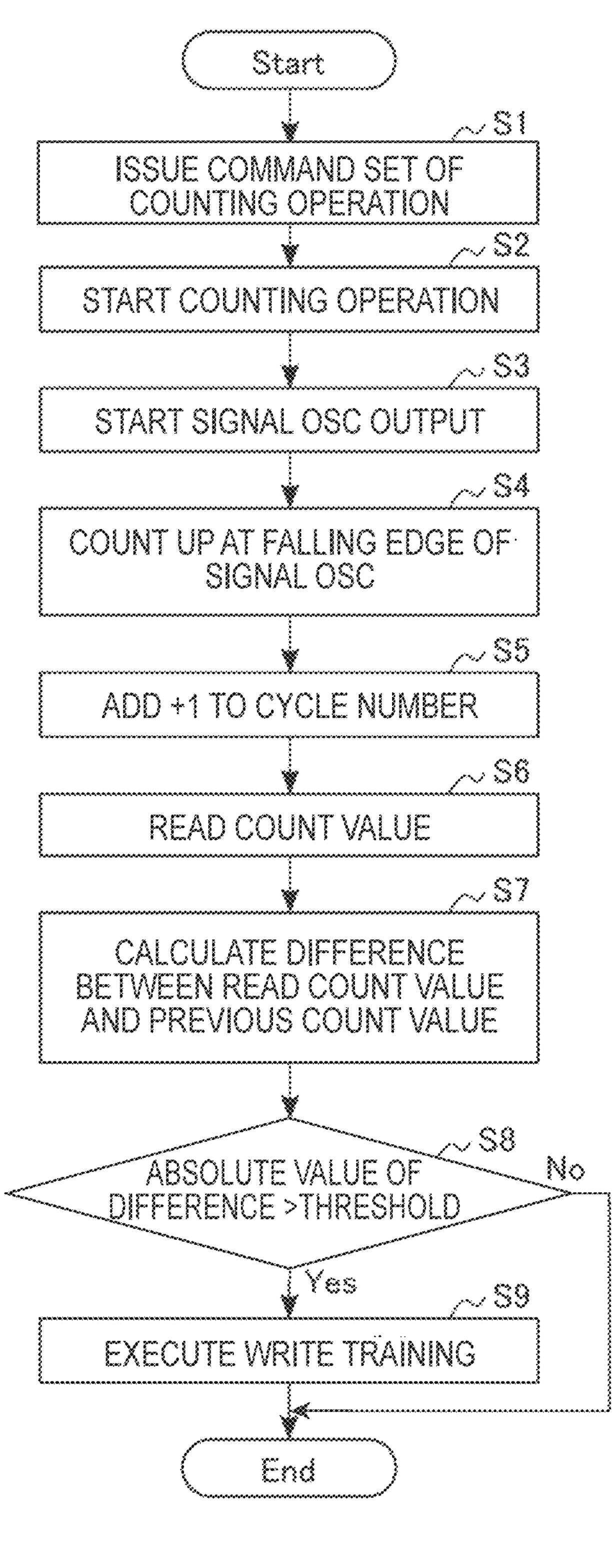
F I G. 13

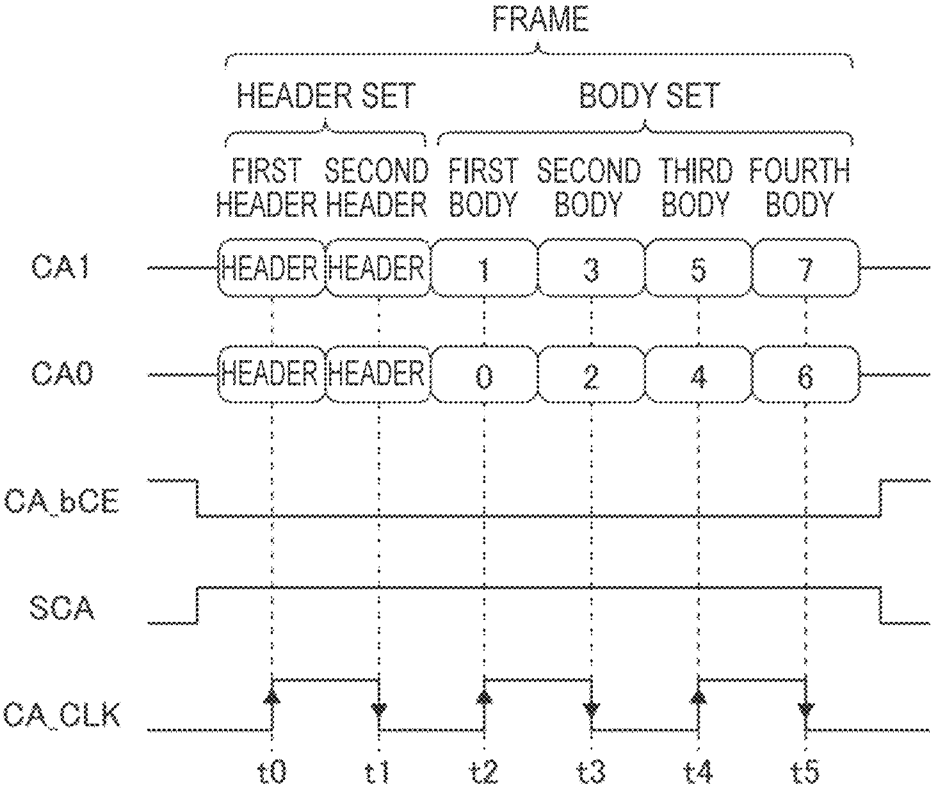
F I G. 15

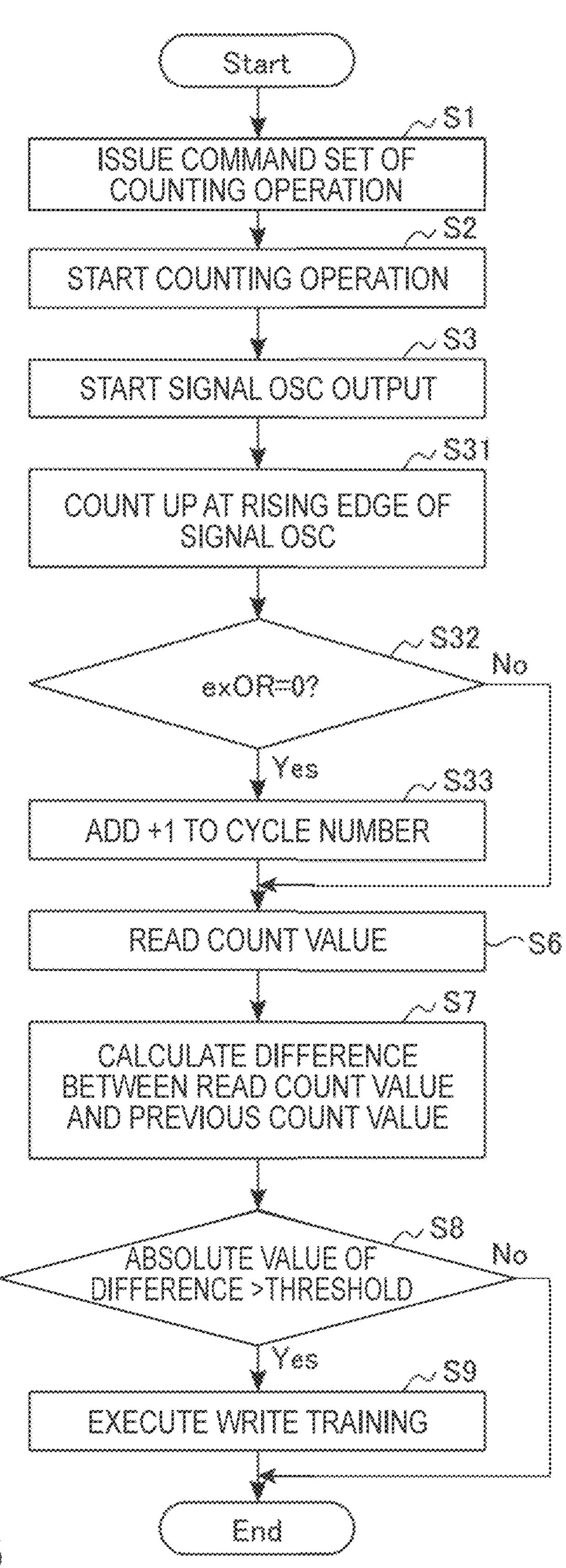
F I G. 23

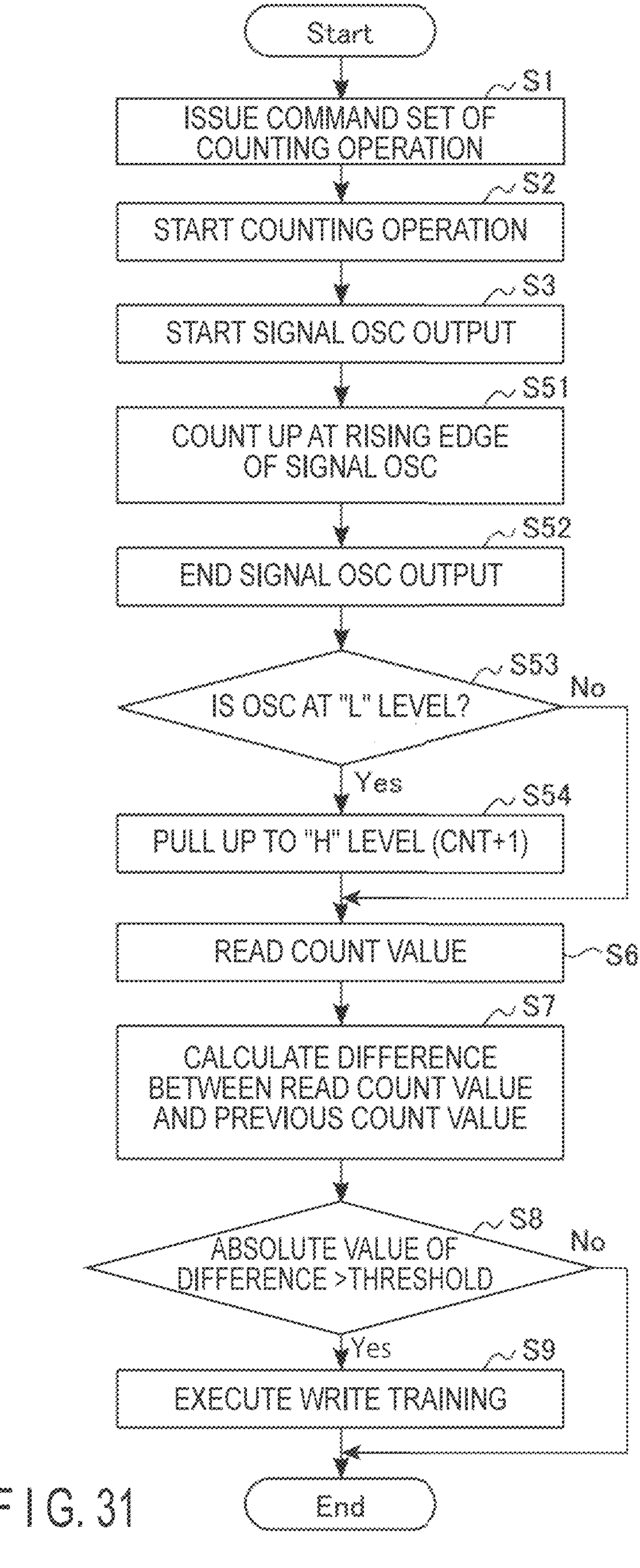
F I G. 31

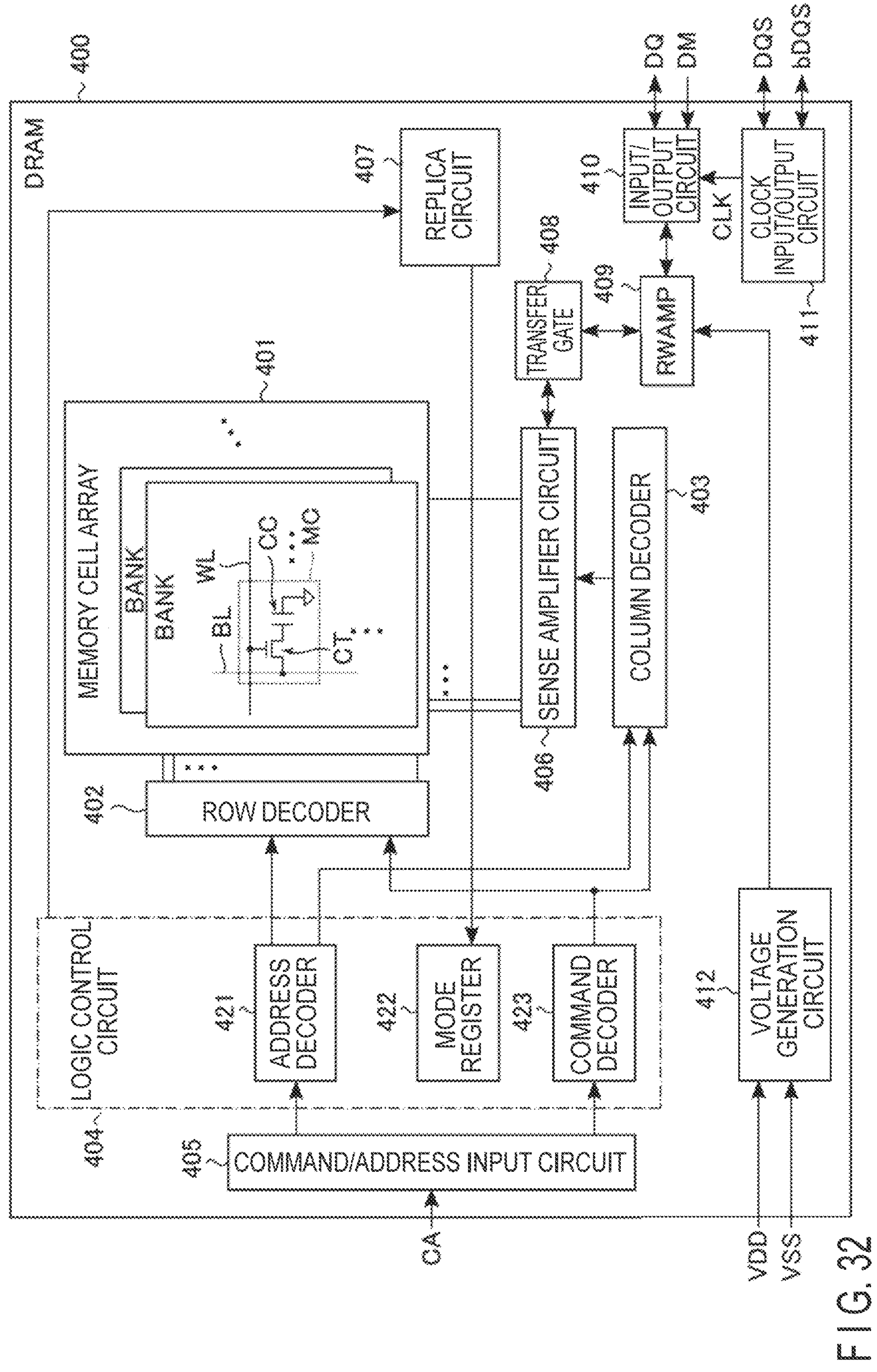
F I G. 32

SEMICONDUCTOR DEVICE AND COUNTING METHOD

CROSS-REFERENCE TO RELATED APPLICATION

This application is based upon and claims the benefit of priority from Japanese Patent Application No. 2023-104387, filed Jun. 26, 2023, the entire contents of which are incorporated herein by reference.

FIELD

Embodiments described herein relate generally to a semiconductor device including a counter and a counting method.

BACKGROUND

A semiconductor device including a counter which counts the number of cycles of cyclic signals has been known.

One embodiment of the present invention provides a semiconductor device capable of improving throughput.

BRIEF DESCRIPTION OF THE DRAWINGS

FIG. 3 is a circuit diagram of a memory cell array included in the semiconductor device according to the first embodiment.

FIG. 9 is a table illustrating a specific example of address information of count values CNT<15:0> in a status register in the semiconductor device according to the first embodiment.

FIG. 13 is a flowchart illustrating an example of flow of the counting operation in the semiconductor device according to the first embodiment.

FIG. 15 is a diagram illustrating an example of a command sequence of command and address input when a first mode is selected in the semiconductor device according to the modification of the first embodiment.

FIG. 23 is a flowchart illustrating an example of flow of a counting operation in the semiconductor device according to the third embodiment.

FIG. 31 is a flowchart illustrating an example of flow of the counting operation in the semiconductor device according to the modification of the fourth embodiment.

FIG. 32 is a block diagram illustrating an example of an entire configuration of a semiconductor device according to a first example of a fifth embodiment.

DETAILED DESCRIPTION

Various embodiments will be described hereinafter with reference to the accompanying drawings.

In general, according to one embodiment, a semiconductor device comprises an oscillator configured to output a first signal; and a counter configured to count a cycle number of the first signal, wherein the counter changes, before the oscillator outputs an N-th (N is an integer equal to or larger than 2) cycle of the first signal, a count value of the cycle number of the first signal to N.

Embodiments will be described hereinafter with reference to the drawings. Each embodiment exemplifies a device or a method for embodying a technical idea of the invention. The drawings are schematic or conceptual, and dimensions and proportions or the like of the individual drawings are not necessarily the same as actual ones. All descriptions of an embodiment are applicable as descriptions of another embodiment unless explicitly or self-evidently excluded. The technical idea of the present invention is not specified by a shape, a structure, an arrangement, or the like of components.

In the following description, components having substantially the same functions and configurations will be referred to with the same sign. Numbers after letters configuring reference signs are used to distinguish between components that are referred to with the reference signs including the same letters and that have similar configurations. When it is not necessary to distinguish the components indicated by the reference signs including the same letters from each other, the components are each referred to with the reference sign including only the letters.

1. First Embodiment

First, as a first embodiment, a case where a semiconductor device is a NAND type flash memory will be explained. Note that the semiconductor device is not limited to the NAND type flash memory. The semiconductor device may include an oscillator and a counter.

1.1 Configuration

1.1.1 Configuration of Memory System

Figure 1:
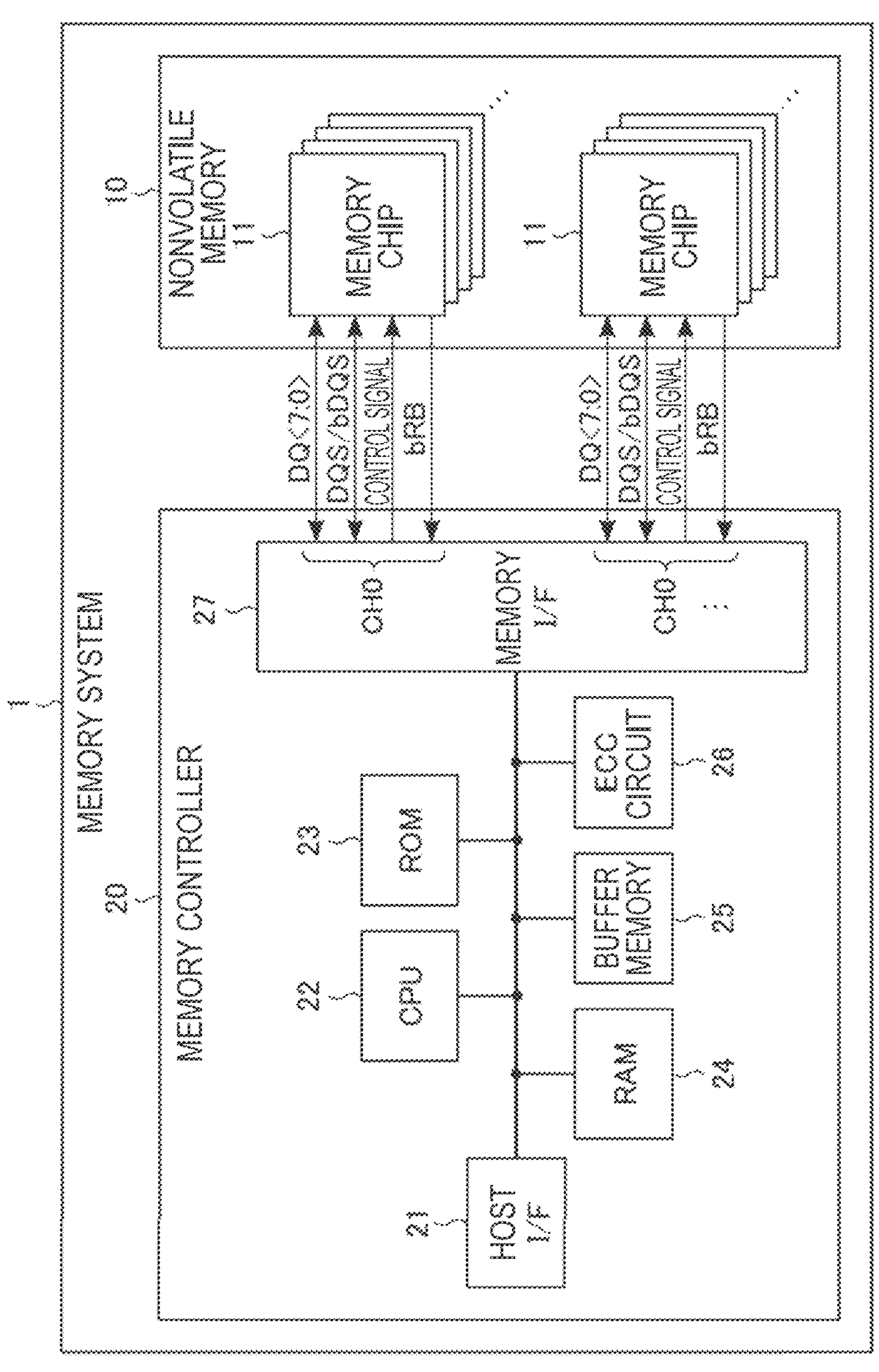
FIG. 1 is a block diagram illustrating an example of an entire configuration of a memory system including a semiconductor device according to a first embodiment.

First, with reference to FIG. 1, an example of a configuration of a memory system 1 including the semiconductor device will be explained. FIG. 1 is a block diagram illustrating an example of an entire configuration of the memory system 1. While some connections between individual components are indicated by arrow lines in the example in FIG. 1, the connections between the individual components are not limited thereto.

As illustrated in FIG. 1, the memory system 1 is, for example, an SSD (Solid State Drive). The memory system 1 is connected to an unillustrated host device. For example, the host device controls the memory system 1.

The memory system 1 includes a nonvolatile memory 10 and a memory controller 20.

The nonvolatile memory 10 is a nonvolatile storage medium. The nonvolatile memory 10 stores data received from the memory controller 20 in a nonvolatile manner.

The memory controller 20 is, for example, an SoC (System On a Chip). The memory controller 20 instructs a read operation, a write operation, and a delete operation or the like to the nonvolatile memory 10, based on a request (instruction) from the host device for example. In addition, the memory controller 20 manages a memory space of the nonvolatile memory 10.

Next, an example of an internal configuration of the nonvolatile memory 10 will be explained. The nonvolatile memory 10 includes a plurality of memory chips 11. Each of the plurality of memory chips 11 can be independently operated. Each memory chip 11 is connected to the memory controller 20 via a NAND bus. Note that the number of the memory chips 11 provided in the nonvolatile memory 10 may be one.

The memory chip 11 is, for example, a semiconductor device loaded with a NAND type flash memory. The memory chip 11 stores data in a nonvolatile manner. Note that the memory chip 11 may be another nonvolatile memory.

The memory chip 11 transmits and receives signals DQ<7:0> of 8 bits for example and signals DQS and bDQS to/from the memory controller 20 (a memory interface circuit 27, more specifically) via the NAND bus. Hereinafter, when one of the signals DQ<7:0> is not specified, the signal is simply described as "signal DQ". The signal DQ is data, an address, a command or status information, for example. The signals DQS and bDQS are strobe signals (clock signals) used for input/output of the signal DQ when the signal DQ is the data. The signal bDQS is an inverted signal of the signal DQS.

In the present embodiment, when data is transmitted from the memory controller 20 to the memory chip 11, transmission of the data (signal DQ) and transmission of the strobe signals (signals DQS and bDQS) are asynchronously executed. Hereinafter, an interface specification of such data input is described as "Unmatched DQS".

The memory chip 11 receives various kinds of control signals from the memory controller 20 via the NAND bus. Details of the control signals will be described later.

In addition, the memory chip 11 transmits a ready/busy signal bRB to the memory controller 20 via the NAND bus. The ready/busy signal bRB is a signal indicating whether the memory chip 11 is in a state capable of or is in a state incapable of receiving a command from the memory controller 20. A ready state is a state where the memory chip 11 can receive a command from the memory controller 20. A busy state is a state where the memory chip 11 cannot receive a command from the memory controller 20. For example, the ready/busy signal bRB is turned to an "L" level when the memory chip 11 is in the busy state.

Next, an example of an internal configuration of the memory controller 20 will be explained. The memory controller 20 includes a host interface circuit (host I/F) 21, a CPU (Central Processing Unit) 22, a ROM (Read Only Memory) 23, a RAM (Random Access Memory) 24, a buffer memory 25, an ECC (Error Checking and Correcting) circuit 26, and the memory interface circuit (memory I/F) 27. These circuits are connected to each other by an internal bus of the memory controller 20, for example. Note that individual functions of the host interface circuit 21, the ECC circuit 26, and the memory interface circuit 27 may be realized by an exclusive circuit, or may be realized by the CPU 22 executing firmware.

The host interface circuit 21 is an interface circuit connected to the host device. The host interface circuit 21 controls communication between the host device and the memory controller 20. The host interface circuit 21 transmits a request and data received from the host device respectively to the CPU 22 and the buffer memory 25. In addition, the host interface circuit 21 transmits the data inside the buffer memory 25 to the host device based on control by the CPU 22.

The CPU 22 is a processor. The CPU 22 controls an operation of the entire memory controller 20. For example, the CPU 22 instructs a write operation, a read operation, and a delete operation or the like to the nonvolatile memory 10 (memory chip 11) based on the request of the host device. Further, the CPU 22 manages a memory area of the nonvolatile memory 10.

The CPU 22 instructs write training, for example, to the nonvolatile memory 10 (memory chip 11). The write training is an operation for a purpose of timing adjustment or the like between the signal DQ and the signals DQS and bDQS. For example, the CPU 22 makes the memory chip 11 execute a write operation of data for the write training and a read operation of the data. At the time, the CPU 22 transmits the signals DQS and bDQS and the signal DQ to the memory chip 11 while changing delay time of the signal DQ to the signals DQS and bDQS. Then, the CPU 22 sets a condition (the delay time of the signal DQ to the signals DQS and bDQS) that a matching degree of write data and read data is highest as a data transmission condition. Hereinafter, the delay time of the signal DQ to the signals DQS and bDQS is described as time tDQS2DQ.

For example, in the memory chip 11, a transmission route to a latch circuit which fetches the signal DQ is different between the signals DQS and bDQS and the signal DQ. Therefore, an optimum value of the time tDQS2DQ fluctuates due to fluctuation of a voltage or a temperature or the like in the memory chip 11. In order to cope with it, the CPU 22 appropriately executes the write training at arbitrary timing.

Further, the CPU 22 makes a counting operation of a clock signal (a signal OSC to be described later) generated in an oscillator in the memory chip 11 be executed periodically for example. The clock signal is a pseudo signal of the signal DQS, which is generated inside the memory chip 11. In the counting operation, counting of a cycle number (clock number) of the clock signal is executed. The CPU 22 controls execution time (also described as "counting execution time" hereinafter) of the counting operation. The cycle number (count number) of the clock signal in the memory chip 11 fluctuates due to a change in a voltage or a temperature or the like in the memory chip 11 similarly to the fluctuation of the time tDQS2DQ. The CPU 22 predicts the fluctuation of the time tDQS2DQ based on a change amount of the cycle number, and determines presence/absence of execution of the write training.

The ROM 23 is a nonvolatile memory. For example, the ROM 23 is an EEPROM™ (Electrically Erasable Programmable Read-Only Memory). The ROM 23 is a non-transitory storage medium which stores firmware and a program or the like. For example, the CPU 22 deploys the firmware loaded from the ROM 23 in the RAM 24.

The RAM 24 is a volatile memory. The RAM 24 is a DRAM (Dynamic Random Access Memory) or an SRAM (Static Random Access Memory) or the like. The RAM 24 can be used as a work area of the CPU 22. For example, the RAM 24 stores firmware for managing the nonvolatile memory 10 and various kinds of management tables. For example, the RAM 24 stores a result of the counting operation.

The buffer memory 25 is a volatile memory. The buffer memory 25 is a DRAM or an SRAM or the like. The buffer memory 25 temporarily holds data read from the nonvolatile memory 10 by the memory controller 20 and data received from the host device or the like.

The ECC circuit 26 is a circuit which executes ECC processing. The ECC processing includes data encoding processing and decoding processing. For example, the ECC circuit 26 executes the data encoding processing and generates an error correction code (parity) at the time of a data write operation. Then, the ECC circuit 26 imparts the parity to the data. Further, at the time of a data read operation, the ECC circuit 26 executes the decoding processing. That is, the ECC circuit 26 executes error correction processing for the data using the parity.

The memory interface circuit 27 controls communication between the memory controller 20 and the nonvolatile memory 10. The memory interface circuit 27 may include a plurality of channels CH (CH0, CH1, . . . ). To each channel CH, the plurality of memory chips 11 may be connected via the NAND bus. The memory interface circuit 27 transmits the signal DQ, the signals DQS and bDQS, and various kinds of control signals to the memory chip 11. In addition, the memory interface circuit 27 receives the signal DQ, the signals DQS and bDQS, and the ready/busy signal bRB from the memory chip 11.

1.1.2 Configuration of Memory Chip

Figure 2:
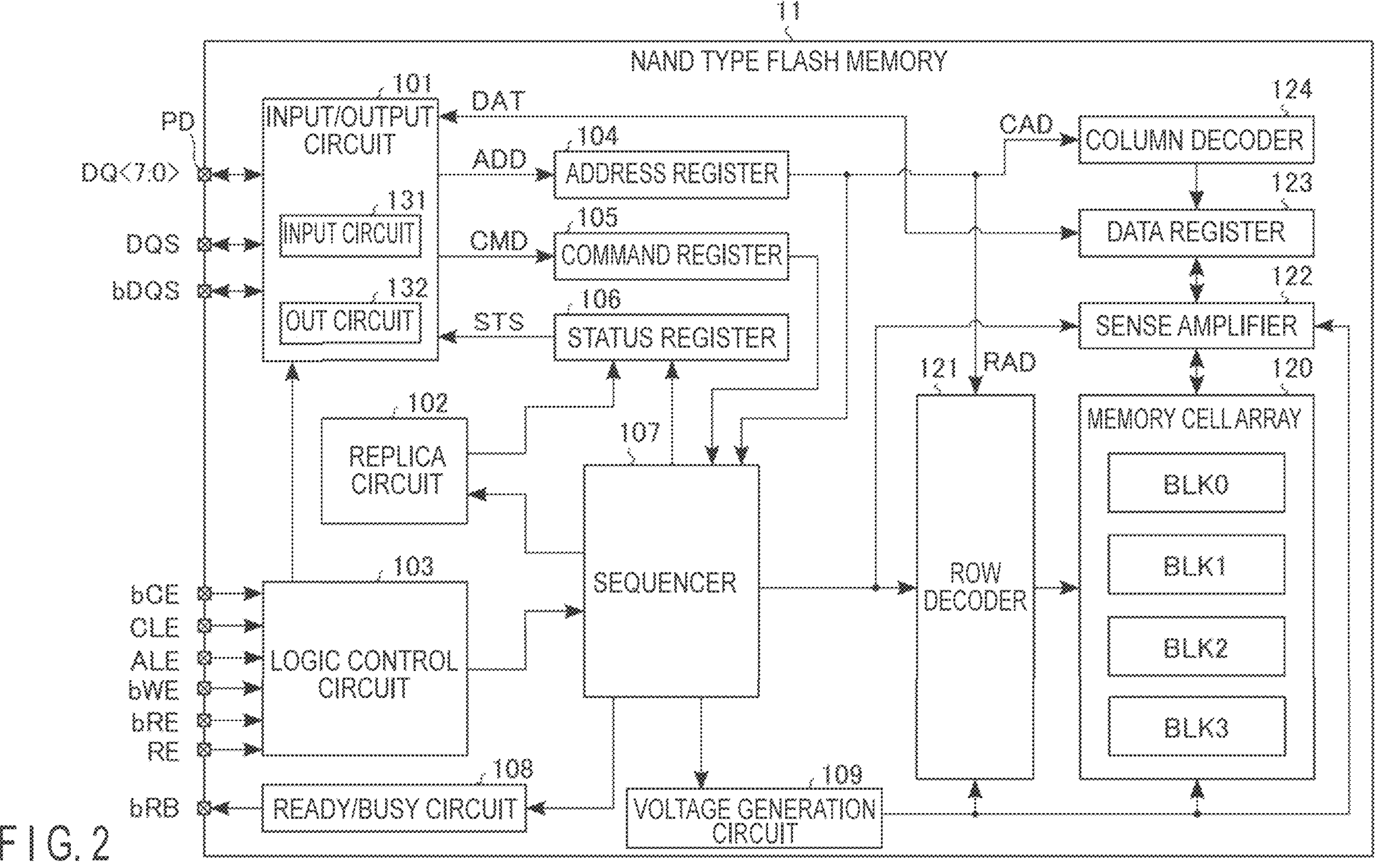
FIG. 2 is a block diagram illustrating an example of a configuration of the semiconductor device according to the first embodiment.

Next, with reference to FIG. 2, an example of a configuration of the memory chip 11 will be explained. FIG. 2 is a block diagram illustrating an example of the configuration of the memory chip 11 (semiconductor device). Note that while some connections between individual components are indicated by arrow lines in the example in FIG. 2, the connections between the individual components are not limited thereto.

As illustrated in FIG. 2, the memory chip (NAND type flash memory) 11 includes an input/output circuit 101, a replica circuit 102, a logic control circuit 103, an address register 104, a command register 105, a status register 106, a sequencer 107, a ready/busy circuit 108, a voltage generation circuit 109, a memory cell array 120, a row decoder 121, a sense amplifier 122, a data register 123, and a column decoder 124.

The input/output circuit 101 is a circuit which inputs and outputs the signal DQ and the signals DQS and bDQS to/from the memory controller 20. The input/output circuit 101 is connected with the memory controller 20 via a plurality of pads PD (external connection terminals) corresponding to the signals DQ<7:0> and the signals DQS and bDQS. In addition, the input/output circuit 101 is connected to the logic control circuit 103, the address register 104, the command register 105, the status register 106, and the data register 123.

The input/output circuit 101 includes an input circuit 131 and an output circuit 132.

The input circuit 131 is a circuit which receives the signal DQ from the memory controller 20. When the signal DQ is data DAT, the input circuit 131 fetches the signal DQ based on the signals DQS and bDQS. Then, the input circuit 131 transmits the data DAT to the data register 123. When the signal DQ is an address ADD, the input circuit 131 fetches the signal DQ based on a write enable signal bWE to be described later. Then, the input circuit 131 transmits the address ADD to the address register 104. When the signal DQ is a command CMD, the input circuit 131 fetches the signal DQ based on the write enable signal bWE. Then, the input circuit 131 transmits the command CMD to the command register 105.

The output circuit 132 is a circuit which transmits the signal DQ to the memory controller 20. The output circuit 132 transmits the signal DQ together with the signals DQS and bDQS to the memory controller 20. The output circuit 132 transmits the data DAT or status information STS read from the memory cell array 120, as the signal DQ to the memory controller 20.

The replica circuit 102 is a circuit which generates the clock signal (the signal OSC to be described later) corresponding to the signal DQS and counts the cycle number (clock number) of the clock signal. The replica circuit 102 includes a feedback type oscillator for generating the clock signal. A feedback route of the oscillator has a configuration similar to a transmission route of the signal DQS in the input circuit 131. Therefore, the replica circuit 102 may be also described as "DQS oscillator". The replica circuit 102 is connected to the status register 106 and the sequencer 107. The replica circuit 102 transmits a count result by the counting operation to the status register 106.

The logic control circuit 103 is a circuit which performs logic control of the memory chip 11. The logic control circuit 103 is connected with the memory controller 20 via the plurality of pads PD corresponding to the individual control signals. In addition, the logic control circuit 103 is connected to the input/output circuit 101 and the sequencer 107. The logic control circuit 103 controls the input/output circuit 101 and the sequencer 107 based on the various kinds of control signals.

For example, the logic control circuit 103 receives, as the control signals, a chip enable signal bCE, a command latch enable signal CLE, an address latch enable signal ALE, the write enable signal bWE, and read enable signals RE and bRE.

The chip enable signal bCE is a signal for enabling the memory chip 11. The chip enable signal bCE is asserted at a Low ("L") level for example.

The command latch enable signal CLE is a signal which indicates that the signal DQ is a command. The command latch enable signal CLE is asserted at a High ("H") level for example.

The address latch enable signal ALE is a signal which indicates that the signal DQ is an address. The address latch enable signal ALE is asserted at the "H" level for example.

The write enable signal bWE is a signal for fetching the signal DQ when the signal DQ is the command CMD or the address ADD. The write enable signal bWE is asserted at the "L" level for example, at timing at which the memory chip 11 fetches the command CMD or the address ADD. Thus, every time the write enable signal bWE is toggled, the command CMD or the address ADD is fetched to the memory chip 11.

The read enable signals RE and bRE are signals for the memory controller 20 to read the data from the memory chip 11. The read enable signal bRE is an inverted signal of the read enable signal RE. The read enable signals RE and bRE are asserted at the "L" level for example. For example, when outputting the data, the memory chip 11 generates the signals DQS and bDQS based on the read enable signals RE and bRE.

The address register 104 is a register which temporarily stores the address ADD. The address register 104 is connected to the input/output circuit 101, the sequencer 107, the row decoder 121, and the column decoder 124. The address ADD includes a row address RAD and a column address CAD. The address register 104 transmits the row address RAD to the row decoder 121. In addition, the address register 104 transmits the column address CAD to the column decoder 124.

The command register 105 is a register which temporarily stores the command CMD. The command register 105 is connected to the input/output circuit 101 and the sequencer 107. The command register 105 transmits the command CMD to the sequencer 107.

The status register 106 is a register which temporarily stores the status information STS. The status register 106 is connected to the input/output circuit 101, the replica circuit 102, and the sequencer 107. For example, the status information STS includes information on a result of the write operation, the read operation, and the delete operation or the like. Further, the status information STS includes information on the result of the counting operation in the replica circuit 102. The status information STS is transmitted to the memory controller 20 as the signal DQ.

The sequencer 107 is a circuit which controls the operation of the entire memory chip 11. The sequencer 107 is connected to the replica circuit 102, the logic control circuit 103, the address register 104, the command register 105, the status register 106, the ready/busy circuit 108, the voltage generation circuit 109, the row decoder 121, and the sense amplifier 122 or the like. The sequencer 107 controls the replica circuit 102, the status register 106, the ready/busy circuit 108, the voltage generation circuit 109, the row decoder 121, and the sense amplifier 122 or the like. The sequencer 107 executes the write operation, the read operation and the delete operation based on the command CMD. The sequencer 107 executes the write training. Further, the sequencer 107 controls the counting operation in the replica circuit 102.

The ready/busy circuit 108 is a circuit which generates the ready/busy signal bRB. The ready/busy circuit 108 is connected to the sequencer 107. The ready/busy circuit 108 generates the ready/busy signal bRB based on the control of the sequencer 107. The ready/busy circuit 108 transmits the ready/busy signal bRB to the memory controller 20.

The voltage generation circuit 109 generates various kinds of voltages to be used for the write operation, the read operation, and the delete operation, based on the control of the sequencer 107. The voltage generation circuit 109 supplies the various kinds of voltages to the memory cell array 120, the row decoder 121, and the sense amplifier 122 or the like.

The memory cell array 120 is a set of a plurality of arrayed memory cell transistors (also described as "memory cells"). The memory cell array 120 includes a plurality of blocks BLK. The block BLK is a set of the plurality of memory cell transistors where the data is deleted collectively for example. In the example in FIG. 2, the memory cell array 120 includes four blocks BLK0, BLK1, BLK2, and BLK3. Note that the number of the blocks BLK within the memory cell array 120 is arbitrary.

The row decoder 121 is a decoding circuit of the row address RAD. The row decoder 121 is connected to the address register 104, the sequencer 107, the voltage generation circuit 109, and the memory cell array 120. The row decoder 121 selects one of the blocks BLK based on a decoded result of the row address RAD. The row decoder 121 applies the voltage to wiring (a word line and a selection gate line to be described later) in a row direction of the selected block BLK.

The sense amplifier 122 is a circuit which writes and reads the data DAT. The sense amplifier 122 is connected to the sequencer 107, the voltage generation circuit 109, the memory cell array 120, and the data register 123. The sense amplifier 122 reads the data DAT from the memory cell array 120 at the time of the read operation. In addition, the sense amplifier 122 supplies the voltage according to the write data DAT to the memory cell array 120 at the time of the write operation.

The data register 123 is a register which temporarily stores the data DAT. The data register 123 is connected to the input/output circuit 101, the sequencer 107, the sense amplifier 122, and the column decoder 124. The data register 123 includes a plurality of latch circuits. Each latch circuit temporarily stores write data or read data.

The column decoder 124 is a circuit which decodes the column address CAD. The column decoder 124 is connected to the address register 104, the sequencer 107, and the data register 123. The column decoder 124 receives the column address CAD from the address register 104. The column decoder 124 selects the latch circuit in the data register 123 based on a decoded result of the column address CAD.

1.1.3 Circuit Configuration of Memory Cell Array

Next, with reference to FIG. 3, an example of a circuit configuration of the memory cell array 120 will be explained. FIG. 3 is a circuit diagram of the memory cell array 120. Note that the example in FIG. 3 illustrates a circuit configuration of one block BLK.

As illustrated in FIG. 3, the block BLK includes a plurality of string units SU. The string unit SU is a set of a plurality of NAND strings NS to be collectively selected in the write operation or the read operation, for example. In the example in FIG. 3, the block BLK includes four string units SU0-SU3. Note that the number of the string units SU included in the block BLK is arbitrary.

Next, an internal configuration of the string unit SU will be explained. The string unit SU includes the plurality of NAND strings NS. The NAND string NS is a set of the plurality of memory cell transistors connected in series. For example, n+1 pieces (n is an integer equal to or larger than 1) of the NAND strings NS in the string unit SU are connected respectively to n+1 bit lines BL0-BLn.

Next, an internal configuration of the NAND string NS will be explained. Each NAND string NS includes a plurality of memory cell transistors MC, and selection transistors ST1 and ST2. In the example illustrated in FIG. 3, the NAND string NS includes eight memory cell transistors MC0-MC7. Note that the number of the memory cell transistors MC in the NAND string NS is arbitrary.

The memory cell transistor MC holds the data in a nonvolatile manner. The memory cell transistor MC includes a control gate and a charge storage layer. The memory cell transistor MC may be a MONOS (Metal-Oxide-Nitride-Oxide-Silicon) type or may be an FG (Floating Gate) type. The MONOS type uses an insulating layer for the charge storage layer. The FG type uses a conductor layer for the charge storage layer.

The selection transistors ST1 and ST2 are used for selecting the string unit SU at the time of various kinds of operations. The number of the selection transistors ST1 and ST2 is arbitrary. At least one each of the selection transistors ST1 and ST2 may be included in the NAND string NS.

Current routes of the memory cell transistors MC and the selection transistors ST1 and ST2 in each NAND string NS are connected in series. More specifically, the current routes are connected in series in an order of the selection transistor ST2, the memory cell transistors MC0-MC7, and the selection transistor ST1. A drain of the selection transistor ST1 is connected to any one of the bit lines BL. A source of the selection transistor ST2 is connected to a source line SL.

The control gates of the plurality of memory cell transistor MC0-MC7 in the same block BLK are connected in common to word lines WL0-WL7 respectively. More specifically, for example, the block BLK includes the four string units SU0-SU3. Then, the string units SU0-SU3 each include the plurality of memory cell transistors MC0. The control gates of the plurality of memory cell transistors MC0 in the block BLK are connected in common to one word line WL0. It is the same for the memory cell transistors MC1-MC7.

Gates of the plurality of selection transistors ST1 in the string unit SU are connected in common to one selection gate line SGD. More specifically, the string unit SU0 includes the plurality of selection transistors ST1. The gates of the plurality of selection transistors ST1 in the string unit SU0 are connected in common to a selection gate line SGD0. Similarly, the gates of the plurality of selection transistors ST1 in the string unit SU1 are connected in common to a selection gate line SGD1. The gates of the plurality of selection transistors ST1 in the string unit SU2 are connected in common to a selection gate line SGD2. The gates of the plurality of selection transistors ST1 in the string unit SU3 are connected in common to a selection gate line SGD3.

The gates of the plurality of selection transistors ST2 in the same block BLK are connected in common to one selection gate line SGS. More specifically, for example, the block BLK includes the four string units SU0-SU3. Then, the string units SU0-SU3 each include the plurality of selection transistors ST2. The gates of the plurality of selection transistors ST2 in the block BLK are connected in common to one selection gate line SGS. Note that, similarly to the selection gate line SGD, a different selection gate line SGS may be provided for each of the string units SU.

The word lines WL0-WL7, the selection gate lines SGD0-SGD3, and the selection gate line SGS are connected to the row decoder 121, respectively.

The bit line BL is connected in common to one NAND string NS in each string unit SU of each block BLK. To the plurality of NAND strings NS connected to one bit line BL, the same column address CAD is allocated. Each bit line BL is connected to the sense amplifier 122.

The source line SL is shared among the plurality of blocks BLK for example.

In one string unit SU, the set of the plurality of memory cell transistors MC connected to one word line WL is described as "cell unit CU". For example, when the memory cell transistor MC stores 1-bit data, a storage capacity of the cell unit CU is defined as "1-page data". Based on a bit number of the data stored by the memory cell transistor MC, the cell unit CU can have the storage capacity of 2-page data or more.

1.1.4 Configuration of Input Circuit 1.1.4.1 Configuration of Input Circuit

Figure 4:
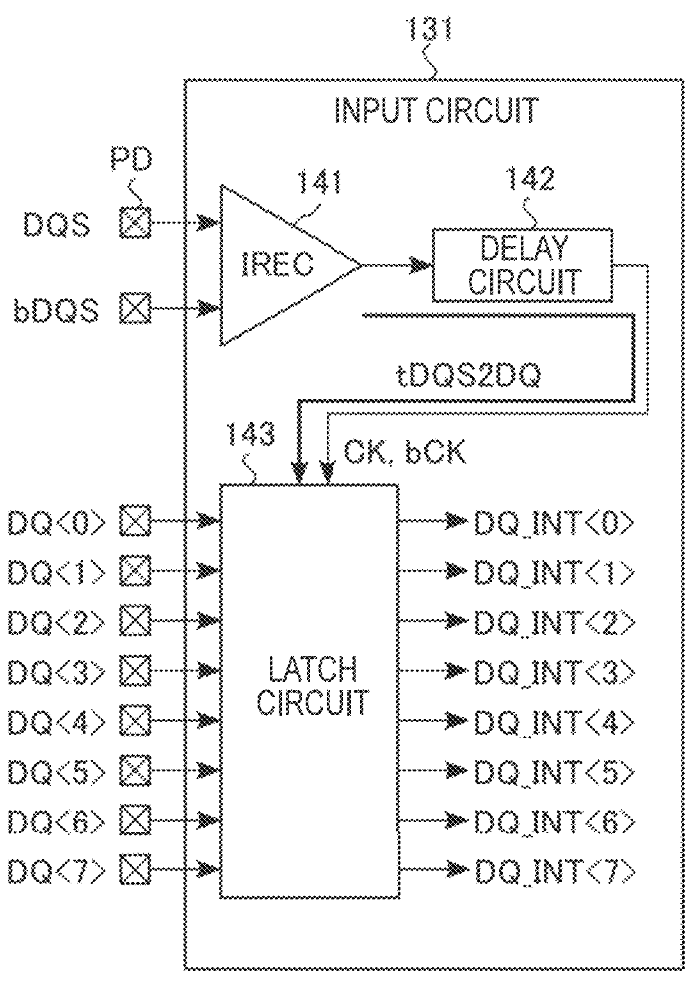
FIG. 4 is a block diagram illustrating an example of a configuration of an input circuit included in the semiconductor device according to the first embodiment.

Next, with reference to FIG. 4, an example of a configuration of the input circuit 131 will be explained. FIG. 4 is a block diagram illustrating an example of the configuration of the input circuit 131. Note that the example in FIG. 4 illustrates the configuration in a case where the signal DQ is the data DAT, that is, in the case of fetching the signal DQ based on the signals DQS and bDQS.

As illustrated in FIG. 4, the input circuit 131 includes an input receiver (IREC: Input RECeiver) 141, a delay circuit 142, and a latch circuit 143.

The input receiver 141 is a reception circuit of the signals DQS and bDQS. Two input terminals of the input receiver 141 are connected respectively to the pad PD to which the signal DQS is input and the pad PD to which the signal bDQS is input. In addition, an output terminal of the input receiver 141 is connected to the delay circuit 142. For example, the input receiver 141 outputs inverted signals synchronized with the signals DQS and bDQS. Output signals of the input receiver 141 are input to the delay circuit 142.

The delay circuit 142 is a circuit which delays the signals received from the input receiver 141. The delay circuit 142 is connected to the latch circuit 143. Note that the delay circuit 142 may be omitted. Further, a wiring route between the input receiver 141 and the latch circuit 143 may be provided with a driver or the like for a purpose of signal transmission. The output signals of the input receiver 141 are delayed by the delay circuit 142 and wiring delay by the wiring route connecting the input receiver 141 and the latch circuit 143, and are input to the latch circuit 143. The signals input to the latch circuit 143 are described as signals CK and bCK. The signal CK is a strobe signal for which the signal DQS is delayed. The signal bCK is an inverted signal of the signal CK. Delay time of the signals CK and bCK to the signals DQS and bDQS corresponds to the time tDQS2DQ. That is, to the latch circuit 143, the signals DQS and bDQS that are delayed for the time tDQS2DQ are input.

The latch circuit 143 is a circuit which fetches the signal DQ based on the signals CK and bCK (the signals DQS and bDQS delayed for the time tDQS2DQ). The latch circuit 143 is connected to eight pads PD to which the signals DQ<0>-DQ<7> are input. For example, the latch circuit 143 fetches the data of odd-numbered bits of each signal DQ based on the signal CK, and fetches the data of even-numbered bits of each signal DQ based on the signal bCK. For example, the latch circuit 143 may include a plurality of LTSAs (Latch-Type voltage Sense Amplifiers) corresponding to each signal DQ, or may include a plurality of DTSAs (Double-Tail latch-type voltage Sense Amplifiers). The latch circuit 143 outputs signals DQ_INT<0>-DQ_INT<7> corresponding to the signals DQ<0>-DQ<7>.

The latch circuit 143 is disposed relatively close to the pads PD to which the signals DQ are input. By relatively close disposition, a wiring length connecting the pads PD and the latch circuit 143 can be made relatively short. In addition, the number of circuits provided in a route connecting the pad PD to which the signal DQ is input and the latch circuit 143 is smaller than the number of circuits (including the input receiver 141 and the delay circuit 142) provided in a route connecting the pad PD to which the signal DQS is input and the latch circuit 143. Thus, jitters and skewness or the like of the signal DQ in the latch circuit 143 can be reduced. Note that a CTLE (Continuous Time Linear Equalizer) or the like may be disposed between the pad PD and the latch circuit 143 for a purpose of correcting signal degradation. The CTLE is a circuit which compensates for insertion loss and reduces jitters.

1.1.4.2 Circuit Configuration of Input Circuit

Figure 5:
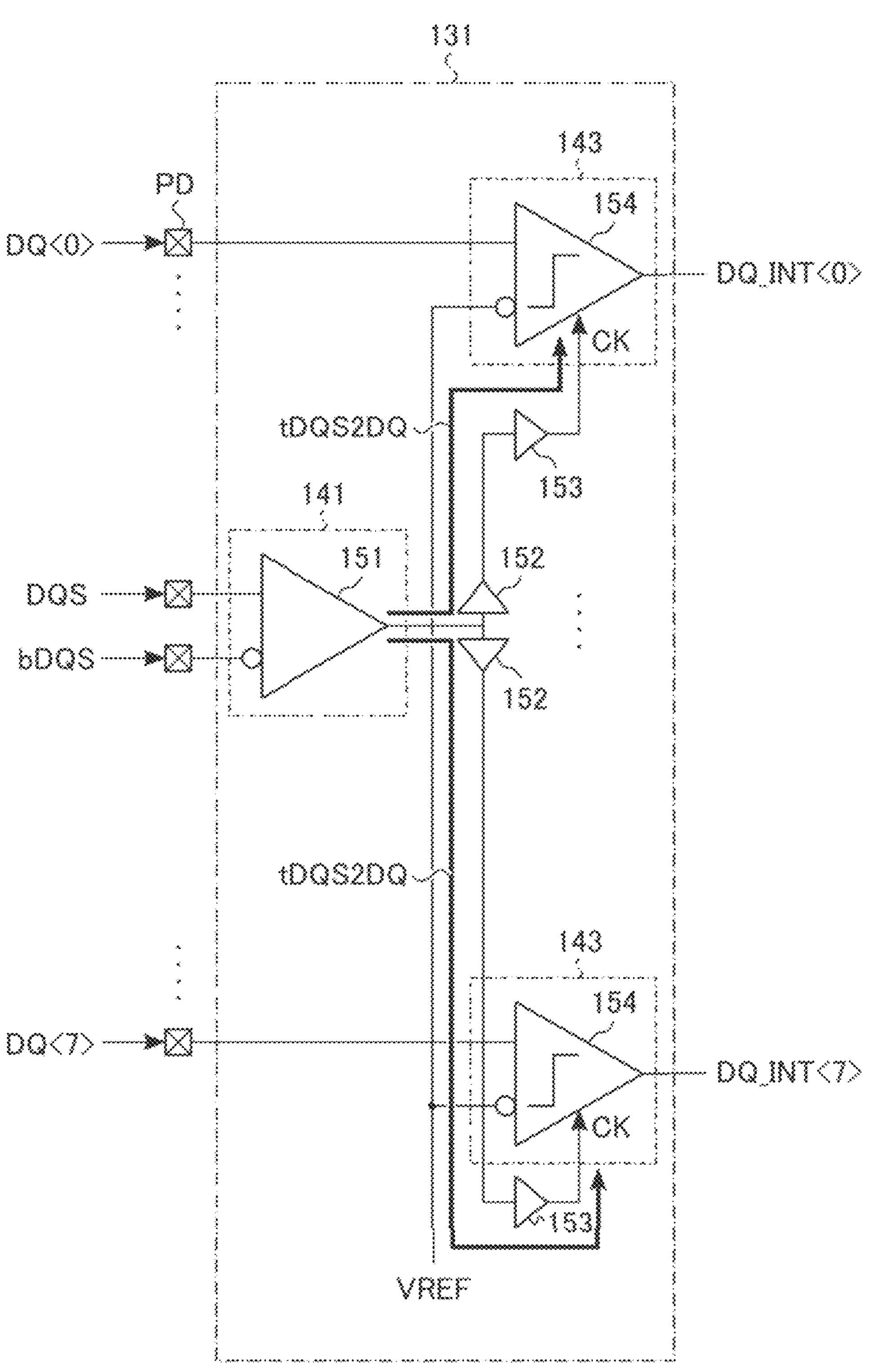
FIG. 5 is a diagram illustrating an example of a circuit configuration of the input circuit included in the semiconductor device according to the first embodiment.

Next, with reference to FIG. 5, an example of a circuit configuration of the input circuit 131 will be explained. FIG. 5 is a diagram illustrating an example of the circuit configuration of the input circuit 131. Note that in the example in FIG. 5, in order to simplify explanation, the delay circuit 142 and the latch circuit 143 corresponding to each of the signals DQ<1>-DQ<6> are omitted. Further, in the example in FIG. 5, the signal bCK is omitted.

As illustrated in FIG. 5, the input receiver 141 includes a comparator 151. The comparator 151 includes a first input terminal to which the signal DQS is input, a second input terminal to which the signal bDQS is input, and an output terminal. The first input terminal is connected to the pad PD to which the signal DQS is input. The second input terminal is connected to the pad PD to which the signal bDQS is input. For example, the comparator 151 outputs the inverted signals synchronized with the signals DQS and bDQS. The output terminal is connected to the latch circuit 143 via drivers 152 and 153. For example, the driver 152 is a CML (Current Mode Logic) circuit which amplifies an amplitude of the signal output by the comparator 151. In addition, for example, the driver 153 is a C2C (Cml To Cmos) circuit which converts the signal amplified by the driver 152 to a CMOS level.

The latch circuit 143 includes a plurality of comparators 154 corresponding to each signal DQ. Note that the plurality of comparators 154 may be provided for one signal DQ. For example, for one signal DQ, the comparator 154 to be operated based on the signal CK and the comparator 154 to be operated based on the signal bCK may be provided.

The comparator 154 includes a first input terminal, a second input terminal, a clock signal input terminal, and an output terminal. The first input terminal is connected to the pad PD to which the corresponding signal DQ is input. To the second input terminal, for example, a reference voltage VREF is input. The reference voltage VREF is a reference voltage used for determining a logic level of the signal DQ. To the clock signal input terminal, for example, the signal CK is input. The clock signal input terminal is connected to the driver 153. The wiring delay generated in a wiring route connecting the output terminal of the comparator 151 and the clock signal input terminal of the comparator 154 corresponds to the time tDQS2DQ. The signal DQ_INT is output from the output terminal of the comparator 154. In the example in FIG. 5, the comparator 154 outputs a result of comparing the signal DQ with the reference voltage VREF when the signal CK is at the High ("H") level. For example, when a voltage of the signal DQ is higher than the reference voltage VREF, the comparator 154 outputs the signal DQ_INT at the Low ("L") level.

A different comparator 154 is provided for each signal DQ. Therefore, for each comparator 154, the wiring route (wiring length) connecting the output terminal of the comparator 151 and the clock signal input terminal of the comparator 154 is different. Thus, for each signal DQ, an amount of the wiring delay generated in the wiring route is different. That is, for each signal DQ, the time tDQS2DQ may be different. For example, in the write training, optimum time tDQS2DQ may be set for each signal DQ.

1.1.4.3 Input Timing of Signals DQS and bDQS and Signal DQ

Figure 6:
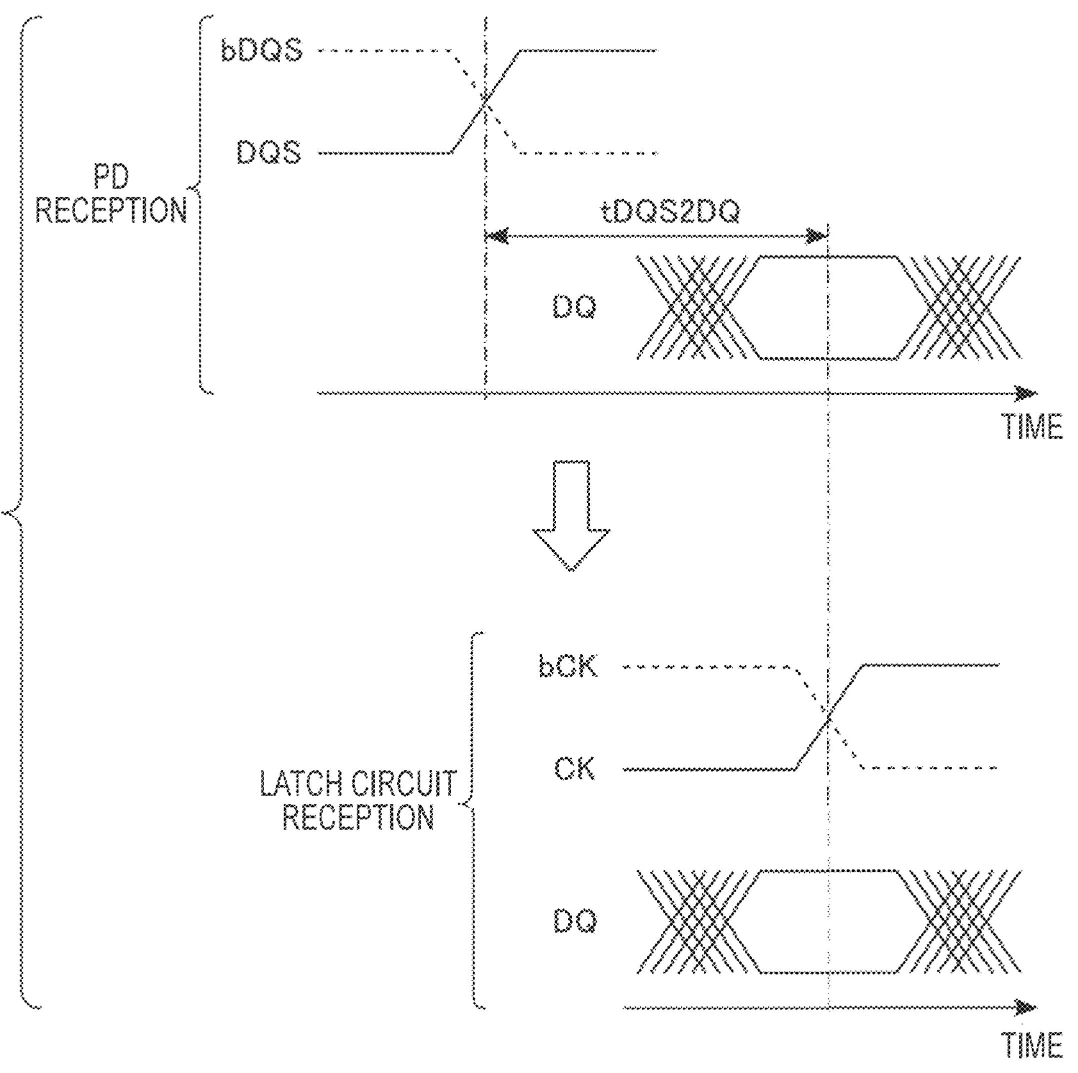
FIG. 6 is a diagram illustrating amplitude waveforms of signals DQS and bDQS and a signal DQ in the semiconductor device according to the first embodiment.

Next, with reference to FIG. 6, an example of input timing of the signals DQS and bDQS and the signal DQ will be explained. FIG. 6 is a diagram illustrating amplitude waveforms of the signals DQS and bDQS and the signal DQ. The example in FIG. 6 illustrates the amplitude waveforms of the signals DQS and bDQS and the signal DQ at the pad PD, and the amplitude waveforms of the signals CK and bCK (delayed signals DQS and bDQS) and the signal DQ in the latch circuit 143.

As illustrated in FIG. 6, in the present embodiment, the data (signal DQ) and the strobe signals (signals DQS and bDQS) are asynchronously input to the memory chip 11. That is, the input timing of the signals DQS and bDQS at the pad PD is not synchronized with the input timing of the signal DQ. A time difference between the signals DQS and bDQS and the signal DQ is the time tDQS2DQ.

The latch circuit 143 is disposed relatively close to the pad PD corresponding to the signal DQ. Therefore, the latch circuit 143 receives the signal DQ from the pad PD in a state with relatively less delay. In addition, the latch circuit 143 receives the signals CK and bCK for which the signals DQS and bDQS are delayed. In the latch circuit 143, the input timing of the signals CK and bCK and the input timing of the signal DQ are synchronized. Thus, the latch circuit 143 can fetch the signal DQ based on the signals CK and bCK. In the write training, the timing of the signal DQ is optimized such that the delay time of the signals CK and bCK corresponding to the signals DQS and bDQS becomes the time tDQS2DQ.

1.1.5 Configuration of Replica Circuit

1.1.5.1 Configuration of Replica Circuit

Figure 7:
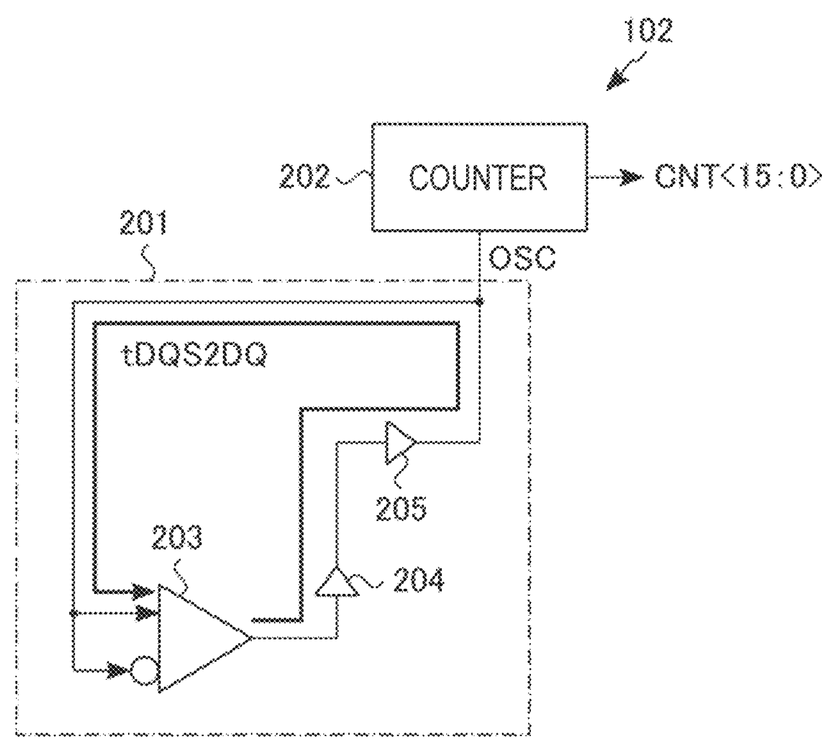
FIG. 7 is a diagram illustrating an example of an entire configuration of a replica circuit included in the semiconductor device according to the first embodiment.

First, with reference to FIG. 7, an example of a configuration of the replica circuit 102 will be explained. FIG. 7 is a diagram illustrating an example of the configuration of the replica circuit 102.

As illustrated in FIG. 7, the replica circuit 102 includes an oscillator 201 and a counter 202.

The present embodiment explains a case where the replica circuit 102 includes a set of the oscillator 201 and the counter 202 corresponding to the time tDQS2DQ of any one of the signals DQ<0>-DQ<7>. Note that the replica circuit 102 may include the plurality of sets of the oscillator 201 and the counter 202 corresponding to the plurality of signals DQ.

When the replica circuit 102 includes a set of the oscillator 201 and the counter 202, the set of the oscillator 201 and the counter 202 may correspond to the signal DQ input to the comparator 154 for which the wiring length between the comparator 151 of the input receiver 141 and the comparator 154 of the latch circuit 143 is the longest (the wiring delay is the largest). Alternatively, the set of the oscillator 201 and the counter 202 may correspond to the signal DQ input to the comparator 154 for which the above-described wiring length is an average length, or may correspond to the signal DQ input to the comparator 154 for which the above-described wiring length is the shortest. That is, the set of the oscillator 201 and the counter 202 may correspond to the signal DQ of the longest time tDQS2DQ, may correspond to the signal DQ of the average time tDQS2DQ, or may correspond to the signal DQ of the shortest time tDQS2DQ.

The oscillator 201 is a feedback type oscillation circuit. The oscillator 201 outputs the signal OSC. The signal OSC is a clock signal. The oscillator 201 includes a comparator 203 and drivers 204 and 205.

The comparator 203 has a configuration similar to that of the comparator 151 of the input receiver 141, for example. An output terminal of the comparator 203 is connected to a first input terminal and a second input terminal of the comparator 203. That is, an output signal is fed back. The comparator 203 inverts a logic level of the signal input to the first input terminal and outputs the signal. Therefore, the output signal of the oscillator 201 is oscillated. For example, when the signal at the "L" level (the output signal of the comparator 203) is input to the first input terminal, the comparator 203 outputs the signal at the "H" level.

A wiring route (feedback route) connecting the output terminal and the first input terminal and the second input terminal of the comparator 203 has a configuration and a wiring length similar to that of the wiring route connecting the output terminal of the comparator 151 of the input receiver 141 and the clock signal input terminal of the comparator 154 of the latch circuit 143 explained using FIG. 5. For example, the wiring route connecting the output terminal and the first input terminal and the second input terminal of the comparator 203 is provided with the drivers 204 and 205, similarly to the input circuit 131. For example, the driver 204 is a CML circuit having a configuration similar to that of the driver 152. For example, the driver 205 is a C2C circuit having a configuration similar to that of the driver 153. In the wiring route connecting the output terminal and the first input terminal and the second input terminal of the comparator 203, similarly to the input circuit 131, the wiring delay of the time tDQS2DQ is generated. Therefore, the logic level of the output signal of the comparator 203 is inverted at an interval of every time tDQS2DQ. Thus, the time of one cycle of the signal OSC is twice as long as the time tDQS2DQ, that is, 2×(tDQS2DQ).

To the counter 202, the signal OSC output from the oscillator 201 is input. The counter 202 counts the cycle number of the signal OSC. The counter 202 outputs a count value CNT as a count result. For example, the count value CNT may be a 16-bit signal. In this case, the counter 202 outputs count values CNT<15:0> of 16 bits. The replica circuit 102 transmits the count values CNT<15:0> to the status register 106. Note that the bit number of the count value CNT is arbitrary.

1.1.5.2 Configuration of Counter

Figure 8:
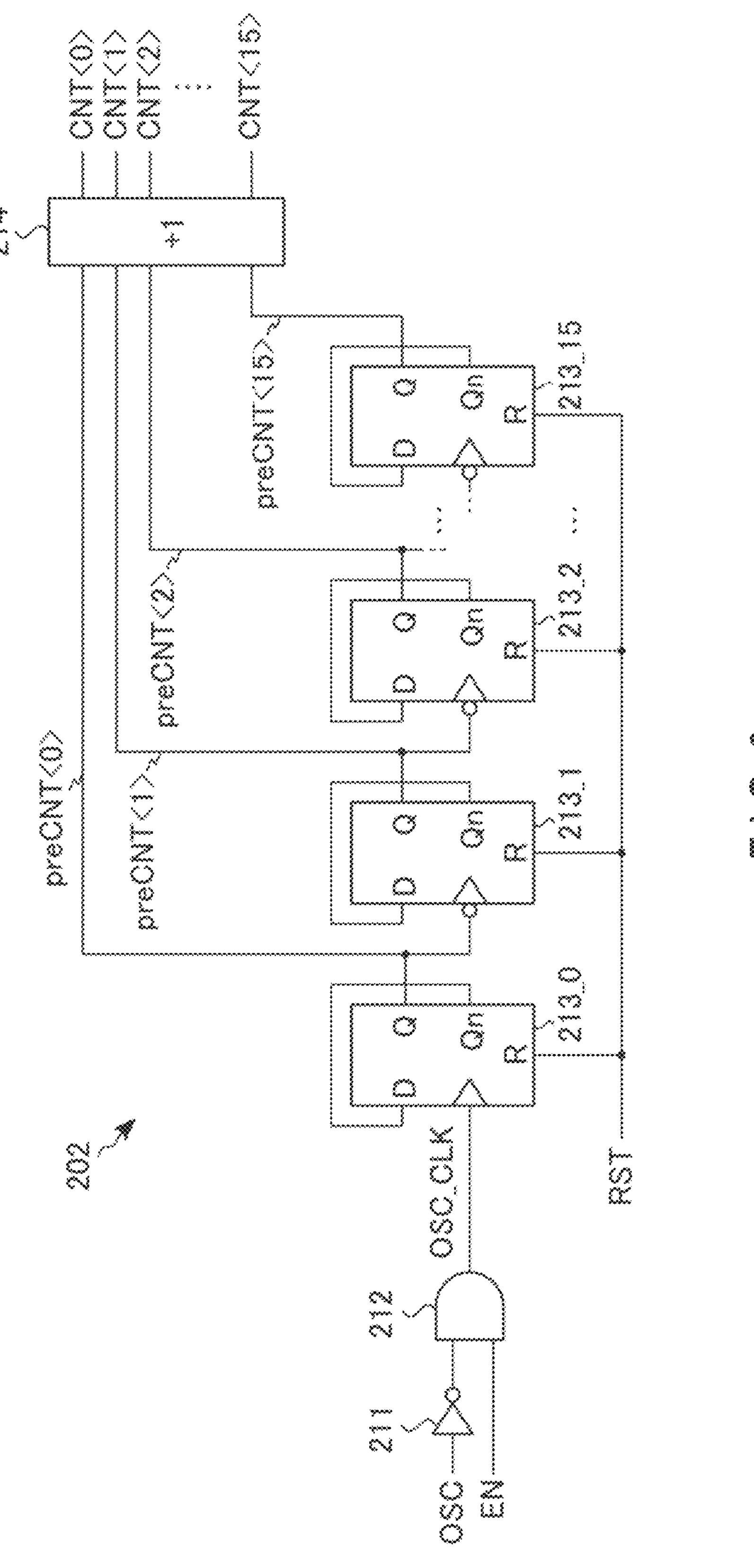
FIG. 8 is a circuit diagram illustrating an example of a configuration of a counter included in the semiconductor device according to the first embodiment.

Next, with reference to FIG. 8, an example of a configuration of the counter 202 will be explained. FIG. 8 is a circuit diagram illustrating an example of the configuration of the counter 202.

As illustrated in FIG. 8, the counter 202 of the present embodiment counts up the cycle number at a falling edge of the signal OSC, that is, the timing of shifting from the "H" level to the "L" level. Then, the counter 202 outputs the result of adding +1 to the cycle number as the count values CNT<15:0>.

The counter 202 includes an inverter 211, an AND circuit 212, a plurality of flip-flops 213, and an adder 214. For example, when the count value CNT is the 16-bit signal, the counter 202 includes 16 pieces of the flip-flops 213. Hereinafter, in the case of limiting the flip-flops 213 corresponding respectively to the count values CNT<0>-CNT<15>, they are described as flip-flops 213_0-213_15. The inverter 211 inverts and outputs the signal OSC. An input terminal of the inverter 211 is connected to the oscillator 201. To the input terminal of the inverter 211, the signal OSC is input. An output terminal of the inverter 211 is connected to a first input terminal of the AND circuit 212.

To a second input terminal of the AND circuit 212, an enable signal EN is input. The enable signal EN is the enable signal of the oscillator 201 and the counter 202. For example, while the enable signal EN is at the "H" level, the oscillator 201 outputs the signal OSC. In addition, the counter 202 executes the counting operation. The enable signal EN is supplied from the sequencer 107, for example. An output terminal of the AND circuit 212 is connected to a clock signal input terminal of the flip-flop 213_0. The AND circuit 212 outputs a result of an AND operation of the inverted signal of the signal OSC and the enable signal EN, as a signal OSC_CLK. When the enable signal EN is at the "H" level, the signal OSC_CLK is a clock signal for which the signal OSC is inverted. For example, when the enable signal EN is at the "H" level and the inverted signal of the signal OSC is at the "H" level (that is, the signal OSC is at the "L" level), the signal OSC_CLK is turned to the "H" level.

The flip-flops 213 are a plurality of D flip-flops provided corresponding to the bit number of the count value CNT. The flip-flop 213 includes a clock signal input terminal, a data input terminal D, a reset signal input terminal R, an output terminal Q, and an inverted output terminal Qn.

The flip-flop 213 fetches (stores) the data input from the data input terminal D at a rising edge of the clock signal input to the clock signal input terminal, that is, the timing of shifting from the "L" level to the "H" level. Thus, output data is updated. The data input terminal D of the flip-flop 213 is connected to the inverted output terminal Qn of the flip-flop 213. Thus, the flip-flop 213 inverts the signals output from the output terminal Q and the inverted output terminal Qn at the rising edge of the clock signal input to the clock signal input terminal. To the reset signal input terminal R of the flip-flop 213, a reset signal RST is input. When the reset signal RST at the "H" level is input to the reset signal input terminal R, the flip-flop 213 is reset. That is, the signal at the "L" level is output from the output terminal Q of the flip-flop 213, and the signal at the "H" level is output from the inverted output terminal Qn. The reset signal RST is supplied from the sequencer 107, for example.

The flip-flops 213_0-213_15 are connected in multiple stages. More specifically, to the clock signal input terminal of the flip-flop 213_0, the signal OSC_CLK is input. To the clock signal input terminals of the flip-flops 213_1-213_15, inverted data of the data output from the output terminal Q of the flip-flop 213 in a previous stage is input. For example, the flip-flop 213 is described as a flip-flop 213_*k* using a variable k (k is an integer equal to or larger than 1 and equal to or smaller than 15). In this case, to the clock signal input terminal of the flip-flop 213_*k*, the inverted data of the data output from the output terminal Q of a flip-flop 213_(k−1) in the previous stage is input.

For example, the signal output from the output terminal Q of the flip-flop 213 is described as a signal preCNT. Signals preCNT<0>-preCNT<15> are output respectively from the output terminals Q of the flip-flops 213_0-213_15. The signals preCNT<0>-preCNT<15> indicate the cycle number of the signal OSC.

The adder 214 is connected to the output terminal Q of each flip-flop 213. The adder 214 outputs the result of adding +1 to the data of 16 bits indicated by the signals preCNT<0>-preCNT<15>, as the count values CNT<0>-CNT<15> of 16 bits. That is, the adder 214 adds +1 to the cycle number of the signal OSC counted at the falling edge.

1.1.6 Specific Example of Allocation of Count Value CNT in Status Register

Next, with reference to FIG. 9, a specific example of allocation of the count value CNT in the status register 106 will be explained. FIG. 9 is a table illustrating a specific example of address information of the count values CNT<15:0> in the status register 106.

As illustrated in FIG. 9, for example, the count values CNT<15:0> of 16 bits are stored in registers corresponding to addresses "Bx" and "By" of the status register 106. More specifically, in the register corresponding to the address "Bx", the count values CNT<0>-CNT<7> are stored corresponding to the signals DQ<0>-DQ<7>. Then, in the register corresponding to the address "By", the count values CNT<8>-CNT<15> are stored corresponding to the signals DQ<0>-DQ<7>. Note that the registers where the count values CNT<15:0> are stored may be appropriately set.

For example, the memory controller 20 executes an operation of reading the status information STS from the status register 106 (described as "GetFeature operation", hereinafter) to a target memory chip 11. The memory controller 20 transmits a command set to execute the GetFeature operation, and reads the status information STS including the count values CNT<15:0>.

1.2 Counting Operation

Next, a counting operation of the signal OSC in the replica circuit 102 will be explained.

1.2.1 Command Sequence of Counting Operation

Figure 10:
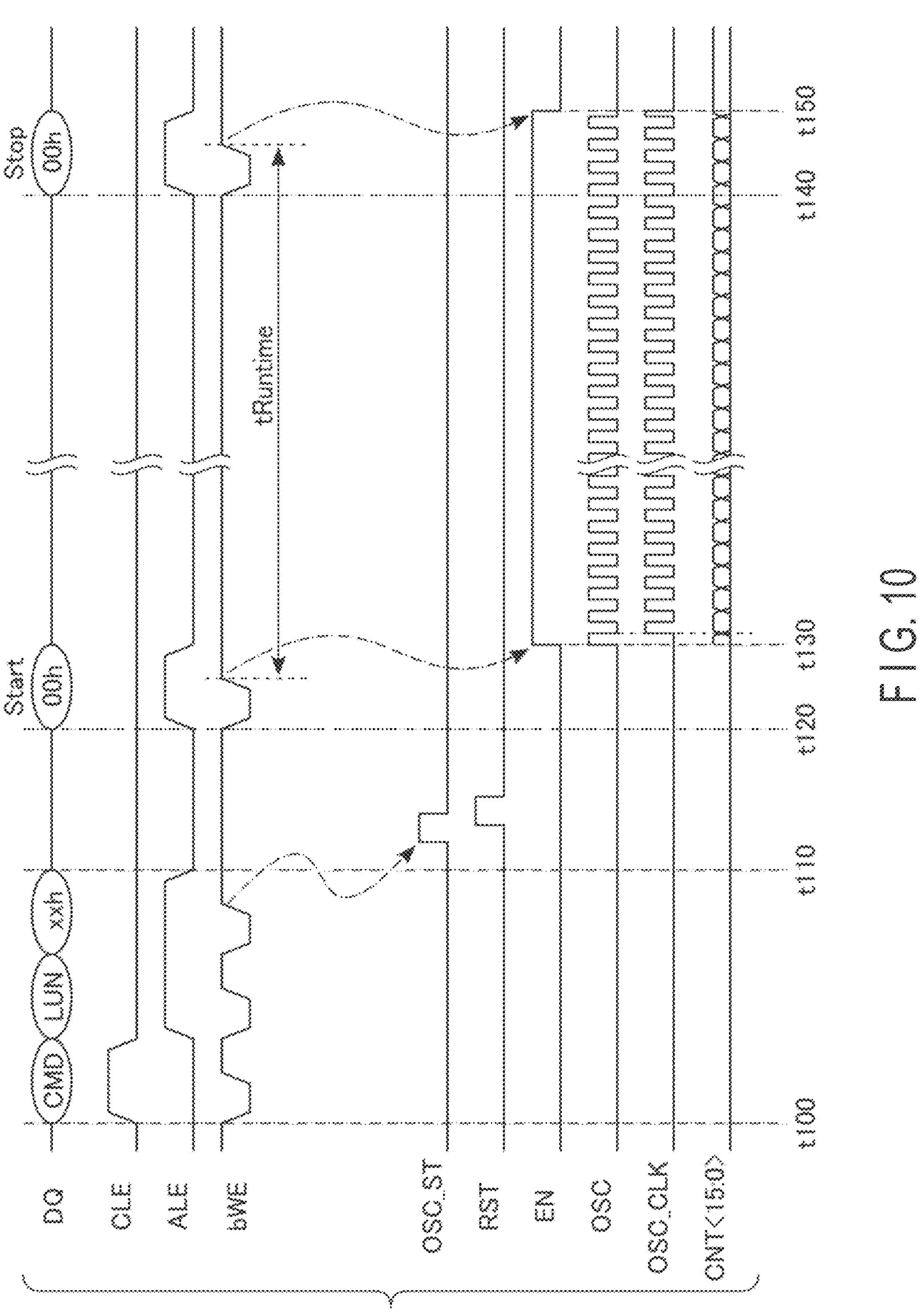
FIG. 10 is a diagram illustrating an example of a command sequence of a counting operation in the semiconductor device according to the first embodiment.

First, with reference to FIG. 10, an example of a command sequence of the counting operation will be explained. FIG. 10 is a diagram illustrating an example of the command sequence of the counting operation. Note that in the example in FIG. 10, the signals DQS and bDQS, the chip enable signal bCE, the read enable signals RE and bRE, and the ready/busy signal bRB are omitted.

As illustrated in FIG. 10, the counting operation of the signal OSC in the replica circuit 102 is executed based on the command set corresponding to the counting operation, which is transmitted from the memory controller 20. The command set is a combination of the command, the address and the data or the like corresponding to the operation executed by the memory chip 11.

In a period of times t100-*t*110, first, the memory controller 20 transmits a command "CMD" to the memory chip 11, also turns the command latch enable signal CLE to the "H" level and asserts it. The command "CMD" transmitted here is a command which instructs execution of the counting operation. The memory chip 11 fetches the command "CMD" according to a toggle of the write enable signal bWE.

Then, the memory controller 20 transmits an address "LUN" to the memory chip 11, also turns the address latch enable signal ALE to the "H" level and asserts it. The address "LUN" is the address information of the memory chip 11 to be an execution target of the counting operation. The memory chip 11 fetches the address "LUN" according to the toggle of the write enable signal bWE.

Next, the memory controller 20 transmits an address "xxh" to the memory chip 11, also turns the address latch enable signal ALE to the "H" level and asserts it. The address "xxh" is information (recipe) indicating whether one memory chip 11 is to be the execution target of the counting operation or all the memory chips 11 connected to one channel CH of the memory interface circuit 27 are the target. For example, when the address "xxh" is "00h", one memory chip 11 is the target. In addition, when the address "xxh" is "01h", all the memory chips 11 connected to one channel CH are the target. The memory chip 11 fetches the address "xxh" according to the toggle of the write enable signal bWE. Note that while the example in FIG. 10 illustrates the case where "xxh" is the address, it is not limited thereto. The "xxh" may be a command. In this case, the command latch enable signal is turned to the "H" level, and the address latch enable signal ALE is turned to the "L" level.

When the address "xxh" is received, the sequencer 107 transmits a signal OSC_ST at the "H" level to the replica circuit 102 in a period of times t110-*t*120. The signal OSC_ST is an internal signal which notifies the replica circuit 102 (counter 202) of the execution of the counting operation. After transmitting the signal OSC_ST of pulse, the sequencer 107 turns the signal OSC_ST to the "L" level.

Subsequently, the sequencer 107 transmits the reset signal RST at the "H" level to the replica circuit 102. When the reset signal RST at the "H" level is received, each flip-flop 213 of the counter 202 is reset. That is, the flip-flop 213 outputs the signal at the "L" level from the output terminal Q, and outputs the signal at the "H" level from the inverted output terminal Qn. After transmitting the reset signal RST of 1 pulse, the sequencer 107 turns the reset signal RST to the "L" level.

Next, at a time t120, the memory controller 20 transmits an address "00h" to the memory chip 11, also turns the address latch enable signal ALE to the "H" level and asserts it. The address "00h" transmitted after the address "xxh" is information which instructs start of the counting operation. The memory chip 11 fetches the address "00h" according to the toggle of the write enable signal bWE. Note that while the example in FIG. 10 illustrates the case where "00h" is the address, it is not limited thereto. The "00h" may be a command.

When the address "00h" is received, the sequencer 107 transmits the enable signal EN at the "H" level to the replica circuit 102 at a time t130. When the enable signal EN at the "H" level is received, the oscillator 201 starts oscillation of the signal OSC. In the counter 202, in a period of times t130-*t*150, that is, while the enable signal EN is at the "H" level, the signal OSC_CLK for which the signal OSC is inverted is output from the AND circuit 212. The counter 202 counts up according to the rising edge of the signal OSC_CLK. That is, the counter 202 counts up according to the falling edge of the signal OSC. The counter 202 outputs a value for which +1 is added to a count-up result as the count values CNT<15:0>.

Next, after preset execution time (described as "counting execution time tRuntime", hereinafter) elapses after transmitting the address "00h" which instructs the start of the counting operation, at a time t140, the memory controller 20 transmits the address "00h" again to the memory chip 11, also turns the address latch enable signal ALE to the "H" level and asserts it. The address "00h" here is information which instructs an end of the counting operation. The memory chip 11 fetches the address "00h" according to the toggle of the write enable signal bWE. In other words, the counting execution time tRuntime is an interval between the toggle of the write enable signal bWE corresponding to the address "00h" which instructs the start of the counting operation and the toggle of the write enable signal bWE corresponding to the address "00h" which instructs the end of the counting operation. Note that while the example in FIG. 10 illustrates the case where "00h" is the address, it is not limited thereto. The "00h" may be a command. In addition, the address which instructs the start of the counting operation and the address which instructs the end of the counting operation may be different.

When the address "00h" is received, the sequencer 107 turns the enable signal EN to the "L" level at a time t150. When the enable signal EN at the "L" level is received, the oscillator 201 ends the oscillation of the signal OSC. In the counter 202, when the enable signal EN is turned to the "L" level, the signal OSC_CLK at the "L" level is output from the AND circuit 212. Thus, the counter 202 ends the counting operation.

1.2.2 Specific Example of Count Value

Figure 11:
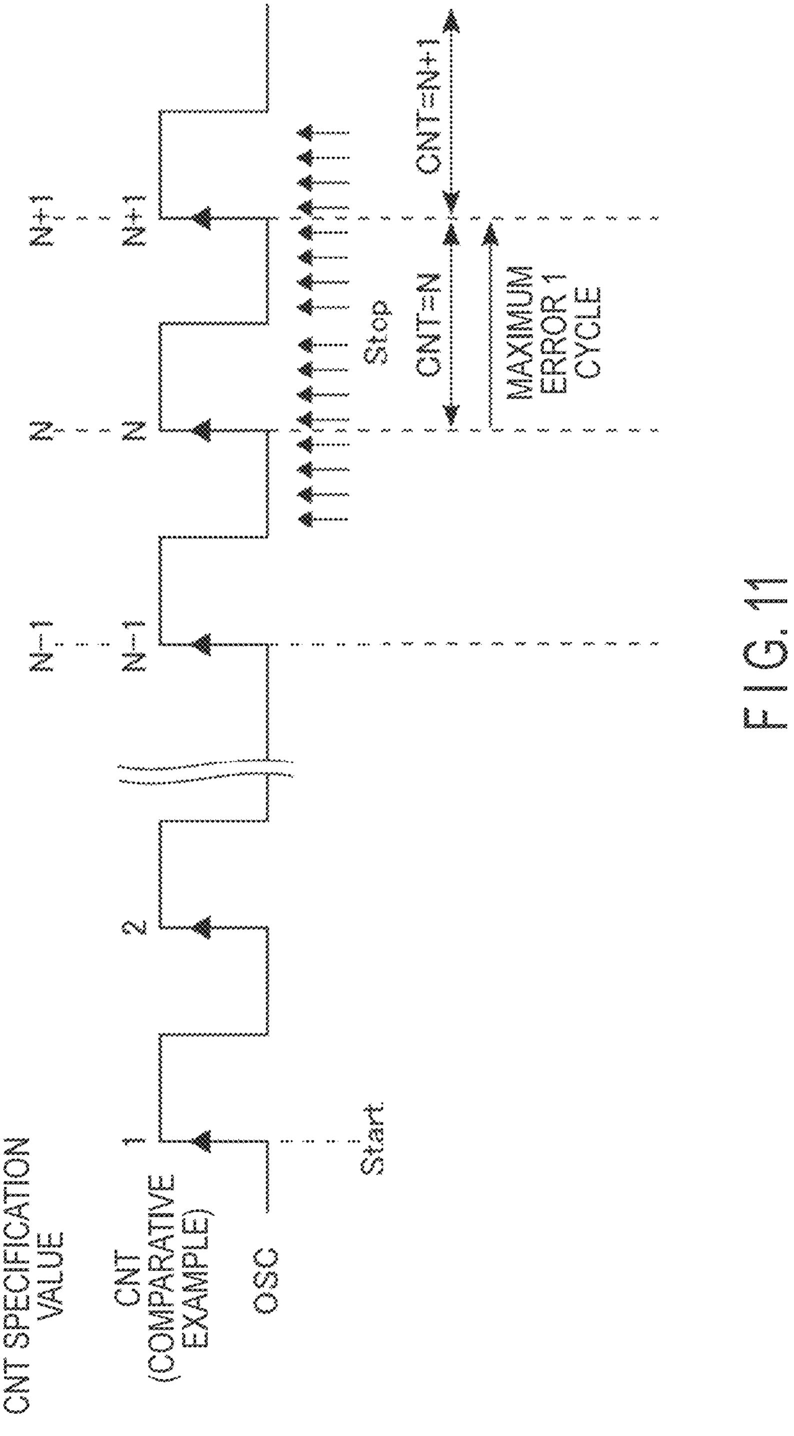
FIG. 11 is a diagram illustrating a comparative example of the counting operation.
Figure 12:
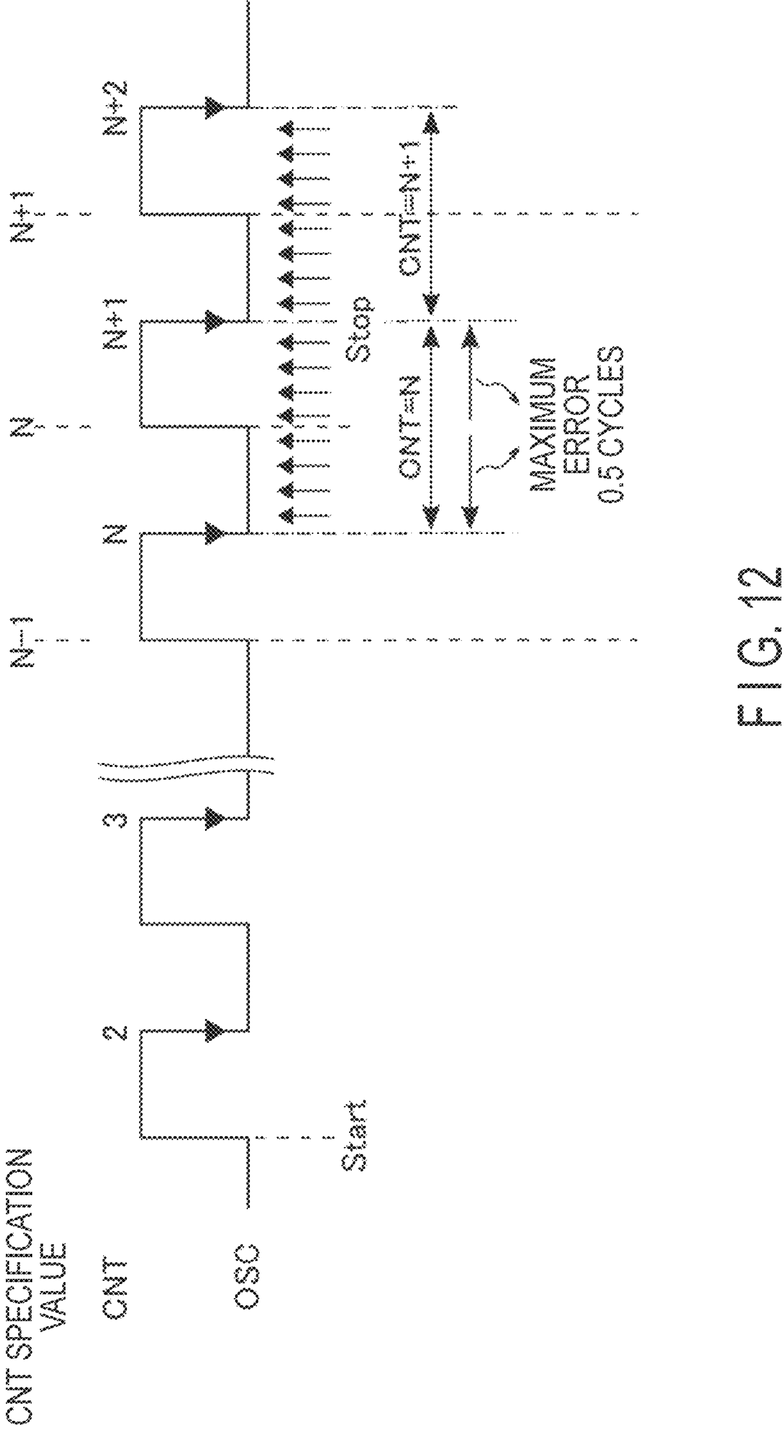
FIG. 12 is a diagram illustrating a specific example of a count value CNT in the counting operation by the counter included in the semiconductor device according to the first embodiment.

Next, with reference to FIG. 11 and FIG. 12, a specific example of the count value CNT will be explained. FIG. 11 illustrates a comparative example of the counting operation. FIG. 12 illustrates a specific example of the count value CNT in the counting operation by the counter 202 of the present embodiment.

In the following explanation, the count value CNT determined by specifications beforehand is described as "CNT specification value". The CNT specification value is set based on the cycle number of the signal OSC in the counting execution time tRuntime. Thus, the CNT specification value is a value that is counted up based on the rising edge (a start position of one cycle) of the signal OSC. Note that in the following explanation, the CNT specification value and the count value CNT will be explained using decimal numerical values.

First, the comparative example will be explained. As the comparative example, the case of counting up the count value CNT at the rising edge of the signal OSC similarly to the CNT specification value will be explained. In this case, the counter 202 counts up the cycle number (count number) at the rising edge of the signal OSC, and outputs the counted-up value as it is as the count value CNT.

As illustrated in FIG. 11, in the comparative example, when the oscillator 201 starts the oscillation (output) of the signal OSC, the counter 202 starts count-up of the count value CNT at the rising edge of the signal OSC. Thus, the count value CNT indicates the cycle number of the signal OSC similarly to the CNT specification value. In this case, the counter 202 outputs a count value CNT "1" at a start position ("Start" in FIG. 11) of the oscillation of the signal OSC. The counter 202 counts up the count value CNT at every cycle of the signal OSC. After the counting execution time tRuntime elapses, the oscillator 201 ends the oscillation of the signal OSC. An end position ("Stop" in FIG. 11) of the oscillation of the signal OSC varies with respect to a waveform of the signal OSC.

For example, when the CNT specification value is "N" (N is an integer equal to or larger than 1), a period during which the count value CNT is the same "N" is a period after the count value CNT is counted up to "N" until right before it is counted up to "N+1". For example, when the end position of the oscillation of the signal OSC is right before the count value CNT is counted up to "N+1", an error (also described as a granularity error, hereinafter) of the end position of the signal OSC to the CNT specification value "N" corresponds to roughly one cycle of the signal OSC at maximum. That is, one cycle of the signal OSC at maximum is the granularity error in the replica circuit 102. One cycle of the signal OSC is 2×(tDQS2DQ). Thus, a maximum value of the granularity error generated in the counting execution time tRuntime can be expressed by 2×(tDQS2DQ)/tRuntime.

Next, the counting operation of the present embodiment will be explained.

As illustrated in FIG. 12, the counter 202 counts up the cycle number at the falling edge of the signal OSC, and outputs the result of adding +1 to the counted-up value as the count value CNT. Thus, the timing at which the CNT specification value is counted up and the timing at which the count value CNT is counted up are different. The counter 202 counts up the count value CNT to N at the falling edge of an (N−1)-th cycle of the signal OSC. That is, the counter 202 counts up the count value CNT to N after 0.5 cycles of the (N−1)-th cycle elapse. In other words, the count value CNT is counted up 0.5 cycles earlier than the CNT specification value (the cycle number of the signal OSC). Therefore, the period during which the count value CNT is "N" is from the falling edge of the (N−1)-th cycle of the signal OSC to the falling edge of the N-th cycle. Thus, the granularity error of the end position of the signal OSC to the CNT specification value "N" is reduced to roughly 0.5 cycles of the signal OSC at maximum. The maximum value of the granularity error generated in the counting execution time tRuntime can be expressed by tDQS2DQ/tRuntime.

1.2.3 Flow of Counting Operation

Next, with reference to FIG. 13, an example of flow of the counting operation will be explained. FIG. 13 is a flowchart illustrating an example of the flow of the counting operation.

As illustrated in FIG. 13, first, the CPU 22 of the memory controller 20 issues the command set which instructs the execution of the counting operation (S1). The CPU 22 transmits the command set to the memory chip 11. For example, the memory controller 20 makes the memory chip 11 periodically execute the counting operation. Note that, for example, the memory system 1 may include a mechanism of monitoring a change in a voltage or a temperature or the like in the memory chip 11. For example, the CPU 22 may determine presence/absence of the execution of the counting operation based on a monitoring result of the voltage or the temperature or the like in the memory chip 11.

When the command set of the counting operation is received, the sequencer 107 of the memory chip 11 starts the counting operation in the replica circuit 102 (S2). More specifically, as explained using FIG. 10, in the period of the times t100-*t*110, the sequencer 107 receives the command "CMD", the address "LUN", and the address "xxh" from the memory controller 20. In the period of the times t110-*t*120, the sequencer 107 transmits the signal OSC_ST of 1 pulse and the reset signal RST.

The oscillator 201 starts the output of the signal OSC (S3). More specifically, at the time t120 explained using FIG. 10, the sequencer 107 receives the address "00h" which instructs the start from the memory controller 20. At the time t130 explained using FIG. 10, the sequencer 107 turns the enable signal EN to the "H" level. Based on the enable signal EN at the "H" level, the oscillator 201 starts the output of the signal OSC.

In the period of the times t130-*t*150 explained using FIG. 10, the counter 202 counts up the cycle number of the signal OSC at the falling edge of the signal OSC (S4).

The counter 202 outputs the value for which +1 is added to the cycle number (S5) as the count value CNT. The count value CNT is stored in the status register 106.

When the counting operation ends, the CPU 22 reads the count value CNT from the memory chip 11 (S6). For example, the CPU 22 issues the command set of the Get-Feature operation, and reads the count value CNT from the status register 106 of the memory chip 11.

The CPU 22 calculates a difference between the read count value CNT and the count value CNT of the previously executed counting operation (S7). For example, the count value of the previously executed counting operation is stored in the RAM 24.

The CPU 22 confirms whether an absolute value of the difference is larger than a threshold set beforehand (S8).

When the absolute value of the difference is larger than the threshold set beforehand (S8 Yes), the CPU 22 executes the write training (S9). That is, the sequencer 107 of the memory chip 11 executes the write training based on an instruction of the CPU 22.

On the other hand, when the absolute value of the difference is equal to or smaller than the threshold set beforehand (S8 No), the CPU 22 ends the counting operation.

1.3 Effect According to Present Embodiment

The configuration according to the present embodiment can improve throughput of a semiconductor device. The effect will be described in detail.

For example, when the signal DQ and the signals DQS and bDQS are asynchronously fetched to the memory chip 11, the time tDQS2DQ becomes longer compared to the case where the signal DQ and the signals DQS and bDQS are synchronously fetched. The optimum value of the time tDQS2DQ changes due to the fluctuation of the voltage or the temperature or the like in the memory chip 11. Therefore, the memory controller 20 execute the write training periodically for example and adjusts the timing of transmitting the signal DQ and the signals DQS and bDQS. However, execution time of the write training is relatively long. In addition, while the write training is being executed, the write operation and the read operation or the like cannot be executed. Therefore, when a frequency of the write training becomes high, the throughput of the memory chip 11 declines.

In contrast, in the configuration according to the present embodiment, the memory chip 11 (semiconductor device) is provided with the replica circuit 102 including the oscillator 201 which outputs the signal OSC and the counter 202 which counts the cycle number of the signal OSC. The memory chip 11 can execute the counting operation in the replica circuit 102 based on the control of the memory controller 20. The memory controller 20 can determine the presence/absence of write training execution based on a result of the counting operation. Thus, execution timing of the write training can be optimized, and the throughput of the memory chip 11 can be improved.

Further, in the configuration according to the present embodiment, the counter 202 can count up 0.5 cycles earlier than the cycle number of the signal OSC. Therefore, compared to the case of counting up according to the cycle number of the signal OSC, the granularity error of the count value CNT to the counting execution time tRuntime can be made into ½. In the configuration according to the present embodiment, accuracy of the counting operation on the same level as that in the case of counting up according to the cycle number of the signal OSC can be achieved in the ½ counting execution time tRuntime. Thus, the throughput of the memory chip 11 can be improved.

Further, in the configuration according to the present embodiment, since the granularity error can be made into ½, the accuracy of the counting operation can be improved.

1.4 Modification of First Embodiment

Next, a modification of the first embodiment will be explained. In the modification, the case where a command and address transmission method is different from that in the first embodiment will be explained. Hereinafter, points different from the first embodiment will be mainly explained.

1.4.1 Configuration of Memory Chip

Figure 14:
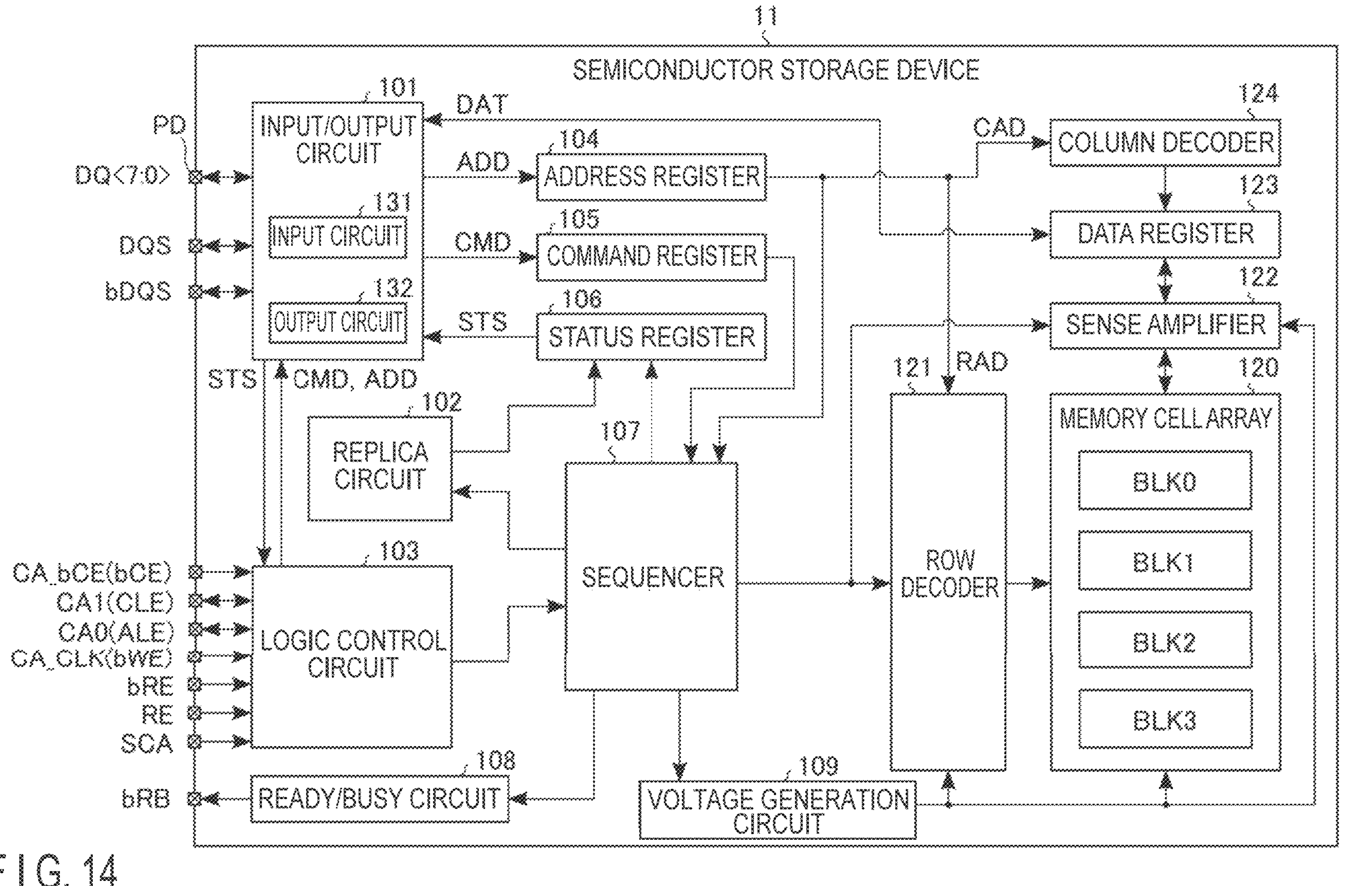
FIG. 14 is a block diagram illustrating an example of a configuration of a semiconductor device according to a modification of the first embodiment.

First, with reference to FIG. 14, an example of the configuration of the memory chip 11 will be explained. FIG. 14 is a block diagram illustrating an example of the configuration of the memory chip 11 (semiconductor device). Note that while some connections between individual components are indicated by arrow lines in the example in FIG. 14, the connections between the individual components are not limited thereto.

The memory chip 11 of the present modification has two modes, in input/output of data and information or the like to/from the memory controller 20.

A first mode is a mode of using the signal DQ for input/output of the data DAT and not using it for the input of the command CMD and the address ADD and the output of the status information STS. A protocol of the first mode is described also as "SCA (Separate Command Address input) protocol". In the first mode, in the logic control circuit 103, the input of the command CMD and the address ADD and the output of the status information STS are executed. Note that in the first mode, the ready/busy signal bRB may be output from the logic control circuit 103. In this case, the ready/busy circuit 108 is connected to the logic control circuit 103.

A second mode is a mode of using the signal DQ explained in the first embodiment for the input/output of the data DAT, the input of the command CMD and the address ADD, and the output of the status information STS. Since the second mode is similar to the first embodiment, the explanation is omitted.

As illustrated in FIG. 14, the memory chip (NAND type flash memory) 11 of the present modification includes, similarly to FIG. 2 of the first embodiment, the input/output circuit 101, the replica circuit 102, the logic control circuit 103, the address register 104, the command register 105, the status register 106, the sequencer 107, the ready/busy circuit 108, the voltage generation circuit 109, the memory cell array 120, the row decoder 121, the sense amplifier 122, the data register 123, and the column decoder 124. The configuration of the replica circuit 102, the address register 104, the command register 105, the status register 106, the sequencer 107, the ready/busy circuit 108, the voltage generation circuit 109, the memory cell array 120, the row decoder 121, the sense amplifier 122, the data register 123, and the column decoder 124 is similar to that in the first embodiment.

When the first mode is selected, the input/output circuit 101 receives the command CMD and the address ADD from the logic control circuit 103. In addition, the input/output circuit 101 transmits the status information STS to the logic control circuit 103.

The logic control circuit 103 receives a signal CA_bCE, a signal CA_CLK, the read enable signals RE and bRE, and a signal SCA from the memory controller 20. Further, the logic control circuit 103 transmits and receives a signal CA1 and a signal CA0 to/from the memory controller 20.

The signal CA_bCE corresponds to the chip enable signal bCE explained in the first embodiment. The signal CA_bCE is asserted at the Low ("L") level for example.

The signal CA0 and the signal CA1 are signals indicating the command, the address, or the status information STS in the first mode. In the second mode, the command latch enable signal CLE is input to an input terminal of the signal CA1. In addition, the address latch enable signal ALE is input to an input terminal of the signal CA0.

The signal CA_CLK is a strobe signal of the signal CA0 and the signal CA1 in the first mode. For example, the logic control circuit 103 fetches the signal CA0 and the signal CA1 at the rising edge and the falling edge of the signal CA_CLK at the time of the input of the command CMD or the address ADD. Further, the logic control circuit 103 outputs the signal CA0 and the signal CA1 based on the signal CA_CLK at the time of the output of the status information STS. In the second mode, the write enable signal bWE is input to a terminal corresponding to the signal CA_CLK.

The read enable signals RE and bRE are used for the output of the signal DQ and are not used for the output of the status information STS in the first mode.

The signal SCA is a control signal of mode switching. For example, the first mode is selected when the signal SCA is at the "H" level, and the second mode is selected when the signal SCA is at the "L" level.

1.4.2 Command Sequence of Command and Address Input in First Mode

Next, with reference to FIG. 15, an example of a command sequence of command and address input in the first mode will be explained. FIG. 15 is a diagram illustrating an example of the command sequence of the command and address input in the first mode. In the example in FIG. 15, the signal DQ, the signals DQS and bDQS, the read enable signals RE and bRE, and the ready/busy signal bRB are omitted.

As illustrated in FIG. 15, in the first mode, by a combination of the signal CA0 of 6 bits and the signal CA1 of 6 bits, a kind of information and information of 8 bits are indicated. Hereinafter, the combination of the signal CA0 and the signal CA1 is described as "frame". The kind of the information indicates one of the command CMD, the address ADD and the status information STS, for example.

The frame is configured by a combination of a header set indicating the kind of the information and a body set indicating contents of the information.

The header set is a set of 4 bits (each bit is described as "header") configured by leading 2 bits of the signal CA0 and leading 2 bits of the signal CA1. In each of the signal CA0 and the signal CA1, a first bit in the header set is described as a first header. A second bit in the header set is described as a second header.

The body set is a set of 8 bits (each bit is described as "body") configured by trailing 4 bits of the signal CA0 and trailing 4 bits of the signal CA1. In each of the signal CA0 and the signal CA1, a first bit in the body set is described as a first body. A second bit in the body set is described as a second body. A third bit in the body set is described as a third body. A fourth bit in the body set is described as a fourth body. For example, the first body of the signal CA0 corresponds to the signal DQ<0> in the second mode, and the first body of the signal CA1 corresponds to the signal DQ<1> in the second mode. The second body of the signal CA0 corresponds to the signal DQ<2> in the second mode, and the second body of the signal CA1 corresponds to the signal DQ<3> in the second mode. The third body of the signal CA0 corresponds to the signal DQ<4> in the second mode, and the third body of the signal CA1 corresponds to the signal DQ<5> in the second mode. The fourth body of the signal CA0 corresponds to the signal DQ<6> in the second mode, and the fourth body of the signal CA1 corresponds to the signal DQ<7> in the second mode.

When selecting the first mode, the memory controller 20 turns the signal CA_bCE to the "L" level, and turns the signal SCA to the "H" level. Thus, in the target memory chip 11, the first mode is selected.

First, the memory controller 20 transmits the first headers of the signal CA0 and the signal CA1 to the memory chip 11. The memory chip 11 fetches the first headers according to the rising edge of the signal CA_CLK at a time to.

Next, the memory controller 20 transmits the second headers of the signal CA0 and the signal CA1 to the memory chip 11. The memory chip 11 fetches the second headers according to the falling edge of the signal CA_CLK at a time t1.

Then, the memory controller 20 transmits the first bodies of the signal CA0 and the signal CA1 to the memory chip 11. The memory chip 11 fetches the first bodies according to the rising edge of the signal CA_CLK at a time t2.

Subsequently, the memory controller 20 transmits the second bodies of the signal CA0 and the signal CA1 to the memory chip 11. The memory chip 11 fetches the second bodies according to the falling edge of the signal CA_CLK at a time t3.

Next, the memory controller 20 transmits the third bodies of the signal CA0 and the signal CA1 to the memory chip 11. The memory chip 11 fetches the third bodies according to the rising edge of the signal CA_CLK at a time t4.

Then, the memory controller 20 transmits the fourth bodies of the signal CA0 and the signal CA1 to the memory chip 11. The memory chip 11 fetches the fourth bodies according to the falling edge of the signal CA_CLK at a time t5.

For example, when transmission of the frame is ended, the memory controller 20 turns the signal CA_bCE to the "H" level and turns the signal SCA to the "L" level.

As explained above, when the first mode is selected, the signal DQ, the signals DQS and bDQS, and the signals RE and bRE are not used for the input of the command CMD and the address ADD. Therefore, the input of the command CMD and the address ADD can be executed in parallel with the input/output of the data DAT using the signal DQ and the signals DQS and bDQS. The memory controller 20 can instruct the execution of the counting operation to the memory chip 11 without using the signal DQ and the signals DQS and bDQS.

Command Sequence of GetFeature Operation in First Mode

Figure 16:
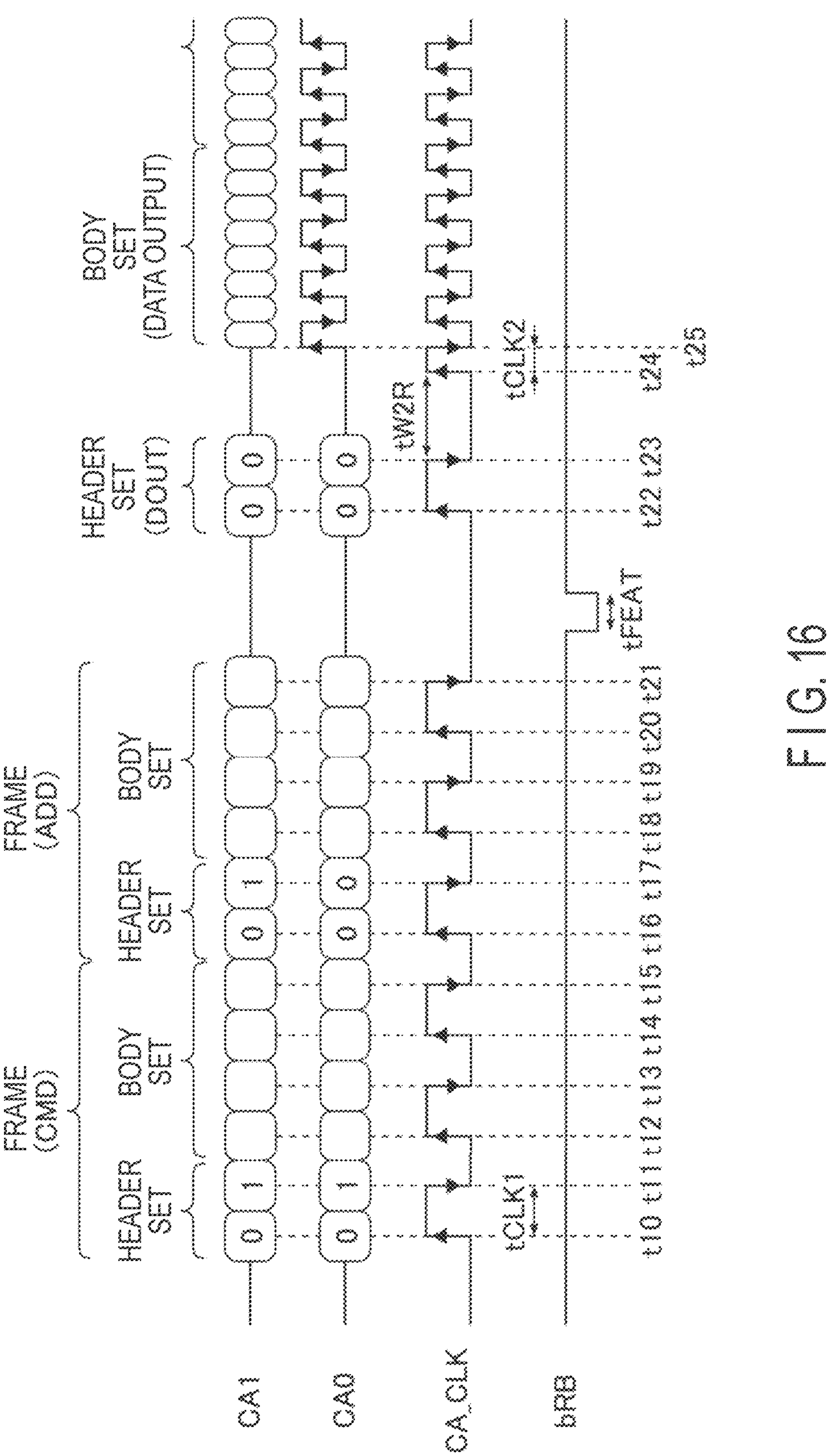
FIG. 16 is a diagram illustrating an example of a command sequence of a GetFeature operation when the first mode is selected in the semiconductor device according to the modification of the first embodiment.

Next, with reference to FIG. 16, a command sequence of the GetFeature operation in the first mode will be explained. FIG. 16 is a diagram illustrating an example of the command sequence of the GetFeature operation in the first mode. Note that in the example in FIG. 16, the signal DQ, the signals DQS and bDQS, the signal CA_bCE, the signal SCA, the read enable signals RE and bRE, and the ready/busy signal bRB are omitted.

As illustrated in FIG. 16, first, at times t10-*t*15, an input operation of the frame corresponding to the command CMD which instructs the execution of the GetFeature operation is executed. An interval of the individual times from the time t10 to the time t21 is described as "tCLK1".

More specifically, first, at the time t10, as the first headers, for example, the signal CA0 indicating "0" and the signal CA1 indicating "0" are input.

Next, at the time t11, as the second headers, for example, the signal CA0 indicating "1" and the signal CA1 indicating "1" are input. For example, the header set of "0", "0", "1", and "1" indicates that the body set to be input next is the command CMD.

Then, from the time t12 to the time t15, the body set of the command CMD is input. More specifically, at the time t12, the signal CA0 and the signal CA1 indicating the first bodies are input. Next, at the time t13, the signal CA0 and the signal CA1 indicating the second bodies are input. Then, at the time t14, the signal CA0 and the signal CA1 indicating the third bodies are input. Subsequently, at the time t15, the signal CA0 and the signal CA1 indicating the fourth bodies are input.

Next, at times t16-*t*21, the input operation of the frame corresponding to the address ADD of the status register 106 is executed.

More specifically, first, at the time t16, as the first headers, for example, the signal CA0 indicating "0" and the signal CA1 indicating "0" are input.

Next, at the time t17, as the second headers, for example, the signal CA0 indicating "0" and the signal CA1 indicating "1" are input. For example, the header set of "0", "0", "0", and "1" indicates that the body set to be input next is the address ADD.

Then, from the time t18 to the time t21, the body set of the address ADD is input. More specifically, at the time t18, the signal CA0 and the signal CA1 indicating the first bodies are input. Next, at the time t19, the signal CA0 and the signal CA1 indicating the second bodies are input. Then, at the time t20, the signal CA0 and the signal CA1 indicating the third bodies are input. Subsequently, at the time t21, the signal CA0 and the signal CA1 indicating the fourth bodies are input.

At the time t21, when the input of the address ADD is completed, the sequencer 107 turns the ready/busy signal bRB to the "L" level, and starts the read operation of the status information STS (for example, the count value CNT) to the logic control circuit 103 from a target address of the status register 106. In a period tFEAT during which the ready/busy signal bRB is turned to the "L" level, the read operation is executed, and the read status information STS is stored in an unillustrated register of the logic control circuit 103. When the read operation is completed, the sequencer 107 turns the ready/busy signal bRB to the "H" level.

When the ready/busy signal bRB at the "H" level is received, the memory controller 20 transmits the header set which instructs the output (DOUT) of the status information STS to the memory chip 11.

More specifically, first, at a time t22, as the first headers, for example, the signal CA0 indicating "0" and the signal CA1 indicating "0" are input.

Next, at a time t23, as the second headers, for example, the signal CA0 indicating "0" and the signal CA1 indicating "0" are input. For example, the header set of "0", "0", "0", and "O" is a header set which instructs the output of the status information STS from the logic control circuit 103.

After the lapse of predetermined standby time (period tW2R) after the header set is input, the memory controller 20 transmits the signal CA_CLK to the memory chip 11 and specifies timing of outputting the status information STS. More specifically, at a time t24, the memory controller 20 transmits the signal CA_CLK at the "H" level to the memory chip 11. In addition, at a time t25, the memory controller 20 transmits the signal CA_CLK at the "L" level to the memory chip 11. After the time t25, the memory controller 20 repeats the toggle (switching between the "L" level and the "H" level) of the signal CA_CLK. For example, an interval of the toggle of the signal CA_CLK (an interval of rising and falling of the signal CA_CLK) in the output operation of the status information STS is defined as a period tCLK2. The period tCLK2 may be shorter than the period tCLK1.

Based on the signal CA_CLK, the output operation of the status information STS is executed. The logic control circuit 103 outputs the signal CA1 as the status information STS. In addition, the logic control circuit 103 outputs the signal CA0 as the strobe signal of the signal CA1. The logic control circuit 103 generates the signal CA0 based on the signal CA_CLK. Thus, the interval of the toggle of the signal CA0 is the period tCLK2 similarly to the signal CA_CLK.

The status information STS is output as the signal CA1 at the timing according to the rising and falling of the signal CA0. Thus, the body set of 8 bits of the signal CA1 corresponds to data output of 8 bits of the status information STS. Note that the signal CA1 is output according to the rising or falling edge of the signal CA0. Thus, even when "0" is successively output or when "1" is successively output as the signal CA1, it is possible to discriminate separation of the data.

At the time of the output operation of the status information STS, for example, as illustrated in FIG. 16, after the header set which instructs the output of the data is input once, the plurality of body sets configuring the status information STS may be successively output. That is, the input of the header set may be omitted until the output of the status information STS is ended.

1.4.4 Command Sequence of Counting Operation

Figure 17:
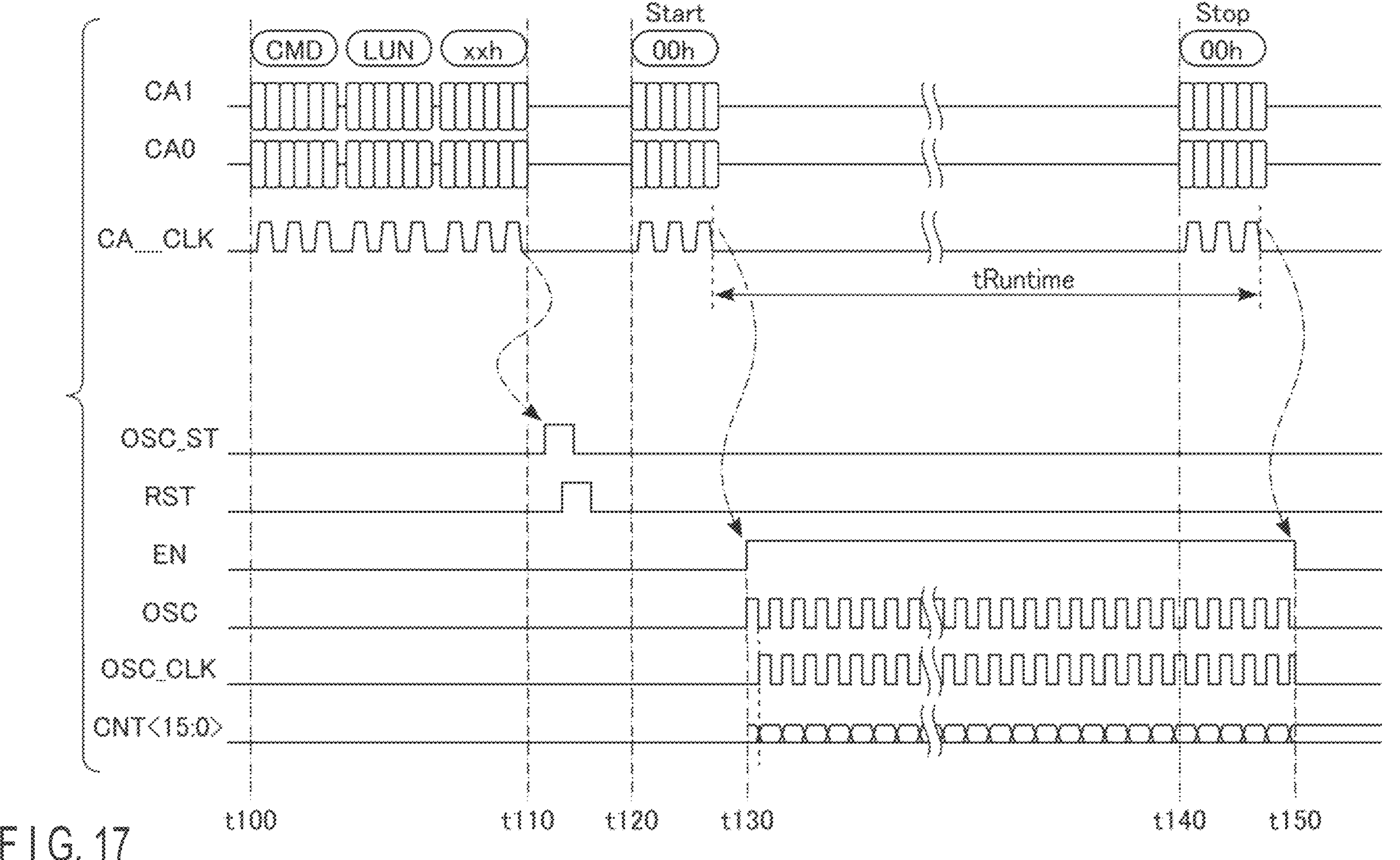
FIG. 17 is a diagram illustrating an example of a command sequence of the counting operation when the first mode is selected in the semiconductor device according to the modification of the first embodiment.

Next, with reference to FIG. 17, an example of a command sequence of the counting operation will be explained. FIG. 17 is a diagram illustrating an example of the command sequence of the counting operation in the first mode. In the example in FIG. 17, the signal DQ, the signals DQS and bDQS, the signal CA_bCE, the read enable signals RE and bRE, and the ready/busy signal bRB are omitted.

As illustrated in FIG. 17, in the present modification, corresponding to the first mode, the signal CA0, the signal CAL and the signal CA_CLK are transmitted from the memory controller 20 to the memory chip 11. Note that the internal signals (the signal OSC_ST, the reset signal RST, the enable signal EN, the signal OSC, the signal OSC_CLK, and the count values CNT<15:0>) generated in the memory chip 11 are similar to those in FIG. 10 of the first embodiment.

More specifically, in the period of the times t100-*t*110, first, the memory controller 20 transmits the frame corresponding to the command "CMD" as the signal CA0 and the signal CA1 to the memory chip 11. The memory chip 11 fetches the signal CA0 and the signal CA1 according to the rising edge and the falling edge of the signal CA_CLK.

Next, the memory controller 20 transmits the frame corresponding to the address "LUN" as the signal CA0 and the signal CA1 to the memory chip 11. The memory chip 11 fetches the signal CA0 and the signal CA1 according to the rising edge and the falling edge of the signal CA_CLK.

Then, the memory controller 20 transmits the frame corresponding to the address "xxh" as the signal CA0 and the signal CA1 to the memory chip 11. The memory chip 11 fetches the signal CA0 and the signal CA1 according to the rising edge and the falling edge of the signal CA_CLK. Note that the "xxh" may be a command.

When the address "xxh" is received, the sequencer 107 transmits the signal OSC_ST at the "H" level to the replica circuit 102 in the period of the times t110-*t*120. After transmitting the signal OSC_ST of 1 pulse, the sequencer 107 turns the signal OSC_ST to the "L" level.

Subsequently, the sequencer 107 transmits the reset signal RST at the "H" level to the replica circuit 102. When the reset signal RST at the "H" level is received, each flip-flop 213 of the counter 202 is reset. After transmitting the reset signal RST of 1 pulse, the sequencer 107 turns the reset signal RST to the "L" level.

Next, at the time t120, the memory controller 20 transmits the frame corresponding to the address "00h" as the signal CA0 and the signal CA1 to the memory chip 11. The memory chip 11 fetches the signal CA0 and the signal CA1 according to the rising edge and the falling edge of the signal CA_CLK. Note that the "00h" may be a command.

When the address "00h" is received, the sequencer 107 transmits the enable signal EN at the "H" level to the replica circuit 102 at the time t130. When the enable signal EN at the "H" level is received, the oscillator 201 starts the oscillation (output) of the signal OSC. In the counter 202, in the period of the times t130-*t*150, that is, while the enable signal EN is at the "H" level, the signal OSC_CLK for which the signal OSC is inverted is output from the AND circuit 212. The counter 202 counts up according to the rising edge of the signal OSC_CLK. That is, the counter 202 counts up according to the falling edge of the signal OSC. The counter 202 outputs a value for which +1 is added to a count-up result as the count values CNT<15:0>.

Next, after the counting execution time tRuntime elapses after transmitting the address "00h" which instructs the start of the counting operation, at the time t140, the memory controller 20 transmits the frame corresponding to the address "00h" as the signal CA0 and the signal CA1 to the memory chip 11. The memory chip 11 fetches the signal CA0 and the signal CA1 according to the rising edge and the falling edge of the signal CA_CLK. Note that the "00h" may be a command. In addition, the address which instructs the start of the counting operation and the address which instructs the end of the counting operation may be different.

When the address "00h" is received, the sequencer 107 turns the enable signal EN to the "L" level at the time t150. When the enable signal EN at the "L" level is received, the oscillator 201 ends the oscillation of the signal OSC. In the counter 202, when the enable signal EN is turned to the "L" level, the signal OSC_CLK at the "L" level is output from the AND circuit 212. That is, the counter 202 ends the counting operation.

1.4.5 Effect According to Modification of First Embodiment

In the configuration according to the present modification, the effect similar to that of the first embodiment can be obtained.

Further, in the configuration according to the present modification, when the command and the address are input to the memory chip 11, an SCA protocol can be applied. In the SCA protocol, the signal DQ, the signals DQS and bDQS, and the read enable signals RE and bRE are not used for the input of the command and the address. Therefore, the input of the command and the address and the input/output of the data can be executed in parallel. That is, the execution of the counting operation and the input/output operation of the data can be executed in parallel. Thus, in the memory chip 11, decline of the throughput due to the counting operation can be suppressed.

2. Second Embodiment

Next, a second embodiment will be explained. In the second embodiment, the counter 202 different from that of the first embodiment will be explained. Hereinafter, points different from the first embodiment will be mainly explained.

2.1 Configuration of Counter

Figure 18:
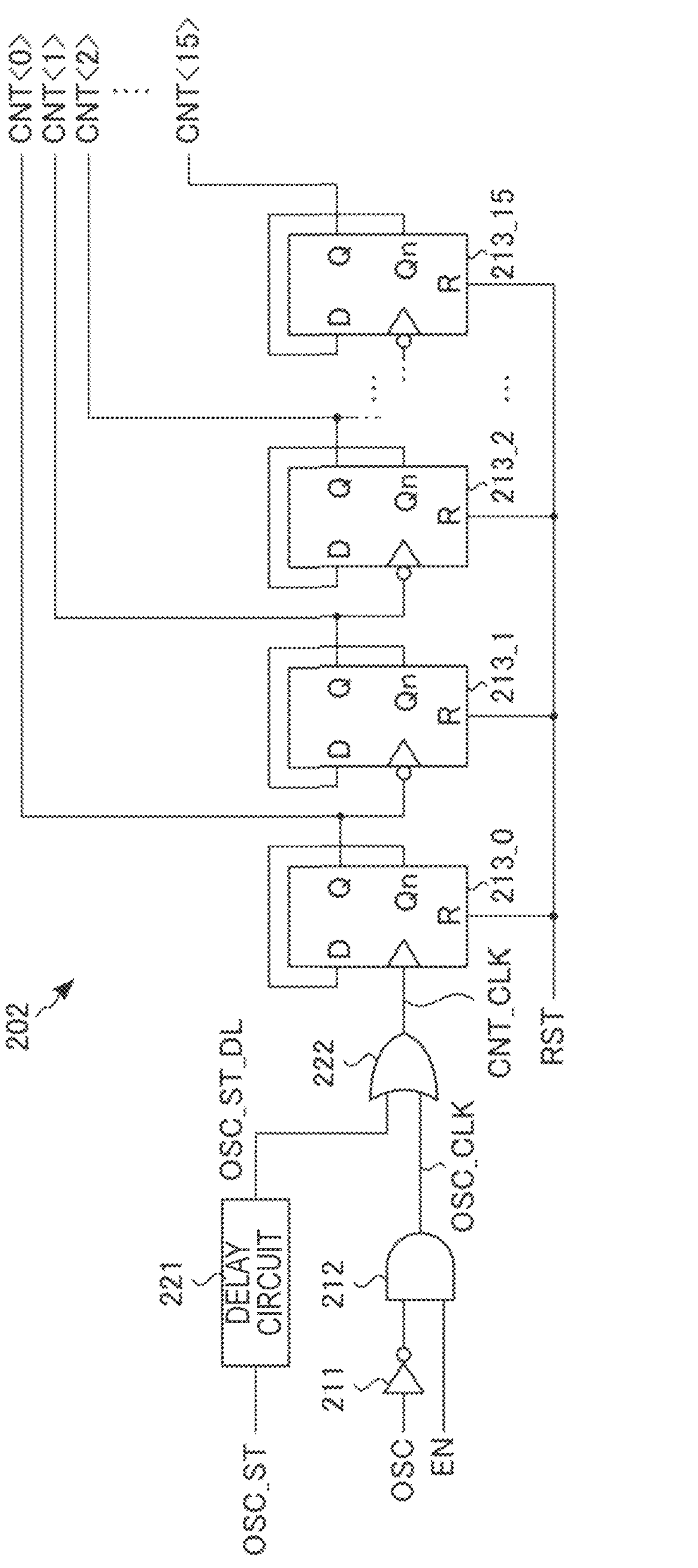
FIG. 18 is a circuit diagram illustrating an example of a configuration of a counter included in a semiconductor device according to a second embodiment.

First, with reference to FIG. 18, an example of a configuration of the counter 202 will be explained. FIG. 18 is a circuit diagram illustrating an example of the configuration of the counter 202.

As illustrated in FIG. 18, the counter 202 of the present embodiment counts up the cycle number based on the rising of the signal OSC_ST and the falling edge of the signal OSC. Then, the counter 202 outputs a count-up result as the count values CNT<15:0>.

The counter 202 includes the inverter 211, the AND circuit 212, the plurality of flip-flops 213, a delay circuit 221, and an OR circuit 222. For example, the counter 202 includes the flip-flops 213_0-213_15 corresponding respectively to the count values CNT<0>-CNT<15>, similarly to the first embodiment.

The configuration of the inverter 211 and the AND circuit 212 is similar to the configuration of the counter 202 explained using FIG. 8 of the first embodiment. The output terminal of the AND circuit 212 is connected to a first input terminal of the OR circuit 222.

The delay circuit 221 is a circuit which delays the signal OSC_ST. To an input terminal of the delay circuit 221, the signal OSC_ST is input. An output terminal of the delay circuit 221 is connected to a second input terminal of the OR circuit 222. The delay circuit 221 outputs a signal OSC_ST_DL for which the signal OSC_ST is delayed.

An output terminal of the OR circuit 222 is connected to the clock signal input terminal of the flip-flop 213_0. The OR circuit 222 outputs a result of an OR operation of the signal OSC_CLK and the signal OSC_ST_DL as a signal CNT_CLK. The signal CNT_CLK is turned to the "H" level when at least one of the signal OSC_CLK and the signal OSC_ST_DL is at the "H" level.

The flip-flop 213 includes the clock signal input terminal, the data input terminal D, the reset signal input terminal R, the output terminal Q, and the inverted output terminal Qn.

The configuration of the flip-flop 213 is similar to that in FIG. 8 of the first embodiment. To the clock signal input terminal of the flip-flop 213_0, the signal CNT_CLK is input.

In the present embodiment, signals output from the output terminals Q of the flip-flops 213_0-213_15 are output as the count values CNT<0>-CNT<15> of 16 bits.

As explained above, also in the counter 202 of the present embodiment, the count value CNT counted up at the timing similar to that in the first embodiment is output.

2.2 Command Sequence of Counting Operation

Figure 19:
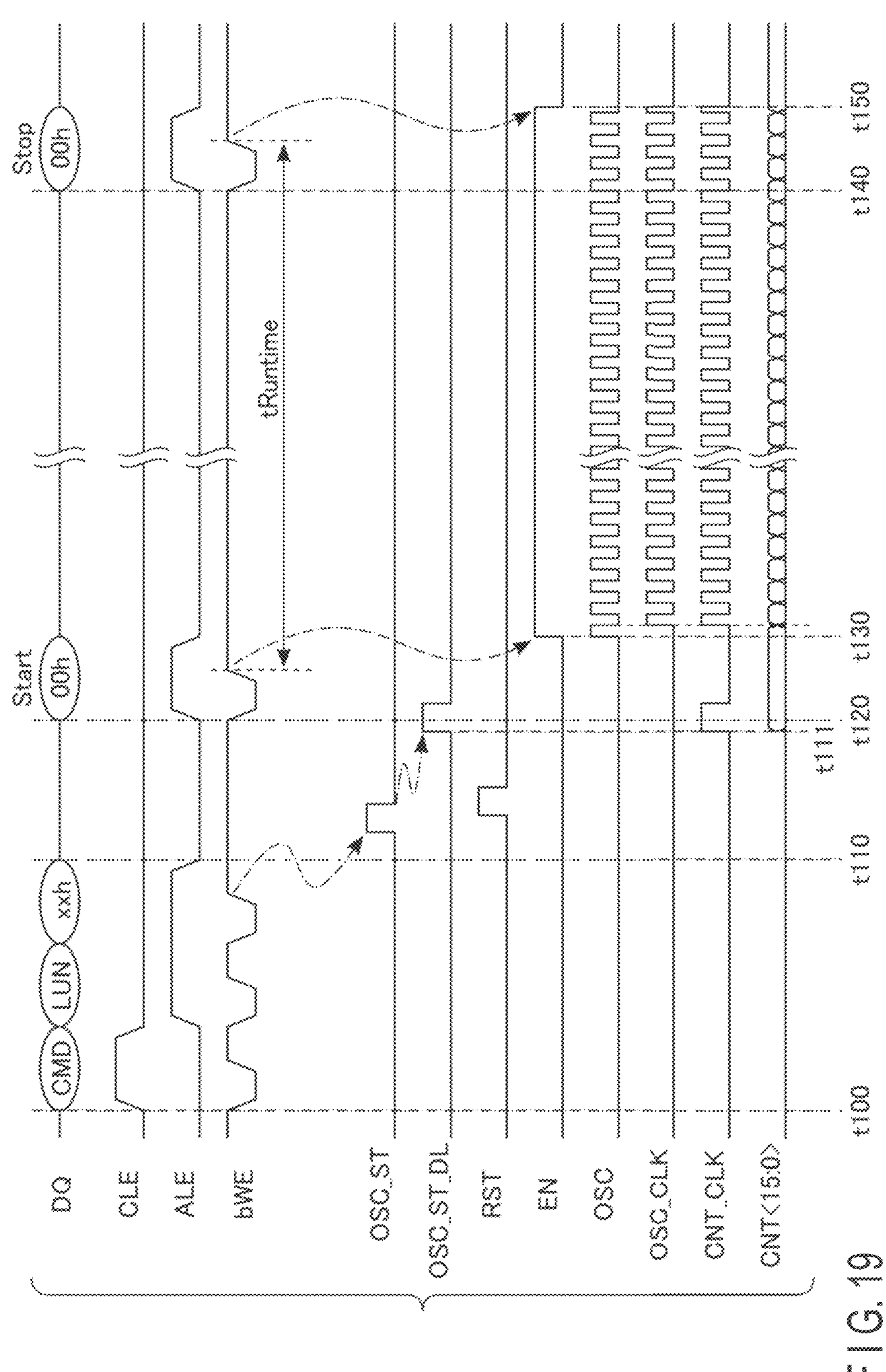
FIG. 19 is a diagram illustrating an example of a command sequence of a counting operation in the semiconductor device according to the second embodiment.

Next, with reference to FIG. 19, an example of a command sequence of the counting operation will be explained. FIG. 19 is a diagram illustrating an example of the command sequence of the counting operation. Note that in the example in FIG. 19, the signals DQS and bDQS, the chip enable signal bCE, the read enable signals RE and bRE, and the ready/busy signal bRB are omitted.

As illustrated in FIG. 19, in the period of the times t100-*t*110, the memory controller 20 successively transmits the command "CMD", the address "LUN", and the address "xxh" to the memory chip 11 similarly to the explanation using FIG. 10 of the first embodiment.

When the address "xxh" is received, the sequencer 107 transmits the signal OSC_ST at the "H" level to the replica circuit 102 in the period of the times t110-*t*120. After transmitting the signal OSC_ST of 1 pulse, the sequencer 107 turns the signal OSC_ST to the "L" level.

Subsequently, the sequencer 107 transmits the reset signal RST at the "H" level to the replica circuit 102. When the reset signal RST at the "H" level is received, each flip-flop 213 of the counter 202 is reset. After transmitting the reset signal RST of 1 pulse, the sequencer 107 turns the reset signal RST to the "L" level.

At the time t111, in the counter 202, the reset signal RST at the "H" level is received, the flip-flops 213 are reset, and then the signal OSC_ST_DL for which the signal OSC_ST is delayed rises to the "H" level. Thus, the signal CNT_CLK rises to the "H" level. The counter 202 counts up at the rising edge of the signal CNT_CLK. Thus, before the oscillator 201 starts the oscillation of the signal OSC, the counter 202 counts up the count value CNT by +1 corresponding to 1 pulse of the signal OSC_ST. That is, the count value CNT is turned to "1".

Next, at the time t120, the memory controller 20 transmits the address "00h" which instructs the start of the counting operation to the memory chip 11, similarly to the explanation using FIG. 10 of the first embodiment.

When the address "00h" is received, the sequencer 107 transmits the enable signal EN at the "H" level to the replica circuit 102 at the time t130. When the enable signal EN at the "H" level is received, the oscillator 201 starts the oscillation of the signal OSC. In the counter 202, in the period of the times t130-*t*150, that is, while the enable signal EN is at the "H" level, the signal OSC_CLK for which the signal OSC is inverted is output from the AND circuit 212. Then, from the OR circuit 222, the signal CNT_CLK synchronized with the signal OSC_CLK is output. The counter 202 counts up according to the rising edge of the signal CNT_CLK. That is, the counter 202 counts up according to the falling edge of the signal OSC. At the time, the counter 202 counts up from the state where the count value CNT is "1".

Next, similarly to the explanation using FIG. 10 of the first embodiment, after the counting execution time tRuntime elapses after transmitting the address "00h" which instructs the start of the counting operation, at the time t140, the memory controller 20 transmits the address "00h" again to the memory chip 11.

When the address "00h" is received, the sequencer 107 turns the enable signal EN to the "L" level at the time t150. When the enable signal EN at the "L" level is received, the oscillator 201 ends the oscillation of the signal OSC. The counter 202 ends the counting operation.

2.3 Flow of Counting Operation

Figure 20:
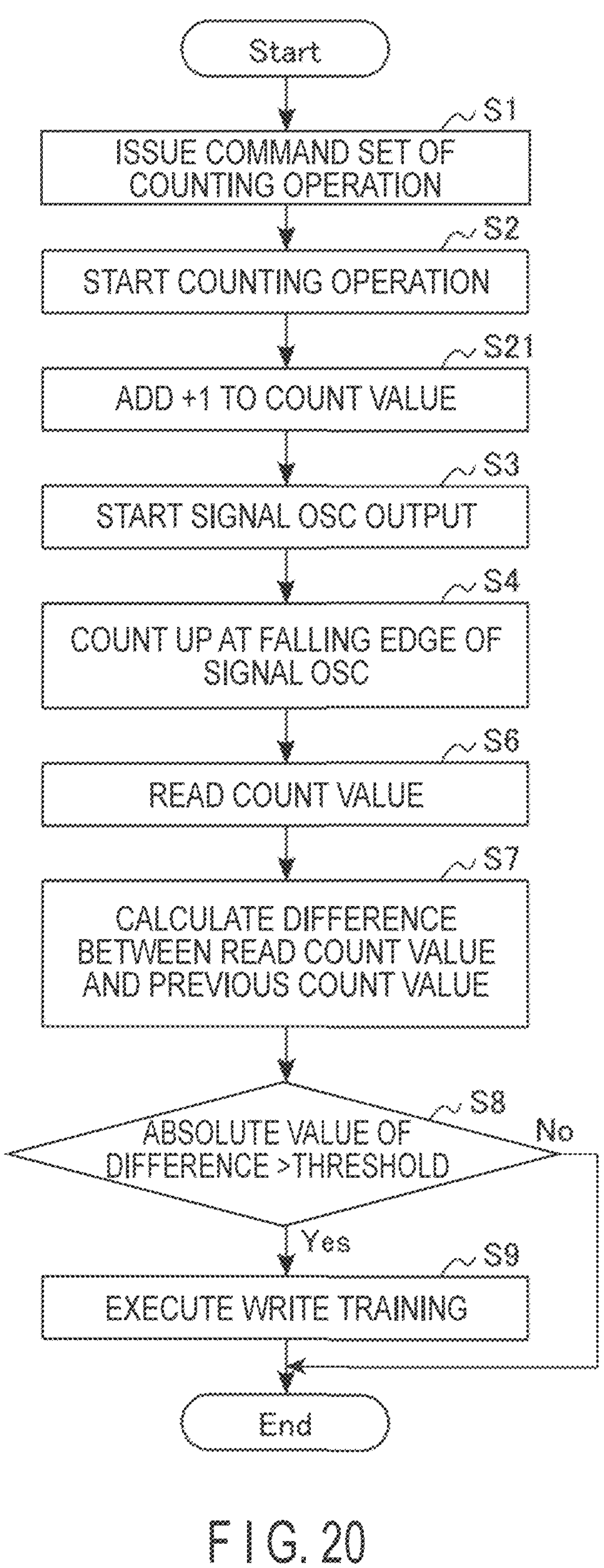
FIG. 20 is a flowchart illustrating an example of flow of the counting operation in the semiconductor device according to the second embodiment.

Next, with reference to FIG. 20, an example of flow of the counting operation will be explained. FIG. 20 is a flowchart illustrating an example of the flow of the counting operation.

As illustrated in FIG. 20, first, steps S1 and S2 are executed. The operations of steps S1 and S2 are similar to the explanation in FIG. 13 of the first embodiment.

The counter 202 counts up the count value CNT to 1 corresponding to the signal of 1 pulse of the signal OSC_ST (S21). More specifically, at the time t111 explained using FIG. 19, the signal OSC_ST_DL for which the signal OSC_ST is delayed rises to the "H" level. Thus, the signal CNT_CLK rises to the "H" level. The counter 202 counts up the count value to 1 at the rising edge of the signal CNT_CLK.

Next, steps S3 and S4 are executed. The operations of steps S3 and S4 are similar to the explanation in FIG. 13 of the first embodiment.

Then, steps S6-S9 are executed. The operations of steps S6-S9 are similar to the explanation in FIG. 13 of the first embodiment.

2.4 Effect According to Present Embodiment

In the configuration according to the present embodiment, the effect similar to that of the first embodiment can be obtained.

Note that the modification of the first embodiment can be applied to the present embodiment.

3. Third Embodiment

Next, a third embodiment will be explained. In the third embodiment, the counter 202 different from that of the first and second embodiments will be explained. Hereinafter, points different from the first and second embodiments will be mainly explained.

3.1 Configuration of Counter

Figure 21:
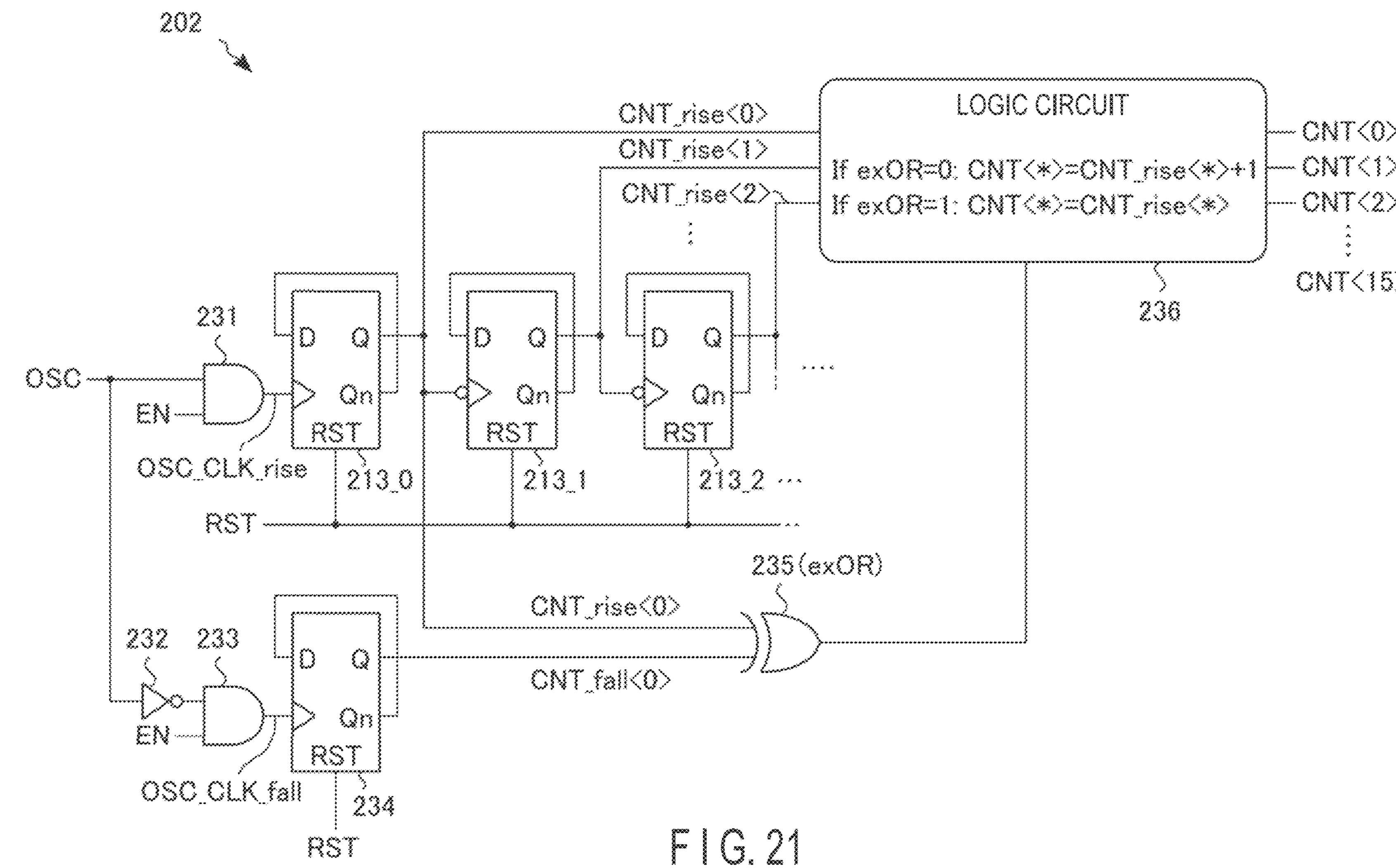
FIG. 21 is a circuit diagram illustrating an example of a configuration of a counter included in a semiconductor device according to a third embodiment.

First, with reference to FIG. 21, an example of a configuration of the counter 202 will be explained. FIG. 21 is a circuit diagram illustrating an example of the configuration of the counter 202.

As illustrated in FIG. 21, the counter 202 of the present embodiment counts up the cycle number based on the rising edge of the signal OSC. Then, based on a result of an exclusive OR (exOR) operation of the data of 1 bit corresponding to the rising edge of the signal OSC and the data of 1 bit corresponding to the falling edge of the signal OSC, the counter 202 outputs a result of adding 0 or +1 to the cycle number as the count values CNT<15:0>.

The counter 202 includes the plurality of flip-flops 213, an AND circuit 231, an inverter 232, an AND circuit 233, a flip-flop 234, an exOR circuit 235, and a logic circuit 236. For example, the counter 202 includes the flip-flops 213_0-213_15 corresponding respectively to the count values CNT<0>-CNT<15>, similarly to the first embodiment.

The signal OSC is input to a first input terminal of the AND circuit 231. The first input terminal of the AND circuit 231 is connected to the oscillator 201. To a second input terminal of the AND circuit 231, the enable signal EN is input. An output terminal of the AND circuit 231 is connected to the clock signal input terminal of the flip-flop 213_0. The AND circuit 231 outputs a result of the AND operation of the signal OSC and the enable signal EN as a signal OSC_CLK_rise. The signal OSC_CLK_rise is a clock signal synchronized with the signal OSC, when the enable signal EN is at the "H" level.

The flip-flop 213 includes the clock signal input terminal, the data input terminal D, the reset signal input terminal R, the output terminal Q, and the inverted output terminal Qn.

The configuration of the flip-flop 213 is similar to that in FIG. 8 of the first embodiment. To the clock signal input terminal of the flip-flop 213_0, the signal OSC_CLK_rise is input. The flip-flop 213_0 fetches the data at the rising edge of the signal OSC_CLK_rise, that is, the signal OSC. Thus, the flip-flops 213_0-213_15 count up at the rising edge of the signal OSC.

For example, the signal output from the output terminal Q of the flip-flop 213 is described as a signal CNT_rise. Signals CNT_rise<0>-CNT_rise<15> are output respectively from the output terminals Q of the flip-flops 213_0-213_15.

The inverter 232 inverts and outputs the signal OSC. An input terminal of the inverter 232 is connected to the oscillator 201. To the input terminal of the inverter 232, the signal OSC is input. An output terminal of the inverter 232 is connected to a first input terminal of the AND circuit 233.

To a second input terminal of the AND circuit 233, the enable signal EN is input. An output terminal of the AND circuit 233 is connected to a clock signal input terminal of the flip-flop 234. The AND circuit 233 outputs a result of the AND operation of the inverted signal of the signal OSC and the enable signal EN as a signal OSC_CLK_fall. The signal OSC_CLK_fall is a clock signal for which the signal OSC is inverted, when the enable signal EN is at the "H" level. For example, when the enable signal EN is at the "H" level and the inverted signal of the signal OSC is at the "H" level (that is, the signal OSC is at the "L" level), the signal OSC_CLK_fall is at the "H" level.

The flip-flop 234 includes the clock signal input terminal, the data input terminal D, the reset signal input terminal R, the output terminal Q, and the inverted output terminal Qn. The configuration of the flip-flop 234 is similar to that of the flip-flop 213. To the clock signal input terminal of the flip-flop 234, the signal OSC_CLK_fall is input. The flip-flop 234 fetches the data at the rising edge of the signal OSC_CLK_fall, that is, the falling edge of the signal OSC. The data input terminal D of the flip-flop 234 is connected to the inverted output terminal Qn of the flip-flop 234. Thus, the flip-flop 234 inverts the signals output from the output terminal Q and the inverted output terminal Qn at the rising edge of the signal OSC_CLK_fall input to the clock signal input terminal. To the reset signal input terminal R of the flip-flop 234, the reset signal RST is input.

For example, the signal output from the output terminal Q of the flip-flop 234 is described as a signal CNT_fall<0>.

A first input terminal of the exOR circuit 235 is connected to the output terminal Q of the flip-flop 213_0. To the first input terminal of the exOR circuit 235, a signal CNT_rise<0> is input. A second input terminal of the exOR circuit 235 is connected to the output terminal Q of the flip-flop 234. To the second input terminal of the exOR circuit 235, the signal CNT_fall<0> is input. The exOR circuit 235 outputs a result of an exclusive OR (exOR) operation of the signal CNT_rise<0> and the signal CNT_fall<0>. For example, when the signal CNT_rise<0> and the signal CNT_fall<0> are both at the "H" level ("1") or at the "L" level ("0"), the output signal of the exOR circuit 235 is turned to the "L" level (exOR=0). In addition, when either one of the signal CNT_rise<0> and the signal CNT_fall<0> is at the "H" level ("1"), the output signal of the exOR circuit 235 is turned to the "H" level (exOR=1).

The logic circuit 236 is connected to the output terminal Q of each flip-flop 213 and an output terminal of the exOR circuit 235. To the logic circuit 236, the signals CNT_rise<0>-CNT_rise<15> and the output signal of the exOR circuit 235. Based on the output signal of the exOR circuit 235, the logic circuit 236 outputs a result of adding 0 or +1 to the data of 16 bits expressed by the signals CNT_rise<0>-CNT_rise<15> as the count values CNT<0>-CNT<15> of 16 bits. More specifically, when it is exOR=0, the logic circuit 236 outputs the result of adding +1 to the data of 16 bits expressed by the signals CNT_rise<0>-CNT_rise<15> as the count values CNT<0>-CNT<15>. On the other hand, when it is exOR=1, the logic circuit 236 outputs the data of 16 bits expressed by the signals CNT_rise<0>-CNT_rise<15> as the count values CNT<0>-CNT<15>.

3.2 Specific Example of Count Value

Figure 22:
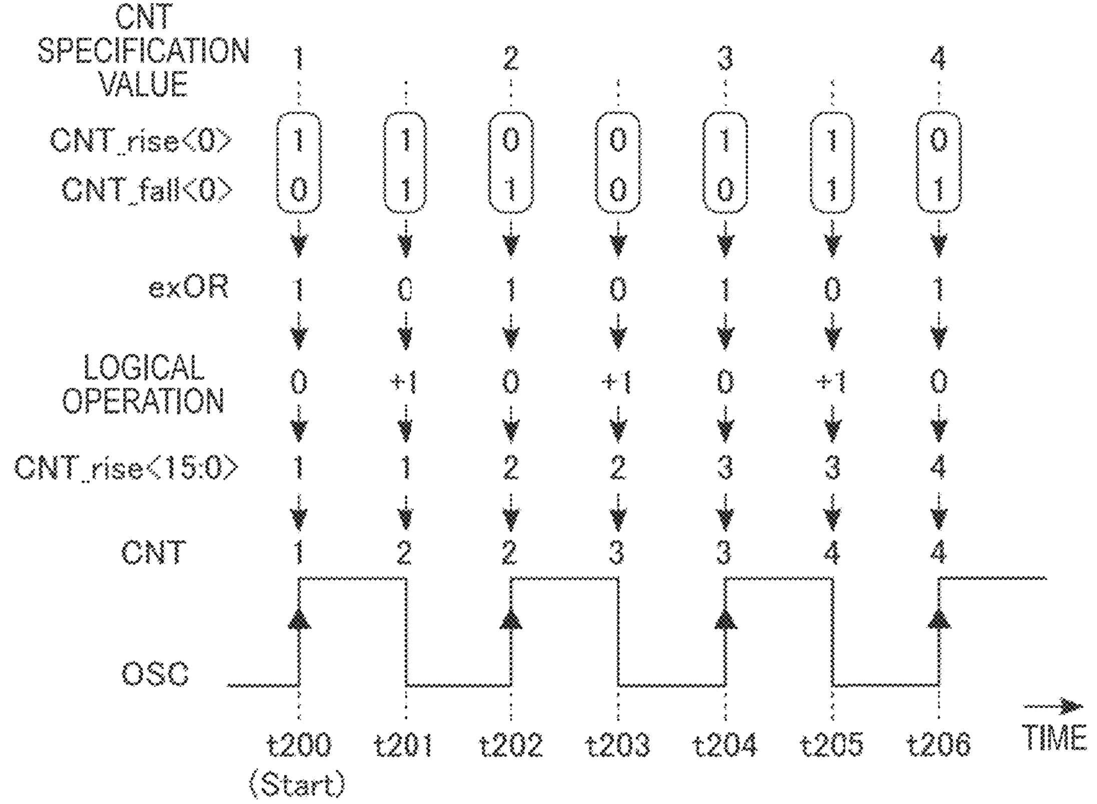
FIG. 22 is a diagram illustrating a specific example of each signal in the counter included in the semiconductor device according to the third embodiment.

Next, with reference to FIG. 22, a specific example of the count value CNT will be explained. FIG. 22 is a diagram illustrating the specific example of each signal in the counter 202. Note that in the example in FIG. 22, in order to simplify the explanation, the CNT specification value, the signals CNT_rise<15:0>, and the count value CNT are described by decimal numbers.

As illustrated in FIG. 22, at a time t200, when the oscillator 201 starts the oscillation of the signal OSC, the CNT specification value is counted up to "1" at the rising edge of the signal OSC. The signal CNT_rise<0> is inverted to the "H" level at the rising edge of the signal OSC, and "1" is output. Since the signal CNT_fall<0> is "0" ("L" level), the exOR circuit 235 outputs "1" ("H" level). Thus, the logic circuit 236 does not perform addition to the signals CNT_rise<15:0>. Since the signals CNT_rise<15:0> are "1", the counter 202 outputs "1" as the count value CNT.

Next, at a time t201, the signal CNT_fall<0> is inverted to the "H" level at the falling edge of the signal OSC, and "1" is output. Since the signal CNT_rise<0> and the signal CNT_fall<0> are both "1", the exOR circuit 235 outputs "0". Thus, the logic circuit 236 adds +1 to the signals CNT_rise<15:0>. As a result, the counter 202 outputs "2" as the count value CNT.

Then, at a time t202, the CNT specification value is counted up to "2". The signal CNT_rise<0> is inverted to the "L" level at the rising edge of the signal OSC, and "0" is output. Since the signal CNT_fall<0> is "1", the exOR circuit 235 outputs "1". Thus, the logic circuit 236 does not perform addition to the signals CNT_rise<15:0>. Since the signals CNT_rise<15:0> are "2", the counter 202 continuously outputs "2" as the count value CNT.

Subsequently, at a time t203, the signal CNT_fall<0> is inverted to the "L" level and "0" is output. Since the signal CNT_rise<0> and the signal CNT_fall<0> are both "0", the exOR circuit 235 outputs "0". Thus, the logic circuit 236 adds +1 to the signals CNT_rise<15:0>. As a result, the counter 202 outputs "3" as the count value CNT.

Next, at a time t204, the CNT specification value is counted up to "3". The signal CNT_rise<0> is inverted to the "L" level at the rising edge of the signal OSC, and "0" is output. Since the signal CNT_fall<0> is "1", the exOR circuit 235 outputs "1". Thus, the logic circuit 236 does not perform addition to the signals CNT_rise<15:0>. Since the signals CNT_rise<15:0> are "3", the counter 202 continuously outputs "3" as the count value CNT.

Then, at a time t205, the signal CNT_fall<0> is inverted to the "H" level and "1" is output. Since the signal CNT_rise<0> and the signal CNT_fall<0> are both "1", the exOR circuit 235 outputs "0". Thus, the logic circuit 236 adds +1 to the signals CNT_rise<15:0>. As a result, the counter 202 outputs "4" as the count value CNT.

Subsequently, at a time t206, the CNT specification value is counted up to "4". The signal CNT_rise<0> is inverted to the "H" level at the rising edge of the signal OSC, and "1" is output. Since the signal CNT_fall<0> is "0", the exOR circuit 235 outputs "1". Thus, the logic circuit 236 does not perform addition to the signals CNT_rise<15:0>. Since the signals CNT_rise<15:0> are "4", the counter 202 continuously outputs "4" as the count value CNT.

As explained above, also in the counter 202 of the present embodiment, the count value CNT counted up at the timing similar to that in the first embodiment is output.

3.3 Flow of Counting Operation

Next, with reference to FIG. 23, an example of the flow of the counting operation will be explained. FIG. 23 is a flowchart illustrating an example of the flow of the counting operation.

As illustrated in FIG. 23, first, steps S1-S3 are executed. The operations of steps S1-S3 are similar to the explanation in FIG. 13 of the first embodiment.

As explained using FIG. 22, the counter 202 counts up the cycle number of the signal OSC (OSC_CLK_rise) at the rising edge of the signal OSC (OSC_CLK_rise) (S31).

The exOR circuit 235 executes the exclusive OR (exOR) operation of the signal CNT_rise<0> and the signal CNT_fall<0>. When an operation result is 0 (exOR=0) (S32_Yes), the logic circuit 236 outputs the value for which +1 is added to the cycle number (S33) as the count value CNT.

On the other hand, when the operation result is 1 (exOR=1) (S32 No), the logic circuit 236 outputs the cycle number as the count value CNT.

Next, steps S6-S9 are executed. The operations of steps S6-S9 are similar to the explanation in FIG. 13 of the first embodiment.

3.4 Effect According to Present Embodiment

In the configuration according to the present embodiment, the effect similar to that of the first embodiment can be obtained.

Note that the modification of the first embodiment can be applied to the present embodiment.

4. Fourth Embodiment

Next, a fourth embodiment will be explained. In the fourth embodiment, the counter 202 different from that of the first-third embodiments will be explained. Hereinafter, points different from the first-third embodiments will be mainly explained.

4.1 Configuration of Counter

Figure 24:
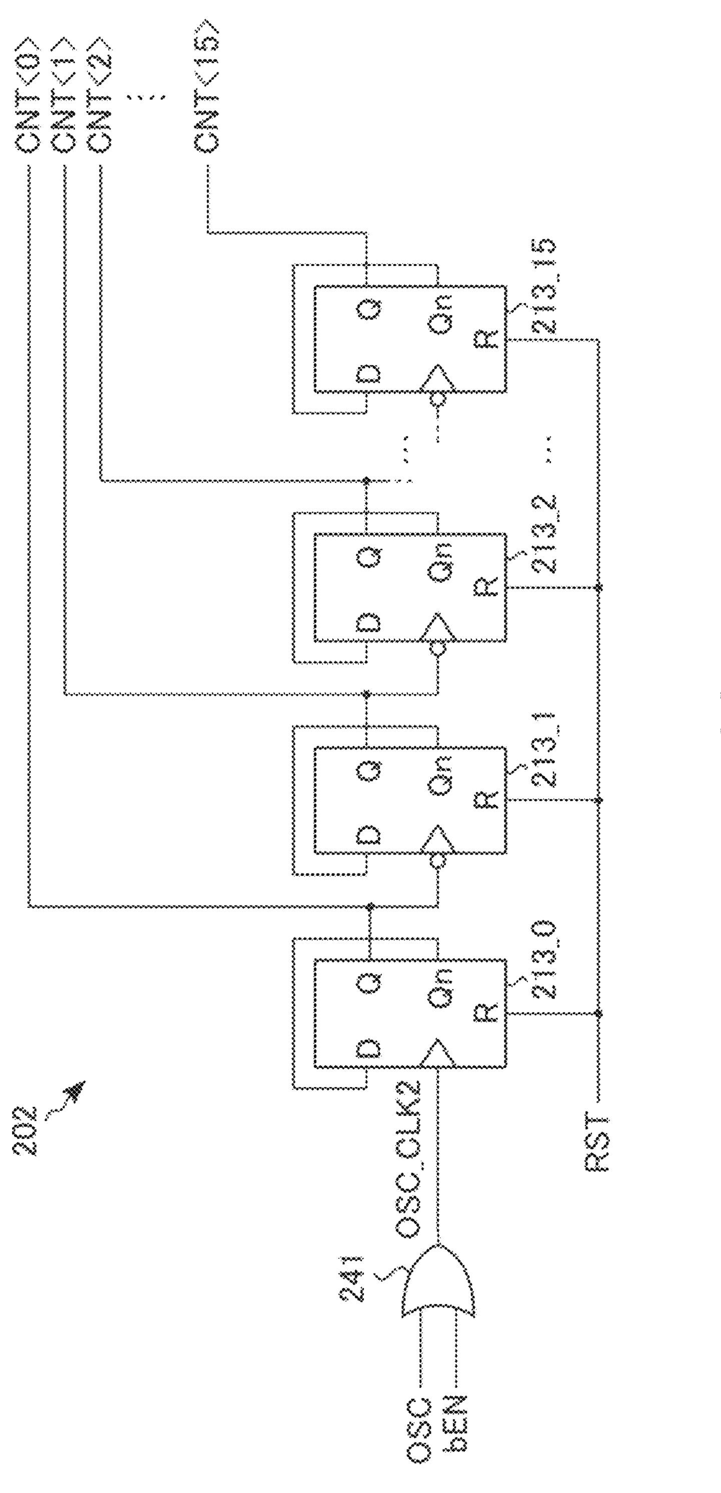
FIG. 24 is a circuit diagram illustrating an example of a configuration of a counter included in a semiconductor device according to a fourth embodiment.

First, with reference to FIG. 24, an example of a configuration of the counter 202 will be explained. FIG. 24 is a circuit diagram illustrating an example of the configuration of the counter 202.

As illustrated in FIG. 24, the counter 202 of the present embodiment counts up the cycle number based on the rising edge of the signal OSC (signal OSC_CLK2). Then, when the counting execution time tRuntime ends in the state where the signal OSC is at the "L" level, the counter 202 turns the signal OSC_CLK2 to the "H" level, and adds +1 to the cycle number. The counter 202 outputs the cycle number as the count values CNT<15:0>.

The counter 202 includes the plurality of flip-flops 213 and an OR circuit 241. For example, similarly to the first embodiment, the counter 202 includes the flip-flops 213_0-213_15 corresponding respectively to the count values CNT<0>-CNT<15>.

The signal OSC is input to a first input terminal of the OR circuit 241. The first input terminal of the AND circuit 231 is connected to the oscillator 201. To a second input terminal of the OR circuit 241, an enable signal bEN is input. The enable signal bEN is turned to the "H" level in the case of not executing the counting operation. While the enable signal bEN is at the "L" level, the counting operation is executed. That is, while the enable signal bEN is at the "L" level, the oscillator 201 oscillates the signal OSC. An output terminal of the OR circuit 241 is connected to the clock signal input terminal of the flip-flop 213_0. The OR circuit 241 outputs a result of the OR operation of the signal OSC and the enable signal bEN as the signal OSC_CLK2. Therefore, the signal OSC_CLK2 is turned to the "H" level when the enable signal bEN is at the "H" level. In addition, when the enable signal bEN is at the "L" level, the signal OSC_CLK2 is a clock signal synchronized with the signal OSC.

The flip-flop 213 includes the clock signal input terminal, the data input terminal D, the reset signal input terminal R, the output terminal Q, and the inverted output terminal Qn.

The configuration of the flip-flop 213 is similar to that in FIG. 8 of the first embodiment. To the clock signal input terminal of the flip-flop 213_0, the signal OSC_CLK2 is input. The flip-flop 213_0 fetches the data at the rising edge of the signal OSC_CLK2, that is, the signal OSC.

In the present embodiment, the signals output from the output terminals Q of the flip-flops 213_0-213_15 are output as the count values CNT<0>-CNT<15> of 16 bits.

4.2 Specific Example of Count Value

Figure 25:
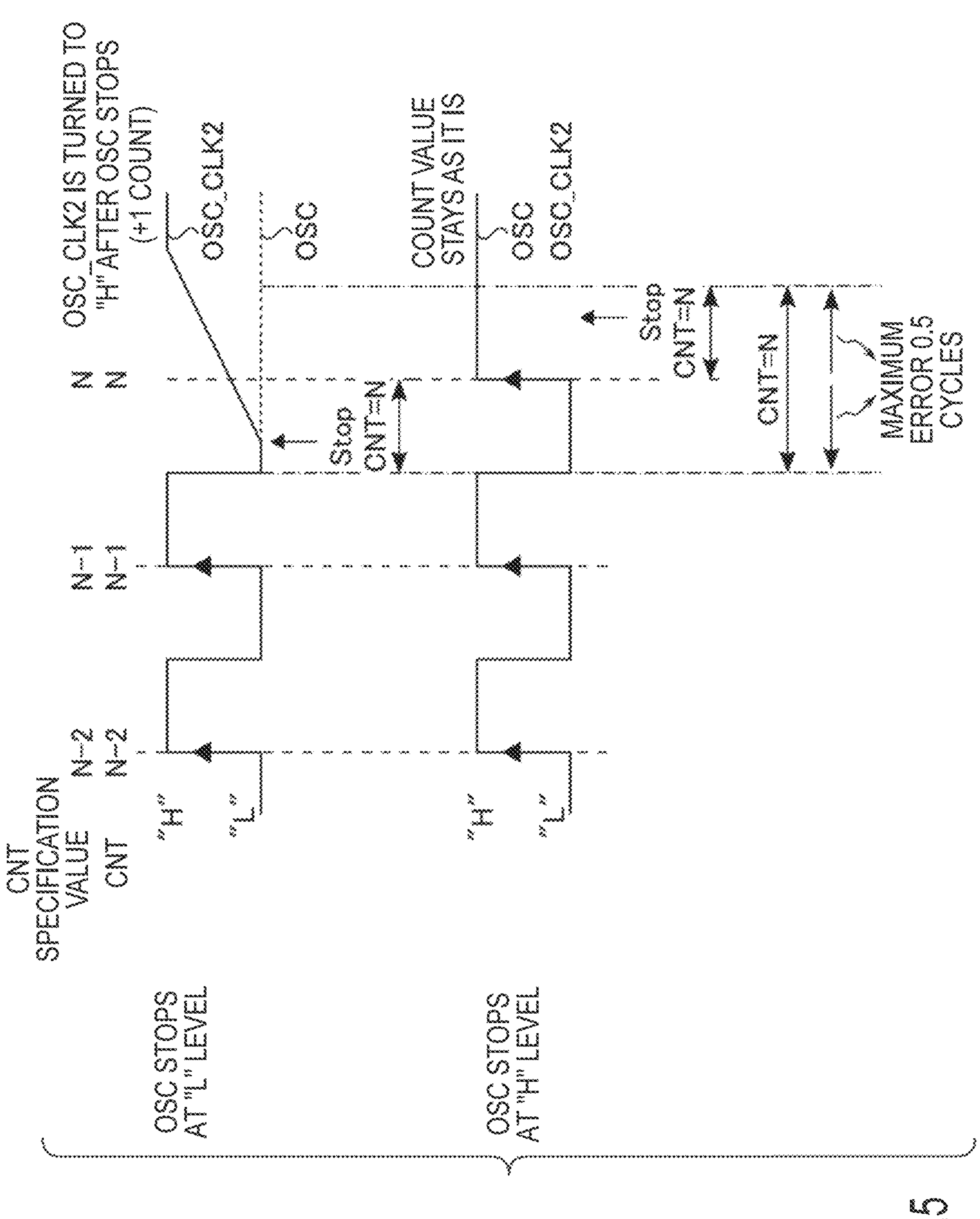
FIG. 25 is a diagram illustrating a specific example of a signal OSC, a signal OSC_CLK2, and a count value CNT in the counter included in the semiconductor device according to the fourth embodiment.

Next, with reference to FIG. 25, a specific example of the count value CNT will be explained. FIG. 25 is a diagram illustrating a specific example of the signal OSC, the signal OSC_CLK2, and the count value CNT in the counter 202. Note that in the example in FIG. 25, in order to simplify the explanation, the CNT specification value and the count value CNT are described by decimal numbers.

As illustrated in FIG. 25, the counter 202 counts up the cycle number at the rising edge of the signal OSC_CLK2 (that is, the signal OSC). When the enable signal bEN at the "H" level is input to the OR circuit 241 of the counter 202, the oscillator 201 ends the oscillation of the signal OSC. When the signal OSC is at the "L" level at an end position ("Stop" in FIG. 25) of the counting operation, the OR circuit 241 outputs the signal OSC_CLK2 at the "H" level since the enable signal bEN is at the "H" level. That is, the signal OSC_CLK2 rises to the "H" level. Thus, the counter 202 outputs the count value CNT for which +1 is added to the cycle number of the signal OSC. Thus, in the (N−1)-th cycle of the signal OSC, in the period of being at the "L" level, the count value CNT is turned to "N".

In addition, when the signal OSC is at the "H" level at the end position of the counting operation, the OR circuit 241 maintains the output of the signal OSC_CLK2 at the "H" level. Thus, the counter 202 outputs the count value CNT for which +1 is not added. Thus, in the N-th cycle of the signal OSC, in the period of being at the "H" level, the count value CNT is turned to "N".

Thus, the period during which the count value CNT is "N" is, similarly to the first embodiment, from the falling edge of the (N−1)-th cycle of the signal OSC to the falling edge of the N-th cycle. As a result, the granularity error at the end position of the signal OSC to the CNT specification value "N" is reduced to roughly 0.5 cycles of the signal OSC at maximum.

As explained above, also in the counter 202 of the present embodiment, the count value CNT counted up at the timing similar to that in the first embodiment is output.

4.3 Command Sequence of Counting Operation

Figure 26:
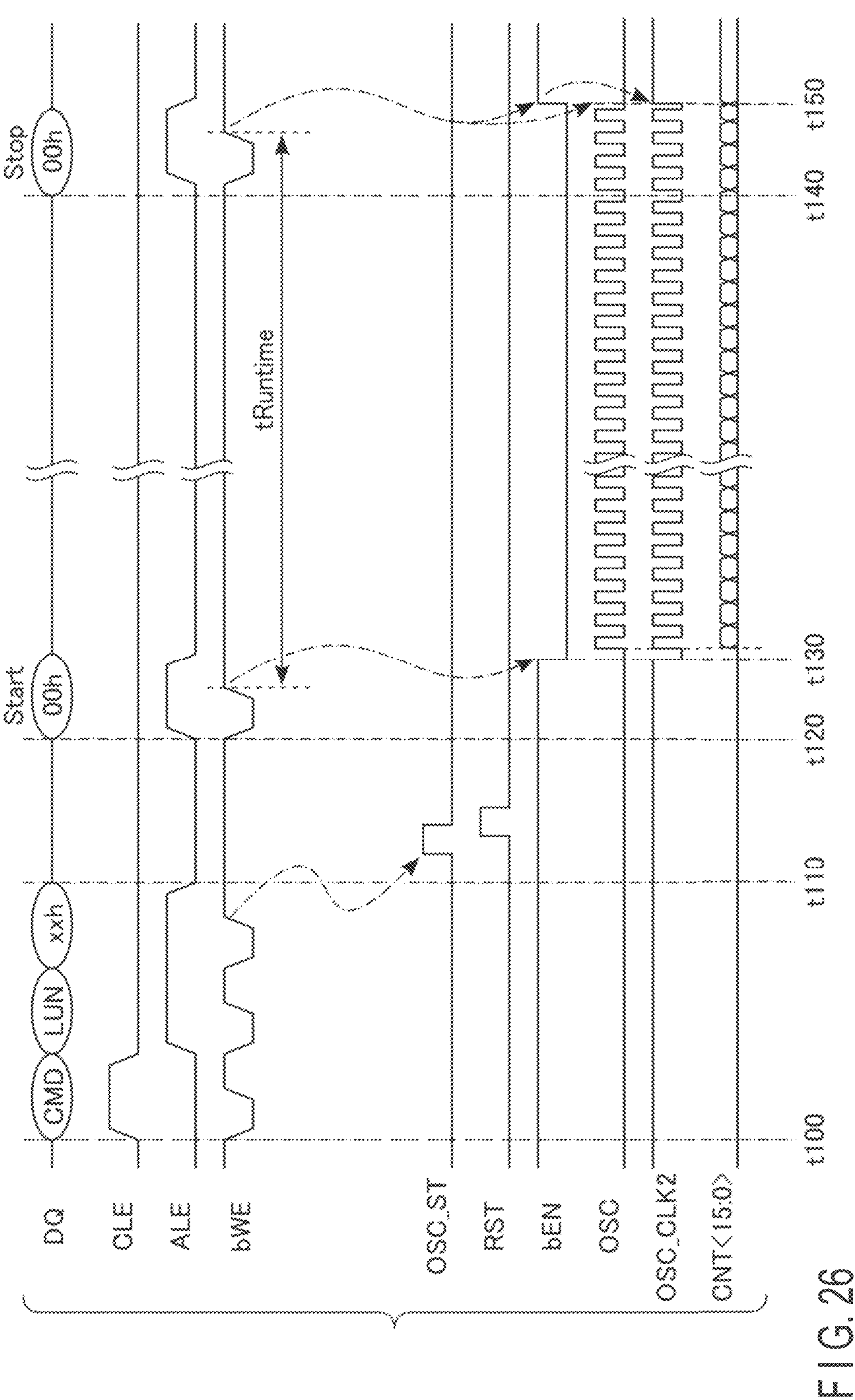
FIG. 26 is a diagram illustrating an example of a command sequence of a counting operation in the semiconductor device according to the fourth embodiment.

Next, with reference to FIG. 26, an example of a command sequence of the counting operation will be explained. FIG. 26 is a diagram illustrating an example of the command sequence of the counting operation. Note that in the example in FIG. 26, the signals DQS and bDQS, the chip enable signal bCE, the read enable signals RE and bRE, and the ready/busy signal bRB are omitted.

As illustrated in FIG. 26, in the period of the times t100-*t*110, the memory controller 20 successively transmits the command "CMD", the address "LUN", and the address "xxh" to the memory chip 11, similarly to the explanation using FIG. 10 of the first embodiment.

When the address "xxh" is received, the sequencer 107 transmits the signal OSC_ST at the "H" level to the replica circuit 102 in the period of the times t110-*t*120. After transmitting the signal OSC_ST of 1 pulse, the sequencer 107 turns the signal OSC_ST to the "L" level.

Subsequently, the sequencer 107 transmits the reset signal RST at the "H" level to the replica circuit 102. When the reset signal RST at the "H" level is received, each flip-flop 213 of the counter 202 is reset. After transmitting the reset signal RST of 1 pulse, the sequencer 107 turns the reset signal RST to the "L" level.

Next, at the time t120, the memory controller 20 transmits the address "00h" which instructs the start of the counting operation to the memory chip 11, similarly to the explanation using FIG. 10 of the first embodiment.

When the address "00h" is received, the sequencer 107 changes the enable signal bEN at the "H" level from the "H" level to the "L" level at the time t130. When the enable signal bEN at the "L" level is received, the oscillator 201 starts the oscillation of the signal OSC. In the counter 202, in the period of times t130-*t*150, that is, while the enable signal bEN is at the "L" level, the signal OSC_CLK2 synchronized with the signal OSC is output from the OR circuit 241. The counter 202 counts up according to the rising edge of the signal OSC_CLK2. That is, the counter 202 counts up according to the rising edge of the signal OSC.

Next, after the counting execution time tRuntime elapses after transmitting the address "00h" which instructs the start of the counting operation, at the time t140, the memory controller 20 transmits the address "00h" again to the memory chip 11, similarly to the explanation using FIG. 10 of the first embodiment.

When the address "00h" is received, the sequencer 107 turns the enable signal bEN to the "H" level at the time t150. When the enable signal bEN at the "H" level is received, the oscillator 201 ends the oscillation of the signal OSC. At the time, when the signal OSC is at the "L" level, the OR circuit 241 outputs the signal OSC_CLK2 at the "H" level based on the enable signal bEN at the "H" level. The counter 202 counts up the cycle number based on the signal OSC_CLK2 at the "H" level, and then ends the counting operation.

4.4 Flow of Counting Operation

Figure 27:
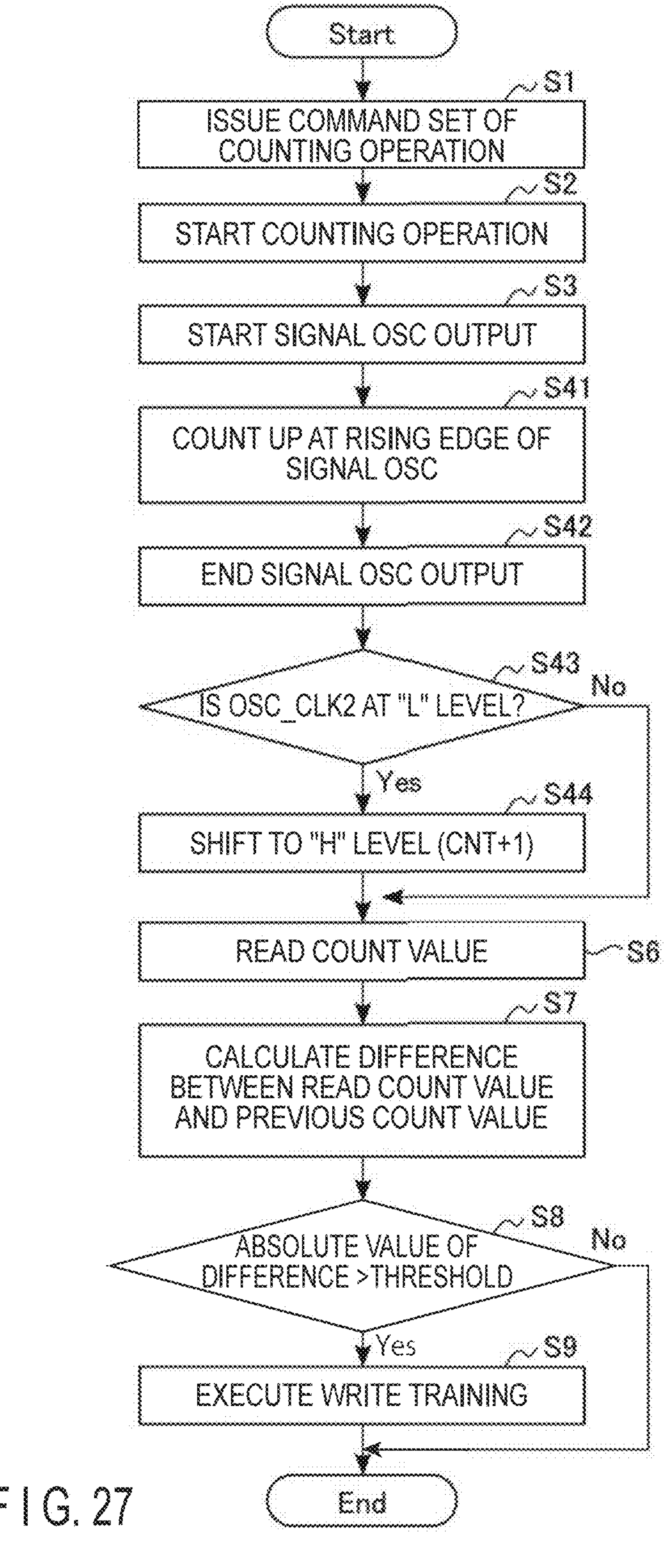
FIG. 27 is a flowchart illustrating an example of flow of the counting operation in the semiconductor device according to the fourth embodiment.

Next, with reference to FIG. 27, an example of the flow of the counting operation will be explained. FIG. 27 is a flowchart illustrating an example of the flow of the counting operation.

As illustrated in FIG. 27, first, steps S1-S3 are executed. The operations of steps S1-S3 are similar to the explanation in FIG. 13 of the first embodiment.

The counter 202 counts up the cycle number of the signal OSC at the rising edge of the signal OSC_CLK2 (that is, the signal OSC) in the period of the times t130-*t*150 explained using FIG. 26 (S41).

At the time t150 explained using FIG. 26, when the enable signal bEN at the "H" level is received, the oscillator 201 ends the output of the signal OSC (S42).

In the case where the output of the signal OSC is ended when the signal OSC_CLK2 (that is, the signal OSC) is at the "L" level (S43_Yes), as explained using FIG. 25, the OR circuit 241 shifts the signal OSC_CLK2 to the "H" level based on the enable signal bEN at the "H" level (S44). As a result, +1 is added to the count value CNT.

On the other hand, in the case where the output of the signal OSC is ended when the signal OSC_CLK2 (that is, the signal OSC) is at the "H" level (S43 No), the OR circuit 241 maintains the signal OSC_CLK2 at the "H" level. As a result, +1 is not added to the count value CNT.

Next, steps S6-S9 are executed. The operations of steps S6-S9 are similar to the explanation in FIG. 13 of the first embodiment.

4.5 Effect According to Present Embodiment

In the configuration according to the present embodiment, the effect similar to that of the first embodiment can be obtained.

Note that the modification of the first embodiment can be applied to the present embodiment.

4.6 Modification of Fourth Embodiment

Next, a modification of the fourth embodiment will be explained. In the modification, the case where the configuration of the replica circuit 102 is different from that of the first embodiment will be explained. Hereinafter, points different from the first-fourth embodiments will be mainly explained.

4.6.1 Entire Configuration of Replica Circuit

Figure 28:
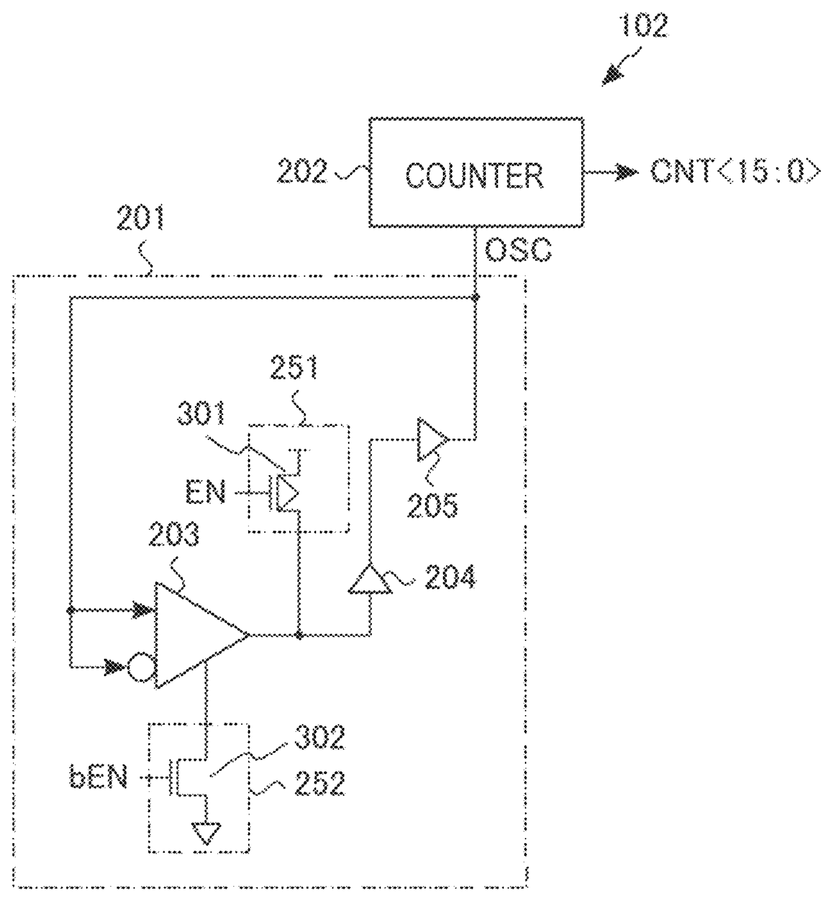
FIG. 28 a diagram illustrating an example of an entire configuration of a replica circuit included in a semiconductor device according to a modification of the fourth embodiment.

First, with reference to FIG. 28, an example of the entire configuration of the replica circuit 102 will be explained. FIG. 28 is a diagram illustrating an example of the entire configuration of the replica circuit 102.

As illustrated in FIG. 28, the replica circuit 102 includes the oscillator 201 and the counter 202.

The oscillator 201 outputs (oscillates) the signal OSC. The oscillator 201 includes the comparator 203, the drivers 204 and 205, a pull-up circuit 251, and a disable circuit 252.

The comparator 203 and the drivers 204 and 205 are similar to the explanation using FIG. 7 of the first embodiment.

The pull-up circuit 251 pulls up the output signal of the comparator 203, that is, the signal OSC, to the "H" level. The pull-up circuit 251 includes a P-channel MOS transistor 301.

To a source of the transistor 301, a power supply voltage is applied for example. A drain of the transistor 301 is connected to the output terminal of the comparator 203. That is, the drain of the transistor 301 is connected to a wiring route which transmits the signal OSC. To a gate of the transistor 301, the enable signal EN is input. When the enable signal EN at the "L" level is input, the transistor 301 is turned to an ON state. That is, while the counting operation is not operated, the signal OSC is pulled up to the "H" level.

The disable circuit 252 is a circuit which stops the operation of the comparator 203 (makes the "L" level be output). The disable circuit 252 includes an N-channel MOS transistor 302.

A drain of the transistor 302 is connected to the comparator 203. A source of the transistor 302 is grounded (connected to ground wiring). To a gate of the transistor 302, the enable signal bEN is input. When the enable signal bEN at the "H" level is input, the transistor 302 is turned to the ON state. That is, while the counting operation is not executed, output of the comparator 203 is turned to the "L" level.

4.6.2 Configuration of Counter

Figure 29:
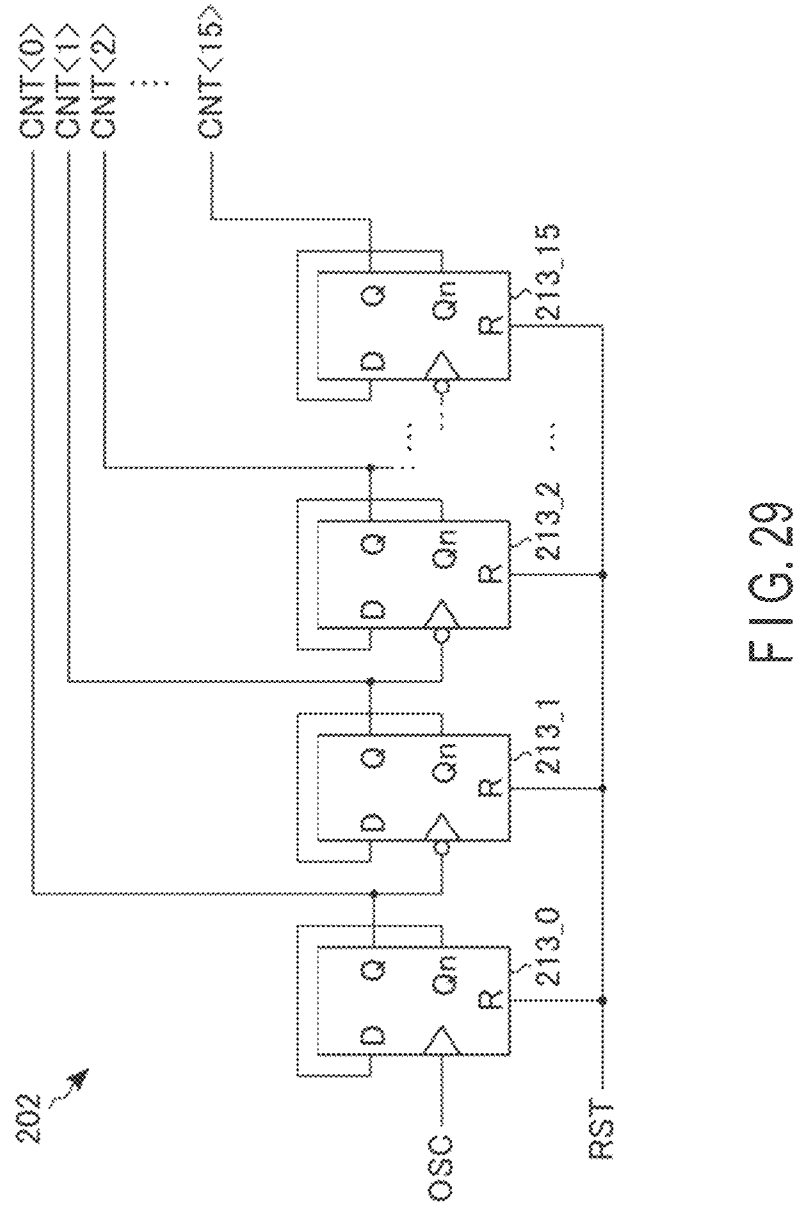
FIG. 29 is a circuit diagram illustrating an example of a configuration of a counter included in the semiconductor device according to the modification of the fourth embodiment.

Next, with reference to FIG. 29, an example of a configuration of the counter 202 will be explained. FIG. 29 is a circuit diagram illustrating an example of the configuration of the counter 202.

As illustrated in FIG. 29, the counter 202 of the present embodiment counts up the cycle number based on the rising edge of the signal OSC. Then, the counter 202 outputs the cycle number as the count values CNT<15:0>.

The counter 202 includes the plurality of flip-flops 213. For example, the counter 202 includes the flip-flops 213_0-213_15 corresponding respectively to the count values CNT<0>-CNT<15>, similarly to the first embodiment.

The flip-flop 213 includes the clock signal input terminal, the data input terminal D, the reset signal input terminal R, the output terminal Q, and the inverted output terminal Qn. The configuration of the flip-flop 213 is similar to that in FIG. 8 of the first embodiment. To the clock signal input terminal of the flip-flop 213_0, the signal OSC is input. The flip-flop 213_0 fetches the data at the rising edge of the signal OSC.

In the present embodiment, the signals output from the output terminals Q of the flip-flops 213_0-213_15 are output as the count values CNT<0>-CNT<15> of 16 bits.

4.6.3 Command Sequence of Counting Operation

Figure 30:
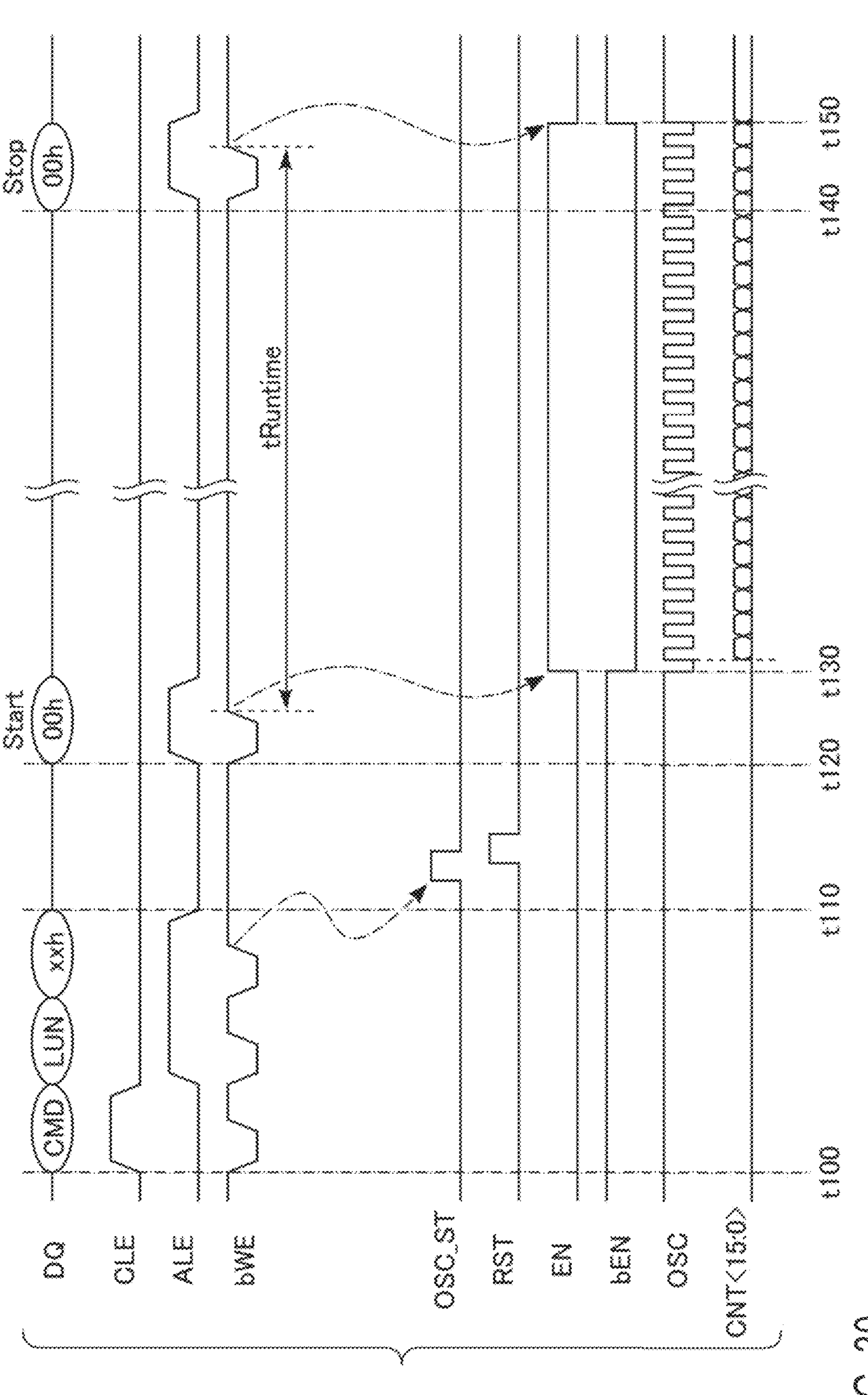
FIG. 30 is a diagram illustrating an example of a command sequence of a counting operation in the semiconductor device according to the modification of the fourth embodiment.

Next, with reference to FIG. 30, an example of a command sequence of the counting operation will be explained. FIG. 30 is a diagram illustrating an example of the command sequence of the counting operation. Note that in the example in FIG. 30, the signals DQS and bDQS, the chip enable signal bCE, the read enable signals RE and bRE, and the ready/busy signal bRB are omitted.

As illustrated in FIG. 30, in the period of the times t100-*t*110, the memory controller 20 successively transmits the command "CMD", the address "LUN", and the address "xxh" to the memory chip 11, similarly to the explanation using FIG. 10 of the first embodiment.

When the address "xxh" is received, the sequencer 107 transmits the signal OSC_ST at the "H" level to the replica circuit 102 in the period of the times t110-*t*120. After transmitting the signal OSC_ST of 1 pulse, the sequencer 107 turns the signal OSC_ST to the "L" level.

Subsequently, the sequencer 107 transmits the reset signal RST at the "H" level to the replica circuit 102. When the reset signal RST at the "H" level is received, each flip-flop 213 of the counter 202 is reset. After transmitting the reset signal RST of 1 pulse, the sequencer 107 turns the reset signal RST to the "L" level.

Next, at the time t120, the memory controller 20 transmits the address "00h" which instructs the start of the counting operation to the memory chip 11, similarly to the explanation using FIG. 10 of the first embodiment.

When the address "00h" is received, the sequencer 107 changes the enable signal EN at the "L" level from the "L" level to the "H" level at the time t130. In addition, the enable signal bEN at the "H" level is changed from the "H" level to the "L" level. When the enable signal EN at the "H" level and the enable signal bEN at the "L" level are received, the oscillator 201 starts the oscillation of the signal OSC. In the counter 202, in the period of times t130-*t*150, that is, while the enable signal bEN is at the "L" level, the signal OSC_CLK2 synchronized with the signal OSC is output from the OR circuit 241. The counter 202 counts up according to the rising edge of the signal OSC_CLK2. That is, the counter 202 counts up according to the rising edge of the signal OSC.

Next, after the counting execution time tRuntime elapses after transmitting the address "00h" which instructs the start of the counting operation, at the time t140, the memory controller 20 transmits the address "00h" again to the memory chip 11, similarly to the explanation using FIG. 10 of the first embodiment.

When the address "00h" is received, the sequencer 107 turns the enable signal EN to the "L" level and turns the enable signal bEN to the "H" level at the time t150. When the enable signal bEN at the "H" level is received, the oscillator 201 ends the oscillation of the signal OSC. At the time, when the signal OSC is at the "L" level, since the pull-up circuit 251 of the oscillator 201 is turned to the ON state, the oscillator 201 outputs the signal OSC at the "H" level. The counter 202 counts up the cycle number based on the signal OSC at the "H" level, and then ends the counting operation.

4.6.4 Flow of Counting Operation

Next, with reference to FIG. 31, an example of the flow of the counting operation will be explained. FIG. 31 is a flowchart illustrating an example of the flow of the counting operation.

As illustrated in FIG. 31, first, steps S1-S3 are executed. The operations of steps S1-S3 are similar to the explanation in FIG. 13 of the first embodiment.

The counter 202 counts up the cycle number of the signal OSC at the rising edge of the signal OSC in the period of the times t130-*t*150 explained using FIG. 30 (S51).

At the time t150 explained using FIG. 30, when the enable signal bEN at the "H" level is received, the oscillator 201 ends the output of the signal OSC (S52). More specifically, the pull-up circuit 251 is turned to the ON state based on the enable signal EN at the "L" level. That is, the signal OSC is pulled up to the "H" level. In addition, the disable circuit 252 is turned to the ON state based on the enable signal bEN at the "H" level.

In the case where the output of the signal OSC is ended when the signal OSC is at the "L" level (S53 Yes), the signal OSC is pulled up to the "H" level. As a result, +1 is added to the count value CNT.

On the other hand, in the case where the output of the signal OSC is ended when the signal OSC is at the "H" level (S53 No), the signal OSC maintains the "H" level. Thus, +1 is not added to the count value CNT.

Next, steps S6-S9 are executed. The operations of steps S6-S9 are similar to the explanation in FIG. 13 of the first embodiment.

4.6.5 Effect According to Present Modification

In the configuration according to the present modification, the effect similar to that of the first embodiment can be obtained.

Note that the modification of the first embodiment can be applied to the present modification.

5. Fifth Embodiment

Next, a fifth embodiment will be explained. The fifth embodiment illustrates two examples for which the replica circuit is applied to different semiconductor devices. Hereinafter, points different from the first-fourth embodiments will be mainly explained.

5.1 First Example

In the first example, the case where the semiconductor device is a DRAM will be explained.

With reference to FIG. 32, an example of an entire configuration of a semiconductor device 400 will be explained. FIG. 32 is a block diagram illustrating an example of the entire configuration of the semiconductor device 400. Note that while some connections between individual components are indicated by arrow lines in FIG. 32, the connections between the individual components are not limited thereto.

As illustrated in FIG. 32, the semiconductor device 400 includes, for example, a memory cell array 401, a row decoder 402, a column decoder 403, a logic control circuit 404, a command/address input circuit 405, a sense amplifier circuit 406, a replica circuit 407, a transfer gate 408, a read/write amplifier circuit (RWAMP: Read/Write Amplifier) 409, an input/output circuit 410, a clock input/output circuit 411, and a voltage generation circuit 412.

The memory cell array 401 includes a plurality of memory cells MC. Each of the memory cells MC of the semiconductor device 400 includes a cell capacitor CC and a cell transistor CT. A gate of the cell transistor CT is connected to a corresponding one of a plurality of word lines WL. One end of a current route of the cell transistor CT is connected to the bit line BL. The other end of the current route of the cell transistor CT is connected to one end of the cell capacitor CC. The other end of the cell capacitor CC is connected to a ground node. The cell capacitor CC can store charges for an amount according to the data to be stored. The cell transistor CT switches conduction/non-conduction between the memory cell MC and the bit line BL (selection/non-selection of the memory cell). The plurality of memory cells MC are arrayed in a two-dimensional array shape or a three-dimensional array shape inside the memory cell array 401. For example, the memory cell array 401 includes a plurality of banks. Each bank is a control unit including the plurality of memory cells MC. The plurality of banks can be operated independently of each other.

The row decoder 402 controls selection/non-selection of wiring (for example, the word line WL) in a row direction of the memory cell array 401, based on a decoded result of the address information and a decoded result of the command.

The column decoder 403 controls selection/non-selection of wiring (for example, the bit line BL) in a column direction of the memory cell array 401, based on the decoded result of the address information and the decoded result of the command.

The logic control circuit 404 is a circuit which executes logic control of the entire semiconductor device 400.

The logic control circuit 404 appropriately executes the write training, for example. Similarly to the first-fourth embodiments, the write training is executed for the purpose of the timing adjustment or the like between the signal DQ and the signals DQS and bDQS.

In addition, the logic control circuit 404 makes the counting operation of the clock signal be executed in the replica circuit 407 periodically for example. The clock signal is the pseudo signal of the signal DQS. The logic control circuit 404 determines presence/absence of the execution of the write training based on a change amount of the count value.

The logic control circuit 404 includes an address decoder 421, a mode register 422, and a command decoder 423.

The address decoder 421 decodes the address information received from the command/address input circuit 405. Then, the address decoder 421 sends the decoded result of the address information to the row decoder 402 and the column decoder 403 respectively.

In the mode register 422, the count value received from the replica circuit 407 is stored.

The command decoder 423 decodes the command received from the command/address input circuit 405. Then, the command decoder 423 sends the decoded result of the command to the row decoder 402 and the column decoder 403 respectively.

The command/address input circuit 405 receives a command/address signal CA supplied from outside (an unillustrated external device). The command/address signal CA includes the command and the address information. The command/address input circuit 405 sends the command and the address information to the command decoder 423 and the address decoder 421 respectively.

The sense amplifier circuit 406 senses and amplifies signals from the memory cells MC at the time of the read operation. The sense amplifier circuit 406 sends the signals from the memory cells MC to the input/output circuit 410 via the transfer gate 408 and the RWAMP 409 as read data. The sense amplifier circuit 406 receives write data from the input/output circuit 410 via the transfer gate 408 and the RWAMP 409. The sense amplifier circuit 406 outputs the signals according to the write data to the bit line BL.

The replica circuit 407 is a circuit which generates a clock signal corresponding to the signal DQS and counts the cycle number (clock number) of the clock signal. The replica circuit 407 includes a feedback type oscillator for generating the clock signal and a counter explained in one of the first-fourth embodiments. The feedback route of the oscillator has a configuration similar to the transmission route of the signal DQS. The replica circuit 407 transmits a count result by the counting operation to the mode register 422.

The transfer gate 408 controls data transfer between the sense amplifier circuit 406 and the RWAMP 409.

The RWAMP 409 amplifies a level (signal value) of the signals according to the read data and a level of the signals according to the write data.

The input/output circuit 410 functions as an interface circuit of the signal DQ transferred between the memory cell array 401 and the outside of the semiconductor device 400. The input/output circuit 410 sends the write data to the memory cell array 401 at timing synchronized with an internal clock signal CLK received from the clock input/output circuit 411. In addition, the input/output circuit 410 sends the read data to a device outside the semiconductor device 400. For example, the input/output circuit 410 receives a data masking signal DM. The input/output circuit 410 performs masking processing to the signal DQ (data) based on the data masking signal DM.

The clock input/output circuit 411 is a transmission/reception circuit of the signals DQS and bDQS. The clock input/output circuit 411 transmits and receives the signals DQS and bDQS between the semiconductor device 400 and the outside. When the data is input to the semiconductor device 400, the clock input/output circuit 411 transmits the internal clock signal CLK based on the signals DQS and bDQS received from the outside to the input/output circuit 410. The internal clock signal CLK of the present example is a signal for which the signal DQS is delayed. In the input/output circuit 410, input timing of the internal clock signal CLK and input timing of the signal DQ are synchronized. Thus, the input/output circuit 410 can fetch the signal DQ based on the internal clock signal CLK. In the write training, the timing of the signal DQ is optimized such that the delay time of the signal CLK corresponding to the signals DQS and bDQS becomes the time tDQS2DQ. Therefore, the delay time of the internal clock signal CLK to the signal DQS corresponds to the time tDQS2DQ. In addition, when the semiconductor device 400 outputs the data, the clock input/output circuit 411 outputs the generated signals DQS and bDQS to the outside.

The voltage generation circuit 412 generates a plurality of voltages to be used in each of various kinds of operation sequences in the semiconductor device 400, using power supply voltages (the voltage applied to a power supply node VDD and the voltage applied to a ground node VSS) from the outside. The voltage generation circuit 412 sends the generated voltages to the other circuits (for example, the RWAMP 409).

Note that while the first example of the fifth embodiment exemplifies the case where the semiconductor device 400 is a DRAM, it is not limited thereto. The semiconductor device 400 may be a random access memory other than the DRAM. For example, the semiconductor device 400 may be an SRAM (Static RAM).

In the semiconductor device 400 according to the first example of the fifth embodiment, for example, the replica circuit 102 explained in the first-fourth embodiments may be applied to the replica circuit 407.

5.2 Second Example

In the second example, the case where a semiconductor device 500 is a microcontroller will be explained.

5.2.1 Configuration of Semiconductor Device

Figure 33:
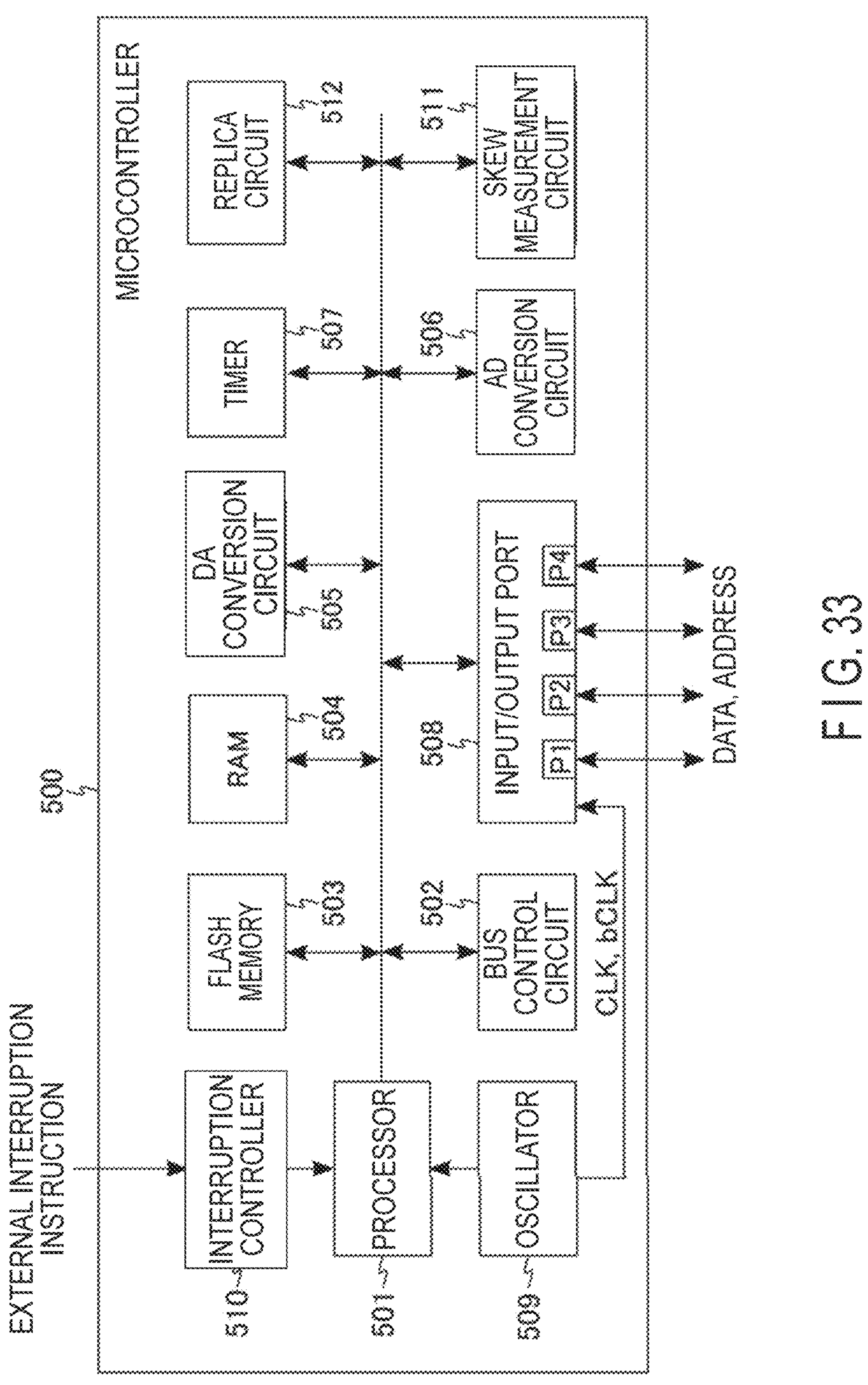
FIG. 33 is a block diagram illustrating an example of an entire configuration of a semiconductor device according to a second example of the fifth embodiment.

First, with reference to FIG. 33, an example of an entire configuration of the semiconductor device 500 will be explained. FIG. 33 is a block diagram illustrating the entire configuration of the semiconductor device 500. Note that while some connections between individual components are indicated by arrow lines in FIG. 33, the connections between the individual components are not limited thereto.

As illustrated in FIG. 33, the semiconductor device 500 includes, for example, a processor 501, a bus control circuit 502, a flash memory 503, a RAM 504, a DA conversion circuit 505, an AD conversion circuit 506, a timer 507, an input/output (I/O) port 508, an oscillator 509, an interruption controller 510, a skew measurement circuit 511, and a replica circuit 512. A bus of the semiconductor device 500 is connected to the processor 501, the bus control circuit 502, the flash memory 503, the RAM 504, the DA conversion circuit 505, the AD conversion circuit 506, the timer 507, the input/output port 508, the oscillator 509, the interruption controller 510, the skew measurement circuit 511, and the replica circuit 512. The bus of the semiconductor device 500 is a transmission route of the signals and the data in the semiconductor device 500.

The processor 501 executes various kinds of processing in the semiconductor device 500. The processor 501 performs various kinds of processing to the supplied data. The processor 501 is, for example, a CPU.

The processor 501 appropriately executes training, for example. In the present example, the training is executed for the purpose of the timing adjustment or the like between the signals received at the input/output port 508 and internal clocks CLK and bCLK.

In addition, the processor 501 makes the counting operation of the clock signal be executed in the replica circuit 512 periodically for example. The clock signal is a pseudo signal of the internal clock CLK. The processor 501 determines presence/absence of the execution of the training based on the change amount of the count value.

The bus control circuit 502 controls the bus of the semiconductor device 500. The bus control circuit 502 may be provided in the processor 501.

The flash memory 503 is a storage device capable of storing the data in a nonvolatile manner. The flash memory 503 is, for example, an NOR type flash memory. Note that the flash memory 503 may be a NAND type flash memory.

The RAM 504 is a storage device which temporarily stores the data. The RAM 504 is, for example, a random access memory such as an SRAM or a DRAM.

The DA conversion circuit 505 converts a digital signal (digital value) to an analog signal (analog value).

The AD conversion circuit 506 converts the analog signal to the digital signal.

The timer 507 manages time (operation timing) in the semiconductor device 500.

The input/output port 508 functions as an interface circuit in the semiconductor device 500. The input/output port 508 includes, for example, four ports P1, P2, P3, and P4. The number of the ports provided in the input/output port 508 may be three or fewer, or may be five or more. The input/output port 508 inputs and outputs the signals at the timing synchronized with the internal clocks CLK and bCLK received from the oscillator 509. That is, the input/output port 508 receives the signals including the data and the address or the like from the outside (an unillustrated host, for example) of the semiconductor device 500 via each of the ports P1, P2, P3, and P4. The input/output port 508 sends the signals of the data or the like to the outside of the semiconductor device 500 via each of the ports P1, P2, P3, and P4. The input/output port 508 is based on a GPIO (General Purpose Input/Output) standard, a USART (Universal Synchronous/Asynchronous Receiver Transmitter) standard, or an I2C (Inter-integrated Circuit) standard or the like, for example.

The oscillator 509 outputs the clock signal as a synchronous signal to the processor 501. The clock signal has a certain cycle (clock number). Thus, the processor 501 performs various kinds of processing at the timing synchronized with the clock signal. The cycle of the clock signal is, for example, 4 MHZ, 8 MHz, 12 MHz or 24 MHz or the like. In addition, the oscillator 509 outputs the internal clocks CLK and bCLK to the input/output port 508. The internal clock bCLK is an inverted signal of the internal clock CLK.

The interruption controller 510 receives an external interruption instruction. For example, the interruption controller 510 includes a register for managing a status of an interruption request. The interruption controller 510 sends various kinds of interruption requests to the processor 501 based on the received external interruption instruction. The processor 501 tentatively interrupts the processing under the execution according to the interruption request, and executes the processing of the interruption request. After the processing of the interruption request is completed, the processor 501 restarts the interrupted processing.

The skew measurement circuit 511 is a circuit which measures divergence (skew) of the timing between the internal clocks CLK and bCLK and input signals at the input/output port 508.

In addition, the skew measurement circuit 511 makes the replica circuit 512 execute the counting operation of the clock signal based on the control of the processor 501. The clock signal used in the replica circuit 512 is the pseudo signal of the internal clock CLK.

The replica circuit 512 is a circuit which generates the clock signal corresponding to the internal clock CLK and counts the cycle number (clock number) of the clock signal. The replica circuit 512 includes a feedback type oscillator for generating the clock signal and a counter explained in the first-fourth embodiments. The feedback route of the oscillator has a configuration similar to the transmission route of the internal clock CLK. The replica circuit 512 transmits a count result by the counting operation to the processor 501.

Note that the semiconductor device 500 may be a system-on-a-chip (SoC), a system-in-a-package (SIP), or a system-on-a-package (SoP). The semiconductor device 500 is used in an embedded system, for example. The semiconductor device 500 may be used in an on-vehicle device, a household electric appliance, a computer, an industrial machine, a railroad vehicle, an airplane, and a ship, for example.

In addition, the semiconductor device 500 may be classified based on a bus width, a memory structure, and an instruction set or the like. The bus width indicates a size of a data bus. For example, the semiconductor device 500 is classified, based on the bus width, into an 8-bit microcontroller, a 16-bit microcontroller, or a 32-bit microcontroller. The semiconductor device 500 can obtain better performance by a high bus width.

Further, in the semiconductor device 500 according to the second example of the fifth embodiment, for example, the replica circuit 102 explained in the first-fourth embodiments may be applied to the replica circuit 512.

5.2.2 Connection of Oscillator and Input/Output Port

Figure 34:
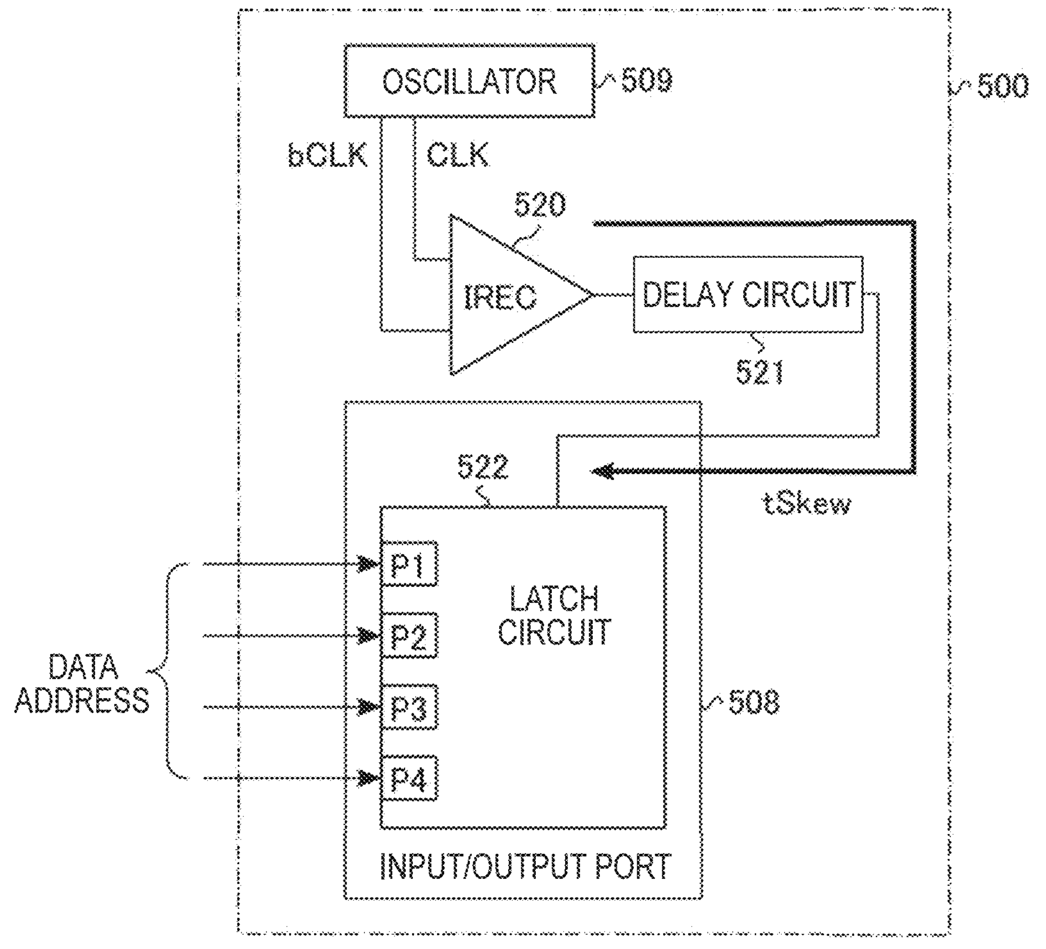
FIG. 34 is a block diagram illustrating an example of a connection of an oscillator and an input/output port included in the semiconductor device according to the second example of the fifth embodiment.

Next, with reference to FIG. 34, an example of a connection of the oscillator 509 and the input/output port 508 will be explained. FIG. 34 is a block diagram illustrating an example of the connection of the oscillator 509 and the input/output port 508.

As illustrated in FIG. 34, the semiconductor device 500 further includes an input receiver 520 and a delay circuit 521. In addition, the input/output port 508 includes a latch circuit 522.

The input receiver 520 is a reception circuit of the internal clocks CLK and bCLK. An output terminal of the input receiver 520 is connected to the delay circuit 521. For example, the input receiver 520 outputs the signals synchronized with the internal clocks CLK and bCLK.

The delay circuit 521 is a circuit which delays the signals received from the input receiver 520. The delay circuit 521 is connected to the latch circuit 522. The output signals of the input receiver 520 are delayed by the delay circuit 521 and wiring delay by a wiring route connecting the input receiver 520 and the latch circuit 522, and are input to the latch circuit 522. The delay time at the time is described as time tSkew. That is, to the latch circuit 522, the internal clocks CLK and bCLK delayed for the time tSkew are input.

The latch circuit 522 is a circuit which fetches the input signals via each of the ports P1, P2, P3, and P4 based on the delayed internal clocks CLK and bCLK. The latch circuit 522 is connected to the ports P1, P2, P3, and P4.

5.2.3 Flow of Counting Operation

Figure 35:
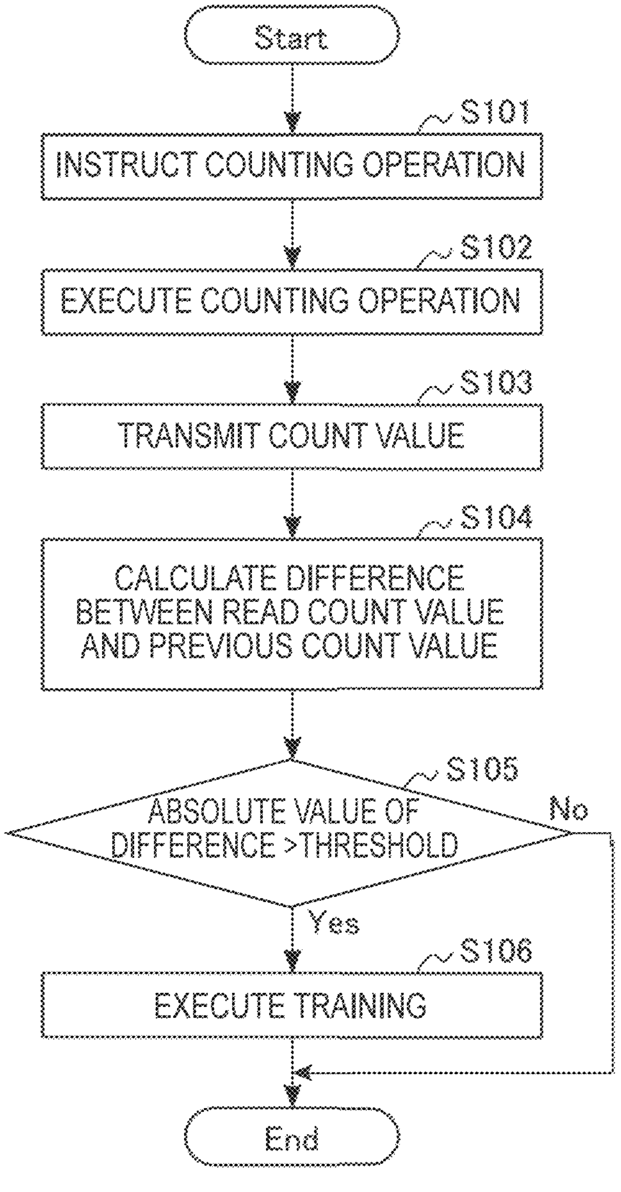
FIG. 35 is a flowchart illustrating an example of flow of a counting operation in the semiconductor device according to the second example of the fifth embodiment.

Next, with reference to FIG. 35, an example of the flow of the counting operation will be explained. FIG. 35 is a flowchart illustrating an example of the flow of the counting operation.

As illustrated in FIG. 35, first, the processor 501 instructs the execution of the counting operation in the replica circuit 512 to the skew measurement circuit 511 (S101).

When the instruction of the counting operation is received from the processor 501, the skew measurement circuit 511 makes the replica circuit 512 execute the counting operation (S102).

When the counting operation is ended, the replica circuit 512 transmits the count value CNT to the processor 501 (S103).

The processor 501 calculates a difference between the received count value CNT and the count value CNT of the previously executed counting operation (S104).

The processor 501 confirms whether the difference is equal to or larger than a threshold set beforehand (S105).

When the difference is equal to or larger than the threshold set beforehand (S105_Yes), the processor 501 executes the training (S106), and adjusts skew (time tSkew).

On the other hand, when the difference is smaller than the threshold set beforehand (S105_No), the processor 501 ends the counting operation.

5.3 Effect According to Present Embodiment

In the configuration according to the first example and the second example of the present embodiment, the effect similar to that of the first embodiment can be obtained.

6. Modification or the Like

A semiconductor device (11) according to the above-described embodiments includes an oscillator (201) configured to output a first signal (OSC) and a counter (202) configured to count the cycle number of the first signal. Before the oscillator outputs an N-th (N is an integer equal to or larger than 2) cycle of the first signal, the counter changes a count value of the cycle number of the first signal to N.

By applying the above-described embodiments, the semiconductor device capable of improving throughput can be provided.

Note that the embodiment is not limited to the forms described above and various modifications are possible.

The "connection" in the above-described embodiments also includes a state of being indirectly connected with something else such as a transistor or a resistor being interposed inbetween.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device comprising:

an oscillator configured to output a first signal; and circuitry configured to count a cycle number of the first signal by changing a count value of the cycle number of the first signal to N before the oscillator outputs an N-th (N is an integer equal to or larger than 2) cycle of the first signal, wherein the circuitry is a counter and includes a plurality of flip-flops connected in multiple stages.

2. The semiconductor device of claim 1, wherein the circuitry is configured to change the count value of the cycle number of the first signal to N after 0.5 cycles elapse after the oscillator starts output of an (N−1)-th cycle of the first signal.

3. The semiconductor device of claim 1, wherein the first signal alternately repeats a first edge of shifting from a first logic level to a second logic level different from the first logic level and a second edge of shifting from the second logic level to the first logic level, and the circuitry is configured to count up the cycle number of the first signal using the second edge when the oscillator starts output of the first signal and the first edge is initially generated.

4. The semiconductor device of claim 3, wherein the circuitry includes an adder and is configured to output a value for which 1 is added to the cycle number of the first signal as the count value.

5. The semiconductor device of claim 3, wherein the circuitry is configured to add 1 to the cycle number of the first signal, based on a second signal received before the oscillator starts the output of the first signal that instructs initiation of a counting operation.

6. The semiconductor device of claim 1, wherein the first signal alternately repeats a first edge of shifting from a first logic level to a second logic level different from the first logic level and a second edge of shifting from the second logic level to the first logic level, and the circuitry is configured to count up the cycle number of the first signal using the first edge when the oscillator starts output of the first signal and the first edge is initially generated.

7. The semiconductor device of claim 6, wherein the counter includes a first flip-flop operated based on the first edge of the first signal;

a second flip-flop operated based on the second edge of the first signal;

a first circuit configured to execute an exclusive OR operation of a first output signal of the first flip-flop and a second output signal of the second flip-flop; and a logic circuit configured to determine whether to add 1 to the cycle number of the first signal based on an output of the first circuit.

8. The semiconductor device of claim 7, wherein the logic circuit is configured to:

add 1 to the cycle number of the first signal when a logic level of the first output signal and a logic level of the second output signal are the same; and not add 1 to the cycle number of the first signal when a logic level of the first output signal and a logic level of the second output signal are different.

9. The semiconductor device of claim 6, wherein the circuitry is configured to:

add 1 to the cycle number of the first signal in a case where the oscillator ends the output of the first signal when the first signal is at the first logic level, and not add 1 to the cycle number of the first signal in a case where the oscillator ends the output of the first signal when the first signal is at the second logic level.

10. The semiconductor device of claim 9, wherein the oscillator outputs the first signal in a period during which a third signal is at the first logic level, and the circuitry includes a second circuit configured to output a fourth signal based on a result of an OR operation of the first signal and the third signal; and a third flip-flop operated based on the first edge of the fourth signal.

11. The semiconductor device of claim 9, wherein the oscillator includes:

a third circuit including an output terminal which outputs the first signal and an input terminal to which the first signal output from the output terminal is input; and a pull-up circuit connected to the output terminal of the third circuit.

12. The semiconductor device of claim 1, further comprising:

a latch circuit configured to fetch a seventh signal received from outside the semiconductor device, based on a sixth signal for which a fifth signal received from the outside the semiconductor device is delayed, wherein half cycle of the first signal is equal to delay time of the sixth signal to the fifth signal.

13. The semiconductor device of claim 12, wherein the fifth signal and the seventh signal are asynchronous.

14. The semiconductor device of claim 12, wherein a maximum value of a granularity error of the count value generated during a first period in which the circuitry executes a counting operation is equal to a value for which the delay time is divided by a length of the first period.

15. The semiconductor device of claim 14, wherein the first period is based on a command set received from an external controller, and the delay time is based on a time difference between the fifth signal and the seventh signal received from the external controller.

16. The semiconductor device of claim 12, further comprising:

a first pad to which the fifth signal is received from outside the semiconductor device; and a second pad to which the seventh signal is received from outside the semiconductor device, wherein a number of circuits provided in a first route connecting the first pad and the latch circuit is larger than a number of circuits provided in a second route connecting the second pad and the latch circuit.

17. The semiconductor device of claim 12, further comprising:

a control circuit configured to execute an operation of adjusting timing of the fifth signal and the seventh signal in a case where an absolute value of a difference between the count value output by the circuitry and a previously measured count value is larger than a threshold set beforehand.

18. A counting method using an oscillator configured to output a first signal and circuitry configured to count a cycle number of the first signal, the method comprising:

starting output of the first signal; and changing a count value of the cycle number of the first signal to N before an N-th (N is an integer equal to or larger than 2) cycle of the first signal is output, wherein the circuitry is a counter and includes a plurality of flip-flops connected in multiple stages.

19. The counting method of claim 18, wherein changing the count value to N includes changing the count value of the cycle number of the first signal to N after 0.5 cycles elapse after output of an (N−1)-th cycle of the first signal is started.

20. A semiconductor device comprising:

an oscillator configured to output a first signal; and means for counting a cycle number of the first signal by changing a count value of the cycle number of the first signal to N before the oscillator outputs an N-th (N is an integer equal to or larger than 2) cycle of the first signal.

* * * * *